(12) United States Patent
Takaura et al.

(10) Patent No.: US 6,900,492 B2
(45) Date of Patent: May 31, 2005

(54) INTEGRATED CIRCUIT DEVICE WITH P-TYPE GATE MEMORY CELL HAVING PEDESTAL CONTACT PLUG AND PERIPHERAL CIRCUIT

(75) Inventors: Norikatsu Takaura, Kokubunji (JP); Hideyuki Matsuoka, Nishi-Tokyo (JP); Shinichiro Kimura, Kunitachi (JP); Ryo Nagai, Tokyo (JP); Satoru Yamada, Tokyo (JP)

(73) Assignees: Hitachi, Ltd., Tokyo (JP); part interest; NEC Corporation, Tokyo (JP); part interest; NEC Electronics Corporation, Kanagawa (JP); part interest (*) Notice: Subject to any disclaimer, the term of this patent is extended or adjusted under 35 U.S.C. 154(b) by 0 days.

(21) Appl. No.: 10/164,008

(22) Filed: Jun. 7, 2002

(65) Prior Publication Data

US 2003/0011002 A1 Jan. 16, 2003

(30) Foreign Application Priority Data

Jul. 11, 2001 (JP) ........................................ 2001-211259

(51) Int. Cl.[7] .................... H01L 27/108; H01L 29/76; H01L 29/94; H01L 31/119
(52) U.S. Cl. ..................... 257/296; 257/369; 257/391
(58) Field of Search ..................... 257/296, 369, 257/391

(56) References Cited

U.S. PATENT DOCUMENTS 6,153,490 A * 11/2000 Xing et al. ................. 438/396
6,362,042 B1 * 3/2002 Hosotani et al. ............ 438/253
6,586,794 B2 * 7/2003 Nakamura et al. .......... 257/296
6,621,125 B1 * 9/2003 Wang ......................... 257/355
6,734,479 B1 * 5/2004 Ogishima et al. ........... 257/296
6,753,219 B2 * 6/2004 Sekiguchi et al. .......... 438/253

FOREIGN PATENT DOCUMENTS

| JP | 02-214155 A | * 9/1990 |
| JP | 04-058556 A | * 2/1992 |
| JP | 09-036318 A | * 2/1997 |
| JP | 2000-174225 | 6/2000 |

OTHER PUBLICATIONS

Kistler, N. et al., "Symmetric CMOS in Fully–Depleted Silion–On–Insulator using P+–Polycrystalline Si–Ge Gate Electrodes", Dec. 1993, IEDM 93, pp. 727–30.*

* cited by examiner

Primary Examiner—Howard Weiss
(74) Attorney, Agent, or Firm—Miles & Stockbridge P.C.

(57) ABSTRACT

A refresh characteristic of a DRAM memory cell is improved and the performance of a MISFET formed in the periphery thereof and constituting a logic circuit is improved.

Each gate electrode in a memory cell area is formed of p type polycrystalline silicon, and a cap insulating film on each gate electrode and a sidewall film on the sidewall thereof are formed of a silicon oxide film. A polycrystalline silicon film formed on the gate electrodes and between the gate electrodes is polished by a CMP method, and thereby contact electrodes are formed. Also, sidewall films each composed of a laminated film of the silicon oxide film and the polycrystalline silicon film are formed on the sidewall of the gate electrodes in the logic circuit area, and these films are used as a mask to form semiconductor areas. As a result, it is possible to reduce the boron penetration and form contact electrodes in a self-alignment manner. In addition, the performance of the MISFET constituting the logic circuit can be improved.

9 Claims, 52 Drawing Sheets

4a  1a

Fig. 5
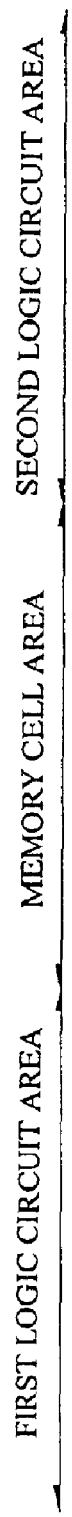
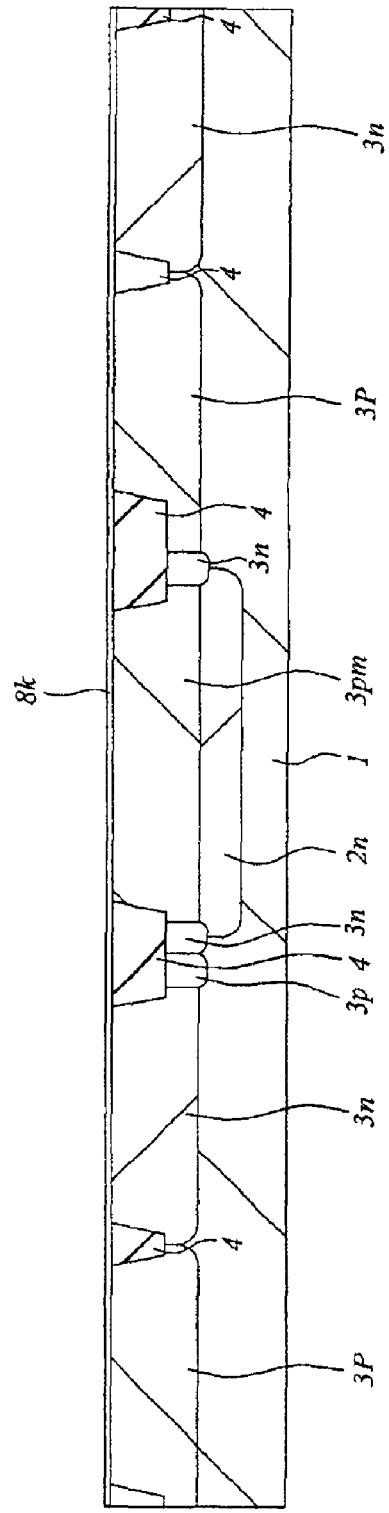

4a  1a   5g
     5a(12a) 5b(12b) 5a(12a)

INTEGRATED CIRCUIT DEVICE WITH P-TYPE GATE MEMORY CELL HAVING PEDESTAL CONTACT PLUG AND PERIPHERAL CIRCUIT

BACKGROUND OF THE INVENTION

The present invention relates to a semiconductor integrated circuit device and a technique for manufacturing the semiconductor integrated circuit device. More particularly, the present invention relates to a technique effectively applied to a semiconductor integrated circuit device having: a highly integrated memory circuit using a spacer made of a silicon oxide film and a silicon film; and a logic embedded memory in which a memory circuit and a logic circuit are provided on the same semiconductor substrate, and applied to a production method thereof.

In the conventional logic embedded memory in which the DRAM (Dynamic Random Access Memory) and the logic circuit are provided on the same semiconductor substrate, a type polycrystalline silicon film whose a conductivity type is an n type has been used for the gate electrode of an n channel MISFET (Metal Insulator Semiconductor Field Effect Transistor).

However, in order to improve the operation speed of the entire DRAM and continue to store data in a memory cell, the research and circuit design about various structures and circuit designs have been performed because of an improvement of a so-called refresh characteristic, that is, a characteristic of refreshing regularly the memory contents thereof.

Also, there has been the problem of enhancing the threshold voltage of a memory cell selecting MISFET in the memory cell. As the specific solution thereof, for example, Japanese Patent Laid-open No. 2000-174225 has disclosed that a polycrystalline silicon whose a conductivity type is a P type is used for gate electrodes of an n channel memory cell selecting MISFET and a p channel MISFET constituting the peripheral circuit of the DRAM.

SUMMARY OF THE INVENTION

In the conventional technique described above in which the polycrystalline silicon whose the conductivity type is a p type is used for the gate electrode, no consideration has been made to an increase in boron penetration through a gate oxide, due to the silicon nitride film used in a gate electrode structure. Therefore, there have been problems of the variance of a threshold voltage and the degradation of a blocking voltage due to the boron penetrated through the gate oxide.

An object of the present invention is to provide a technique capable of improving the refresh characteristic in the semiconductor integrated circuit device having the DRAM and the logic embedded memory.

Another object of the present invention is to provide a technique capable of improving the driving capability of the MISFET in the logic circuit, in the semiconductor integrated circuit device having the DRAM and the logic embedded memory.

The above and other objects and novel features of the present invention will be apparent from the descriptions of this specification and the accompanying drawings.

The p type polycrystalline silicon gate electrode having a large work function is used as the gate electrode of the memory cell selecting n channel MISFET. As a result, the introduction of the impurity for the adjustment of the threshold voltage becomes unnecessary, and the substrate concentration can be reduced. Also, since the electric field near the junction of the semiconductor area to which a capacitor is connected is decreased, the leakage current between the storage node and the semiconductor substrate is decreased. Therefore, it is possible to improve the refresh characteristic thereof.

Also, a film containing no hydrogen or little hydrogen, such as a silicon oxide film, is used as the insulating film on the upper portion of the gate electrode and as the first film on the sidewall of the gate electrode. As a result, the accumulation amounts of not only hydrogen but also ammonia that promote the boron penetration are reduced, and further the emission amounts of these can be reduced. Therefore, the variance of the threshold voltage and the degradation of the gate blocking voltage can be reduced.

In addition, a conductive film is deposited on the gate electrode and between the gate electrode and a gate electrode adjacent thereto, by the use of the first film on the sidewall of the gate electrode, and the conductive film on the gate electrodes is polished (CMP) until the first film is exposed, and thereby a contact electrode is formed. As a result, it is possible to form the contact electrode in a self-alignment manner.

Also, the first and second films are left on the sidewalls of the gate electrodes of the n channel MISFET and the p channel MISFET that are formed in the peripheral circuit forming area, and are used as a mask to implant impurities into both sides of each of the gate electrodes of the n channel MISFET and the p channel MISFET and thereby form the semiconductor area. As a result, the sidewall spacer on the sidewall of the gate electrode in the peripheral circuit forming area can be formed more thickly than that in the memory cell area. Therefore, it is possible to achieve the downsizing of the n channel MISFET and the p channel MISFET that constitute the logic circuit and the improvement of the reliability thereof.

Also, if a p type impurity such as boron or the like is implanted by the ion implantation, the p type polycrystalline silicon gate electrode having a desirable impurity concentration can be formed. Further, if the p type polycrystalline silicon gate electrode is used in the p channel MISFET formed in the peripheral circuit forming area, the channel thereof is a surface type. Therefore, the downsizing of the p channel MISFET is facilitated and the performance of the p channel MISFET can be improved.

Also, since the lower electrode and the upper electrode of the capacitor constituting the memory cell are made of metal (so-called MIM structure), it is possible to decrease the annealing temperature required at the time of forming the capacitor to 600° C. or lower, and thus prevent the boron penetration.

In addition, since the open bit line arrangement is employed in the memory cell, it is possible to make the memory cell highly integrated.

BRIEF DESCRIPTIONS OF THE DRAWINGS

FIG. 5 is a cross-sectional view showing the principal part of the semiconductor integrated circuit device of FIG. 1 during the production process.

DESCRIPTIONS OF THE PREFERRED EMBODIMENTS (First Embodiment)

Hereinafter, embodiments of the present invention will be described in detail based on the drawings.

Figure 1:
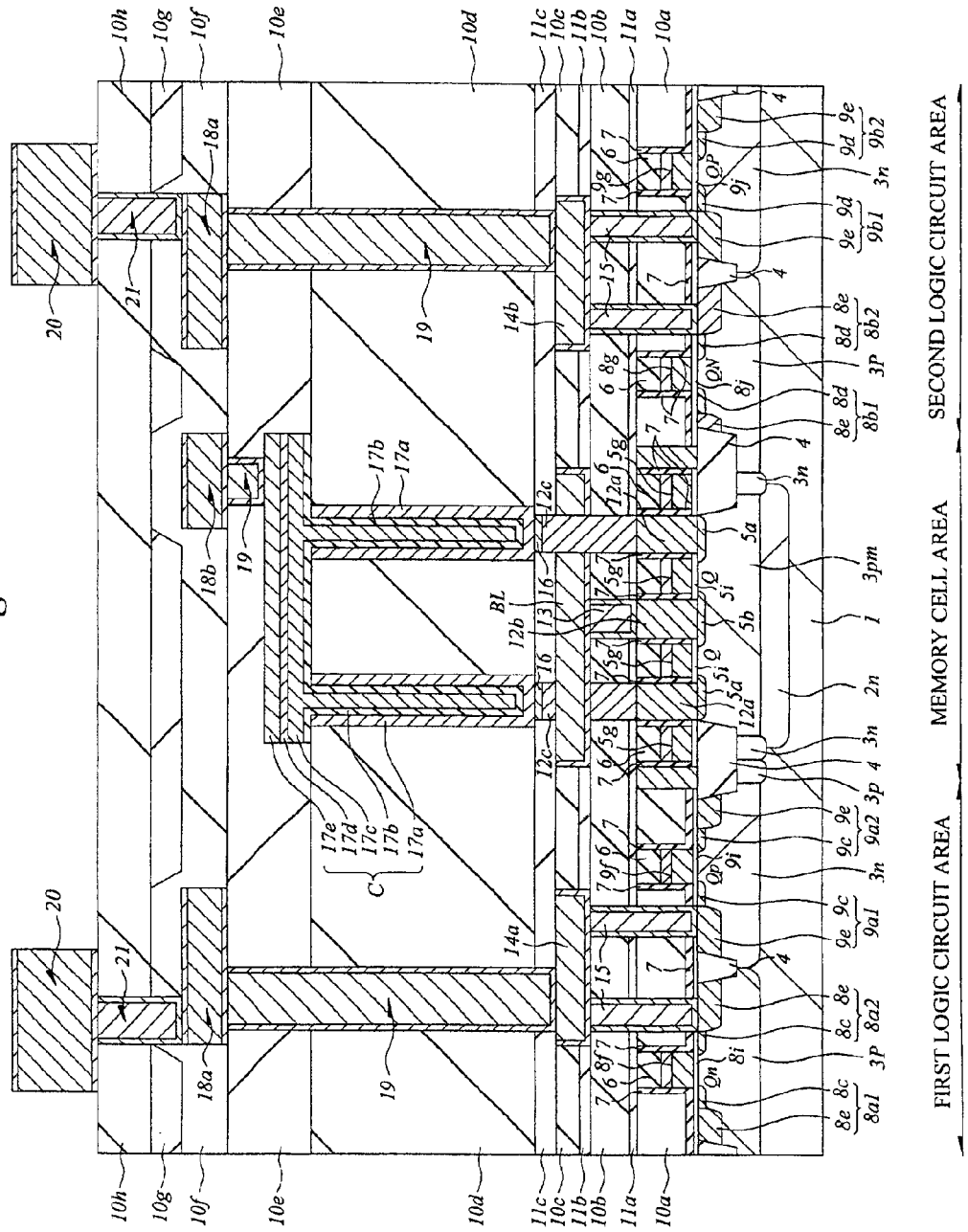
FIG. 1 is a cross-sectional view showing the principal part of a semiconductor integrated circuit device according to a first embodiment of the present invention.

FIG. 1 is a cross-sectional view showing the principal part of a semiconductor integrated circuit device according to a first embodiment of the present invention. FIGS. 2 to 32 are cross-sectional views and plan views showing the principal part of the semiconductor integrated circuit device of FIG. 1 during the production process thereof.

First, the sectional structure of a semiconductor integrated circuit device according to the first embodiment will be described with reference to FIG. 1.

A semiconductor substrate 1 is made of, for example, a single crystal silicon whose a conductivity type is a p type. This semiconductor substrate 1 has a memory cell area and logic circuit areas (peripheral circuit area), and the central portion of FIG. 1 illustrates the memory cell area and the left side of the memory cell area illustrates a first logic circuit area and the right side of the memory cell area illustrates a second logic circuit area.

A deep n well $2n$ is formed in the semiconductor substrate 1 in the memory cell area. For example, an n type impurity such as phosphorus is introduced into this deep n well $2n$.

A p well $3pm$ is formed in an upper layer of this deep n well $2n$. The periphery of this p well $3pm$ is surrounded by the deep n well $2n$ and n wells $3n$, and is electrically isolated from the first and second logic circuit areas and the like. For example, a p type impurity such as boron is introduced into this p well $3pm$. The concentration of the p type impurity is, for example, within a range of about $10^{17}$ to $10^{18}/cm^3$.

Also, a p well $3p$ is formed in each of the first and second logic circuit areas of the semiconductor substrate 1. For example, a p type impurity such as boron is introduced into each p well $3p$. The concentration of the p type impurity is, for example, within a range of about $10^{17}$ to $10^{18}/cm^3$. The p well $3p$ is almost as deep as the p well $3pm$ in the memory cell area.

Further, an n well $3n$ is formed in each of the first and second logic circuit areas of the semiconductor substrate 1. For example, an n type impurity such as phosphorus or arsenic (As) is introduced into the n well $3n$. The concentration of the n type impurity is, for example, within a range of about $10^{17}$ to $10^{18}/cm^3$. The n well $3n$ is almost as deep as the p well $3pm$ in the memory cell area.

Isolation areas are provided between the memory cell area and the first and second logic circuit areas and between the memory cell area and the second logic circuit area, respectively. An isolation trench having a depth of 0.3 to 0.4 $\mu$m in a thickness direction of the semiconductor substrate 1 is formed in each of the isolation areas, and an insulating film 4 for isolation is buried inside each isolation trench. Also, the isolation areas are provided between the p well $3p$ and the n well $3n$ in the first and second logic circuit areas, respectively.

This insulating film 4 for isolation is made of, for example, silicon oxide ($SiO_2$) or the like. Note that the upper surface of the insulating film 4 for isolation is flattened so as to be almost as high as the main surface of the semiconductor substrate 1.

A memory cell of the DRAM is formed in the memory cell area of the semiconductor substrate 1 (on the p well $3pm$). This memory cell is composed of a memory cell selecting MISFET Q and a capacitor (capacitor for information storage) C.

The memory cell selecting MISFET Q has a pair of semiconductor areas $5a$ and $5b$ formed apart from each other on the p well $3pm$, a gate insulating film $5i$ formed on the semiconductor substrate 1, and a gate electrode $5g$ formed thereon. Note that the threshold voltage of the memory cell selecting MISFET Q is, for example, about 1V.

The semiconductor areas $5a$ and $5b$ are areas functioning as the source and drain of the memory cell selecting MISFET Q, and an n type impurity such as phosphorus or As is introduced into these areas. A channel area of the memory cell selecting MISFET Q is formed between the semiconductor areas $5a$ and $5b$ (immediately below the gate electrode $5g$).

In addition, the gate electrode $5g$ has a so-celled poly-metal gate structure formed by sequentially depositing, for example, a low-resistance polycrystalline silicon film, a tungsten nitride (WN) film (not shown), and a tungsten film from below. This poly-metal gate structure makes it possible to reduce a sheet resistance to about 2 $\Omega/\square$, and thereby it is possible to achieve a low resistance of the gate electrode. Thus, the operation speed of the DRAM can be improved. The poly-metal gate structure like this can be employed as materials of not only a gate electrode but also a wiring. This gate electrode $5g$ has a function as a word line of the memory cell.

A p type impurity such as boron is introduced into this low-resistance polycrystalline silicon film constituting this gate electrode $5g$. Thus, advantages as follows can be obtained.

That is, even if the impurity concentration of the semiconductor substrate 1 (namely, an impurity concentration of the p well 3mp; referred to as substrate concentration hereinafter) is not increased, the threshold voltage of the memory cell selecting MISFET Q can be increased.

The reason thereof is as follows. That is, since the work function of the p type polycrystalline silicon is about 5.15V which is larger than 4.15V of the n type polycrystalline silicon by about 1V, the n channel memory cell selecting MISFET Q using a gate electrode made of p type polycrystalline silicon can have a threshold voltage higher by about 1V than the n channel memory cell selecting MISFET using a gate electrode made of n type polycrystalline silicon even in the case where the substrate concentrations of the MISFETs are equal to each other.

Therefore, it is unnecessary to introduce impurities (for adjustment of the threshold voltage) for increasing the threshold value, into the channel area immediately below the gate electrode 5g, and thus it is possible to reduce the substrate concentration.

The reduction in the substrate concentration as described above makes it possible to decrease an electric field near a junction of the semiconductor area 5a to which the capacitor C is connected. Therefore, it is possible to reduce the leakage current between a storage node (capacitor C) and the semiconductor substrate 1. The reduction of the leakage current makes it possible to improve the refresh characteristic of the memory cell.

A gate insulating film 5i is made of, for example, silicon oxide and the thickness thereof is set, for example, to be about 6 nm.

A cap insulating film 6 made of, for example, silicon oxide is formed on the upper surface of the gate electrode 5g of the memory cell selecting MISFET Q. Also, a sidewall film 7 made of, for example, silicon oxide is formed on the side surface of the gate electrode 5g. By doing so, it is possible to achieve the prevention of the boron penetration through the gate electrode of the p type polycrystalline silicon.

More specifically, in the case where a film made of silicon nitride is utilized on an upper surface or a side surface of the gate electrode 5g (word line) or on a surface of the substrate, since hydrogen and ammonia used as materials thereof are accumulated in the film, these hydrogen and ammonia promote the penetration of boron through the substrate.

However, since the silicon nitride film is not used in this embodiment, the penetration of boron from the gate electrode of p type polycrystalline silicon can be reduced.

Meanwhile, an n channel MISFET Qn is formed in the first logic circuit area (on the p well 3p) shown in the left side of FIG. 1. The n channel MISFET Qn has semiconductor areas 8a1 and 8a2 formed apart from each other on the upper portion of the p well 3p, a gate insulating film 8i formed on the semiconductor substrate 1, and a gate electrode 8f formed thereon. Note that the threshold voltage of the MISFET Qn is, for example, about 0.1V The semiconductor areas 8a1 and 8a2 function as the source and drain of the n channel MISFET Qn, and the channel area of the n channel MISFET Qn is formed between the semiconductor areas 8a1 and 8a2 (immediately below the gate electrode 8g).

These semiconductor areas 8a1 and 8a2 have an LDD (Lightly Doped Drain) structure. More specifically, each of the semiconductor areas 8a1 and 8a2 has a low concentration area 8c and a high concentration area 8e. This low concentration area 8c extends in the direction opposite to the channel area from an end portion of the gate electrode 5g, and the high concentration area 8e extends in the same direction as that of the low concentration area 8c from a position a little apart from the end portion of the gate electrode 5g.

N type impurities such as As and phosphorus are introduced into the low concentration area 8c. Although n type impurities such as As and phosphorus are introduced also in the high concentration area 8e, the impurity concentration thereof is set higher than that of the low concentration area 8c.

In addition, the gate electrode 8f has a so-celled poly-metal gate structure formed by sequentially depositing, for example, a low-resistance polycrystalline silicon film, a tungsten nitride (WN) film (not shown), and a tungsten film from below. This poly-metal gate structure makes it possible to reduce the sheet resistance to about 2 $\Omega/\square$, and thereby it becomes possible to achieve a low resistance of the gate electrode. Thus, the operation speed of a logic circuit constituting the peripheral circuit of the DRAM can be improved.

A cap insulating film 6 made of, for example, silicon oxide ($SiO_2$) is formed on the upper surface of the gate electrode 8f. Also, a sidewall film 7 made of, for example, silicon oxide is formed on the side surface of the gate electrode 8f.

The gate insulating film 8i is made of, for example, silicon oxide and the thickness thereof is designed to be about 3.5 nm.

A p channel MISFET Qp is formed on the n well 3n in the first logic circuit area shown in the left side of FIG. 1. The p channel MISFET Qp has a pair of semiconductor areas 9a1 and 9a2 formed apart from each other on the n well 3n, a gate insulating film 9i formed on the semiconductor substrate 1, and a gate electrode 9f formed thereon. Note that the threshold voltage of the MISFET Qp is, for example, about −0.1V.

The semiconductor areas 9a1 and 9a2 function as the source and drain of the p channel MISFET Qp, and the channel area for the p channel MISFET Qp is formed between the semiconductor areas 9a1 and 9a2 (immediately below the gate electrode 9f).

The semiconductor areas 9a1 and 9a2 have the LDD structure. More specifically, each of the semiconductor areas 9a1 and 9a2 has a low concentration area 9c and a high concentration area 9e. This low concentration area 9c extends in a direction opposite to the channel area from an end portion of the gate electrode 5f, and the high concentration area 9e extends in the same direction as the low concentration area 9c, from the position spaced a predetermined distance away from the end portion of the gate electrode 5f.

A p type impurity such as $BF_2$ is introduced into the low concentration area 9c. Although a p type impurity such as boron or $BF_2$ is introduced also into the high concentration area 9e, the impurity concentration thereof is set higher than that of the low concentration area 9c.

The gate electrode 9f has a so-celled poly-metal gate structure formed by sequentially depositing, for example, a low-resistance polycrystalline silicon film, a tungsten nitride (WN) film (not shown), and a tungsten film from below. This poly-metal gate structure makes it possible to reduce the sheet resistance to about 2 $\Omega/\square$, and thereby it is possible to achieve a low resistance of the gate electrode. Thus, the operation speed of a logic circuit constituting the peripheral circuit of the DRAM can be improved.

Also, the p type impurity such as boron or $BF_2$ is introduced into the low-resistance polycrystalline silicon film of the gate electrode 9f. By setting the gate electrode of the p channel MISFET Qp at a p type, it is possible to reduce the threshold voltage of the p channel MISFET Qp, and consequently adapt the low voltage operation. In this manner, the improvement in the characteristic and the operation reliability thereof is achieved.

The gate insulating film 9i is made of, for example, silicon oxide and the thickness thereof is designed to be about 3.5 nm.

The cap insulating film 6 made of, for example, silicon oxide is formed on the upper surface of the gate electrode 9f. Also, the sidewall film 7 made of, for example, silicon oxide is formed on the side surface of the gate electrode 5g. These films can prevent the boron penetration through the gate electrode made of the p type polycrystalline silicon. More specifically, as described above, since the silicon nitride film containing hydrogen and ammonia that promote the boron penetration through the substrate is not used, the boron penetration from the gate electrode made of the p type polycrystalline silicon can be reduced.

Note that the n channel MISFET Qn and the p channel MISFET Qp constitute the logic circuits of the DRAM, such as a sense amplifier circuit, a column decoder circuit, a column driver circuit, a row decoder circuit, an I/O selector circuit, and the like.

Meanwhile, an n channel MISFET QN is formed in the second logic circuit area (on the p well 3p) shown in the right side of FIG. 1. The n channel MISFET QN has a pair of semiconductor areas 8b1 and 8b2 formed apart from each other on the p well 3p, a gate insulating film 8j formed on the semiconductor substrate 1, and a gate electrode 8g formed thereon. Note that the threshold voltage of the MISFET QN is, for example, about 0.3V.

The semiconductor areas 8b1 and 8b2 function as the source and drain of the n channel MISFET QN, and the channel area of the n channel MISFET QN is formed between the semiconductor areas 8b1 and 8b2 (immediately below the gate electrode 8g).

The semiconductor areas 8b1 and 8b2 have the LDD structure. More specifically, each of the semiconductor areas 8b1 and 8b2 has a low concentration area 8d and a high concentration area 8e. This low concentration area 8d extends in a direction opposite to the channel area from an end portion of the gate electrode 8g, and the high concentration area 8e extends in the same direction as the low concentration area 8d, from a position spaced a predetermined distance away from the end portion of the gate electrode 8g.

The n type impurity such as phosphorus is introduced into the low concentration area 8d. In this manner, it is possible to decrease the electric field in the vicinity of the source-drain junction of the n channel MISFET QN capable of adapting the high voltage operation, and thus the improvement in the characteristic and the operation reliability thereof is achieved.

Although the n type impurities such as As and phosphorus are introduced in the high concentration area 8e, the impurity concentration thereof is set higher than that of the low concentration area 8d.

In addition, the gate electrode 8g has a so-celled poly-metal gate structure formed by sequentially depositing, for example, a low-resistance polycrystalline silicon film, a tungsten nitride (WN) film (not shown), and a tungsten film from below. This poly-metal gate structure makes it possible to reduce the sheet resistance to about 2 Ω/□, and thereby achieve a low resistance of the gate electrode. Thus, the operation speed of the logic circuit constituting the peripheral circuit of the DRAM can be improved. Also, the n type impurity such as phosphorus or As is introduced into the low-resistance polycrystalline silicon film of the gate electrode 8g.

The cap insulating film 6 made of, for example, silicon oxide is formed on the upper surface of the gate electrode 8g. Also, the sidewall film 7 made of, for example, silicon oxide is formed on the sidewall of the gate electrode 8g.

The gate insulating film 8j is made of, for example, silicon oxide, and, similarly to the gate insulating film 5i of the memory cell selecting MISFET Q, the thickness thereof is designed to be, for example, about 6 nm.

Also, a p channel MISFET QP is formed in the second logic circuit area shown in the right side of FIG. 1. The p channel MISFET QP has a pair of semiconductor areas 9b1 and 9b2 formed apart from each other on the n well 3n, a gate insulating film 9j formed on the semiconductor substrate 1, and a gate electrode 9g formed thereon. Note that the threshold voltage of the MISFET QP is, for example, about –0.3V.

The semiconductor areas 9b1 and 9b2 function as the source and drain of the p channel MISFET QP, and the channel area of the n channel MISFET QP is formed between the semiconductor areas 9b1 and 9b2 (immediately below the gate electrode 9g).

The semiconductor areas 9b1 and 9b2 have the LDD structure. More specifically, each of the semiconductor areas 9b1 and 9b2 has a low concentration area 9d and a high concentration area 9e. The low concentration area 9d is formed near the channel area and the high concentration area 9e is arranged outside the low concentration area 9d.

The p type impurity such as $BF_2$ is introduced into the low concentration area 9d. Although the p type impurities such as boron and $BF_2$ are introduced also into the high concentration area 9e, the impurity concentration thereof is set higher than that of the low concentration area 9d.

The gate electrode 9g has a so-celled poly-metal gate structure formed by sequentially depositing, for example, a low-resistance polycrystalline silicon film, a tungsten nitride (WN) film (not shown), and a tungsten film from below. This poly-metal gate structure makes it possible to reduce the sheet resistance to about 2 Ω/□, and thereby it is possible to achieve a low resistance of the gate electrode. Thus, the operation speed of a logic circuit constituting the peripheral circuit of the DRAM can be improved.

Also, the p type impurity such as boron is introduced into the low-resistance polycrystalline silicon film of the gate electrode 9g. By setting, at a p type, the gate electrode of the p channel MISFET QP, it is possible to reduce the threshold voltage of the p channel MISFET QP. As a result, it is possible to adapt the low voltage operation. In this manner, the improvement in the characteristic and the operation reliability thereof is achieved.

The gate insulating film 9j is made of, for example, silicon oxide, and, similarly to the gate insulating film 5i of the memory cell selecting MISFET Q, the thickness thereof is designed to be, for example, about 6 nm.

The cap insulating film 6 made of, for example, a silicon oxide film or the like is formed on the upper surface of the gate electrode 9g. Also, the sidewall film 7 made of, for example, a silicon oxide film or the like is formed on the side surface of the gate electrode 9g. In this manner, the boron penetration from the gate electrode made of p type polycrystalline silicon can be prevented. More specifically, as described above, since the silicon nitride film containing hydrogen and ammonia that promote the penetration of boron through the substrate is not used, the boron penetration from the gate electrode made of the p type polycrystalline silicon can be reduced.

Note that these n channel MISFET QN and p channel MISFET QP mentioned above constitute the logic circuits of the DRAM such as a word driver circuit, a data input buffer circuit, a data output buffer circuit, a power supply circuit, and the like.

An interlayer insulating film 10a fills the spaces between the semiconductor elements such as the memory cell selecting MISFET Q, p channel MISFETs Qp and QP, the n channel MISFETs Qn and QN, and the like.

The interlayer insulating film 10a is made of, for example, a silicon oxide film, and the upper surface of the interlayer insulating film 10a is formed so as to be almost as high as the respective upper surfaces of the memory cell area and the first and second logic circuit areas.

However, contact electrodes 12a and 12b are formed on the semiconductor areas 5a and 5b in the memory cell area, respectively. The dimensions of the contact electrodes 12a and 12b relative to a width direction of the gate electrode 5g (word line WL) are defined by the parts of the sidewall films 7 positioned on the side surfaces of the gate electrodes 5g adjacent to each other. More specifically, the width dimension of each contact electrode is a distance obtained by subtracting double of the film thickness of the sidewall film 7 from the distance between the adjacent gate electrodes 5g. Also, the dimensions of the contact electrodes 12a and 12b relative to a height direction are defined by the height of the gate electrode 5g. More specifically, though described later in detail, the contact electrodes 12a and 12b are formed in a self-alignment manner between the adjacent gate electrodes 5g. The contact electrodes 12a and 12b are made of, for example, a low-resistance polycrystalline silicon film containing an n type impurity such as phosphorus, and are electrically connected to the semiconductor areas 5a and 5b of the memory cell selecting MISFET Q, respectively.

An interlayer insulating film 11a is deposited on the interlayer insulating film 10a. The interlayer insulating film 11a is made of, for example, a silicon nitride film and is formed by, for example, the plasma CVD (Chemical Vapor Deposition) method or the like.

An interlayer insulating film 10b is deposited on the interlayer insulating film 11a. The interlayer insulating film 10b is made of, for example, a silicon oxide film, and is formed by, for example, the plasma CVD method or the like. A (bit line) contact electrode 13 is formed in the interlayer insulating film 10b.

An interlayer insulating film 11b is deposited on the interlayer insulating film 10b. The interlayer insulating film 11b is made of, for example, a silicon nitride film, and is formed by, for example, the plasma CVD method or the like.

An interlayer insulating film 10c is deposited on the interlayer insulating film 11b. The interlayer insulating film 10c is made of, for example, a silicon oxide film, and is formed by, for example, the plasma CVD method or the like. A bit line BL and first-layer wirings 14a and 14b are formed in each of the interlayer insulating films 10c and 11b.

This bit line BL is composed of: a barrier metal film formed by sequentially depositing a titanium film and a titanium nitride film from below; and a tungsten film formed thereon. The bit line BL is electrically connected to the contact electrode 12b through the (bit line) contact electrode 13 formed in the interlayer insulating films 11a and 10b. Further, the bit line BL is electrically connected to the semiconductor area 5b of the memory cell selecting MISFET Q through the contact electrode 12b.

Meanwhile, similar to the bit line BL, the first-layer wirings 14a and 14b in the first and second logic circuit areas are composed of: a barrier metal film formed by sequentially depositing a titanium film and a titanium nitride film from below; and a tungsten film formed thereon.

In this case, the first-layer wiring 14a is electrically connected to the semiconductor area 8a2 of the n channel MISFET Qn and the semiconductor area 9a1 of the p channel MISFET Qp through each contact electrode 15 formed in the interlayer insulating films 10a, 11a, and 10b and the like.

Also, the first-layer wiring 14b is electrically connected to the semiconductor area 8b2 of the n channel MISFET QN and the semiconductor area 9b1 of the p channel MISFET QP through each contact electrode 15 formed in the interlayer insulating films 10a, 11a, and 10b and the like.

Also, a first-layer wiring (not shown) is electrically connected to all of the semiconductor area 8a1 of the n channel MISFET Qn, the semiconductor area 9a2 of the p channel MISFET QP, the semiconductor area 8b1 of the n channel MISFET QN, and the semiconductor area 9b2 of the p channel MISFET QP, through contact electrodes (not shown) formed in the interlayer insulating films 10a, 11a, and 10b and the like.

The upper surface of the interlayer insulating film 10c is flatly formed so as to be almost as high as all of the memory cell area and the first and second logic circuit areas.

An interlayer insulating film 11c is deposited on the interlayer insulating film 10c. The interlayer insulating film 11c is made of, for example, silicon nitride.

A connection hole for exposing the upper surface of the contact electrode 12a is formed in the interlayer insulating films 11a, 10b, 11b, 10c and 11c in the memory cell area.

A contact electrode 12c is formed in the connection hole. Further, an oxidation barrier film 16 is buried in the upper portion of the contact electrode 12c. The contact electrode 12c is made of, for example, a low-resistance polycrystalline silicon film containing an n type impurity such as phosphorus, and is electrically connected to the contact electrode 12a. Further, the contact electrode 12c is electrically connected to the semiconductor area 5a of the memory cell selecting MISFET Q through the contact electrode 12a. Also, the oxidation barrier film 16 formed in the upper portion of the contact electrode 12c is made of, for example, tantalum nitride.

A capacitor C is formed in a trench of a thick interlayer insulating film 10d formed on, for example, the interlayer insulating film 11c. The capacitor C is composed of a storage electrode 17a, a capacitor insulating film 17b coated on the surface of the storage electrode 17a, and plate electrodes 17c, 17d, and 17e sequentially coated on the surface of the capacitor insulating film 17b.

The interlayer insulating film 10d is formed of, for example, silicon oxide. The storage electrode 17a of the capacitor C is made of, for example, ruthenium. The lower portion of the storage electrode 17a is electrically connected to the oxidation barrier film 16, and is electrically connected to the semiconductor area 5a of the memory cell selecting MISFET Q through the oxidation barrier film 16.

The capacitor insulating film 17b of the capacitor C is made of, for example, tantalum oxide ($Ta_2O_5$) or the like. The plate electrode 17c of the capacitor C is made of, for example, ruthenium or the like, and is formed so as to cover a plurality of storage electrodes 17a. In addition, both of the plate electrode 17d made of, for example, a TiN film and the plate electrode 17e made of, for example, a tungsten film are deposited on the plate electrode 17c.

An interlayer insulating film 10e is deposited on the interlayer insulating film 10d, and thereby the plate electrodes 17c, 17d and 17e are coated. The interlayer insulating film 10e is made of, for example, a silicon oxide film or the like, and second-layer wirings 18a and 18b are formed on the upper surface thereof.

Each of the second-layer wirings 18a and 18b is formed by sequentially depositing, for example, a titanium nitride film, an aluminum (Al) film, and a titanium film from below. The second-layer wirings 18a in the first and second logic circuit areas are electrically connected to the first-layer wirings 14a and 14b, respectively, through conductor films 19 in connection holes formed in the interlayer insulating films 11c, 10d, and 10e. Each conductor film 19 is formed by sequentially depositing, for example, a barrier metal film and a tungsten film from below. The second-layer wiring 18b in the memory cell area is electrically connected to the plate electrode 17e through another conductor film 19 in a connection hole formed in the interlayer insulating film 10e. Another conductor film 19 is formed by sequentially depositing, for example, a barrier metal film and a tungsten film from below.

An interlayer insulating film 10f is deposited on the interlayer insulating film 10e, and thereby the second-layer wirings 18a and 18b are coated. The interlayer insulating film 10f on the second-layer wiring is made of, for example, silicon oxide or the like, and is formed by, for example, the high-density plasma CVD method or the like. The high-density plasma CVD method makes it possible to bury silicon oxide with high accuracy between the second-layer wirings without voids (vacancy).

An interlayer insulating film 10g is deposited on the interlayer insulating film 10f. The interlayer insulating film 10g is made of, for example, a silicon oxide film or the like, and is formed by, for example, the plasma CVD method or the like. The upper surfaces of the interlayer insulating film 10g and 10f are flatly formed so as to have almost the same height on the second-layer wiring and on the spaces between the second-layer wirings. An interlayer insulating film 10h is deposited on the interlayer insulating films 10g and 10f. The interlayer insulating film 10h is made of, for example, a silicon oxide film or the like.

A third-layer wiring 20 is formed on the interlayer insulating film 10h. The third-layer wiring 20 is formed by sequentially depositing, for example, a TiN film, an Al film, and a Ti film from below.

The third-layer wiring 20 is electrically connected to the second-layer wiring 18a through a conductor film 21 in a connection hole formed in the interlayer insulating films 10f, 10g, and 10h. The conductor film 21 is formed by sequentially depositing a TiN film and a tungsten film from below.

A passivation film composed of, for example, an insulating film formed by laminating a silicon oxide film and a silicon nitride film is formed on the third-layer wirings 20. However, illustrations thereof will be omitted.

Hereinafter, embodiments of the present invention will be described in detail based on the production process thereof. Note that components having the same function are denoted by the same reference symbols throughout all the drawings in order to describe the embodiments, and the repetitive descriptions thereof will be omitted.

First of all, a semiconductor substrate 1 made of, for example, p type single crystal silicon is prepared and then MISFETs used in a memory cell and a logic circuit are fabricated. For its fabrication, element isolations for isolating MISFETs are first formed in a surface of the semiconductor substrate 1 by using the selective oxidation method or the shallow trench isolation method known well.

Figure 2:
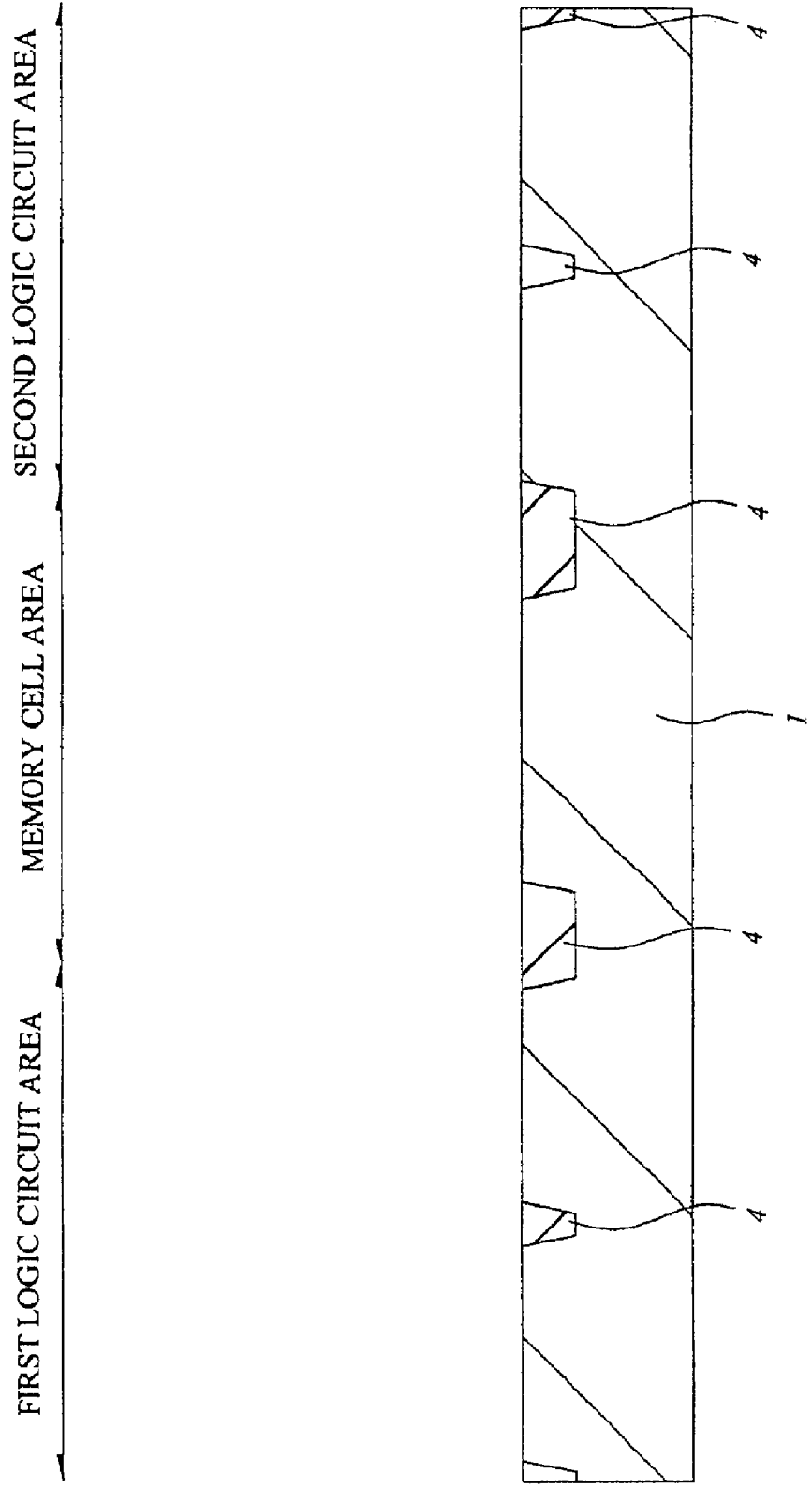
FIG. 2 is a cross-sectional view showing the principal part of the semiconductor integrated circuit device of FIG. 1 during the production process.
Figure 3:
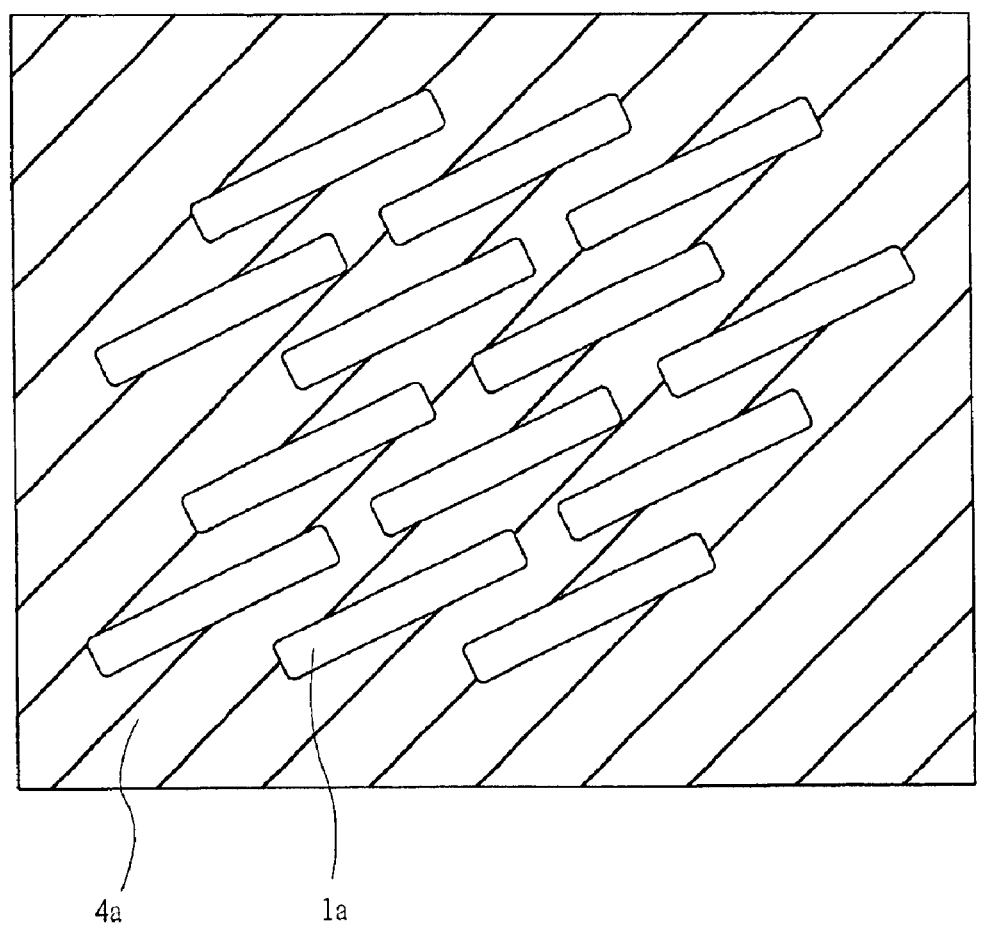
FIG. 3 is a plan view showing the principal part of the semiconductor integrated circuit device of FIG. 1 during the production process.

The element isolations are formed by the shallow trench isolation method as follows. First, isolation trenches each having a depth of about 0.3 to 0.4 μm are formed in the semiconductor substrate 1 by the known dry-etching method. Subsequently, damages to the sidewall and the bottom surface of each trench due to the dry etching are removed by forming a thin silicon oxide film (not shown) on the sidewall and the bottom surface of each trench. Next, on the substrate 1 along with the inside of each isolation trench, a silicon oxide film is deposited to a film thickness of about 0.6 μm by the known CVD method. The silicon oxide film deposited outside each trench is selectively polished by the known CMP (Chemical Mechanical Polishing) method, and thereby only the silicon oxide film deposited inside the each isolation trench is left (FIG. 2). As shown in the figures, the areas between the respective element isolations are set as the first logic circuit area, the memory cell area, and the second logic circuit area, in this order from the left. FIG. 3 is a plan view showing the principal part of the semiconductor substrate after the element isolation (silicon oxide film 4) is formed in the memory cell area of the three areas. The reference numeral 4a in FIG. 3 denotes an element isolation area in which the silicon oxide film 4 is buried, and the reference numeral 1a denotes an element forming area partitioned in the element isolation area 4a. The element forming area 1a is aslant formed relative to such a direction that the later-described bit line BL extends. Such a layout is employed in a so-called open bit line arrangement. Note that, in this embodiment, the element forming area 1a is formed as a slant pattern for the open bit line arrangement, but may of course be formed as other patterns for a so-called folded bit line arrangement or the like.

After a pre-oxidation treatment of the semiconductor substrate 1 is performed and a photoresist film (not shown and referred to as resist film hereinafter) in which the memory cell area of the semiconductor substrate 1 is exposed is formed, an n type impurity such as phosphorus or the like is ion-implanted into the memory cell area of the semiconductor substrate 1 with using the resist film as a mask.

Next, after a removal of the resist film, a resist film (not shown) in which the n channel MISFET (Qn and QN) forming areas of the first and second logic circuit areas are exposed is formed on the semiconductor substrate 1. Then, a p type impurity such as boron or the like is ion-implanted into the MISFET forming areas of the semiconductor substrate 1 with using the resist mask as a mask.

Next, after a removal of the resist film, a resist film (not shown) in which the p channel MISFET (Qp and QP) forming areas in the first and second logic circuit areas are exposed is formed on the semiconductor substrate 1. Then, an n type impurity such as phosphorus or the like is ion-implanted into the MISFET forming areas of the semiconductor substrate 1 with using the resist mask as a mask.

Figure 4:
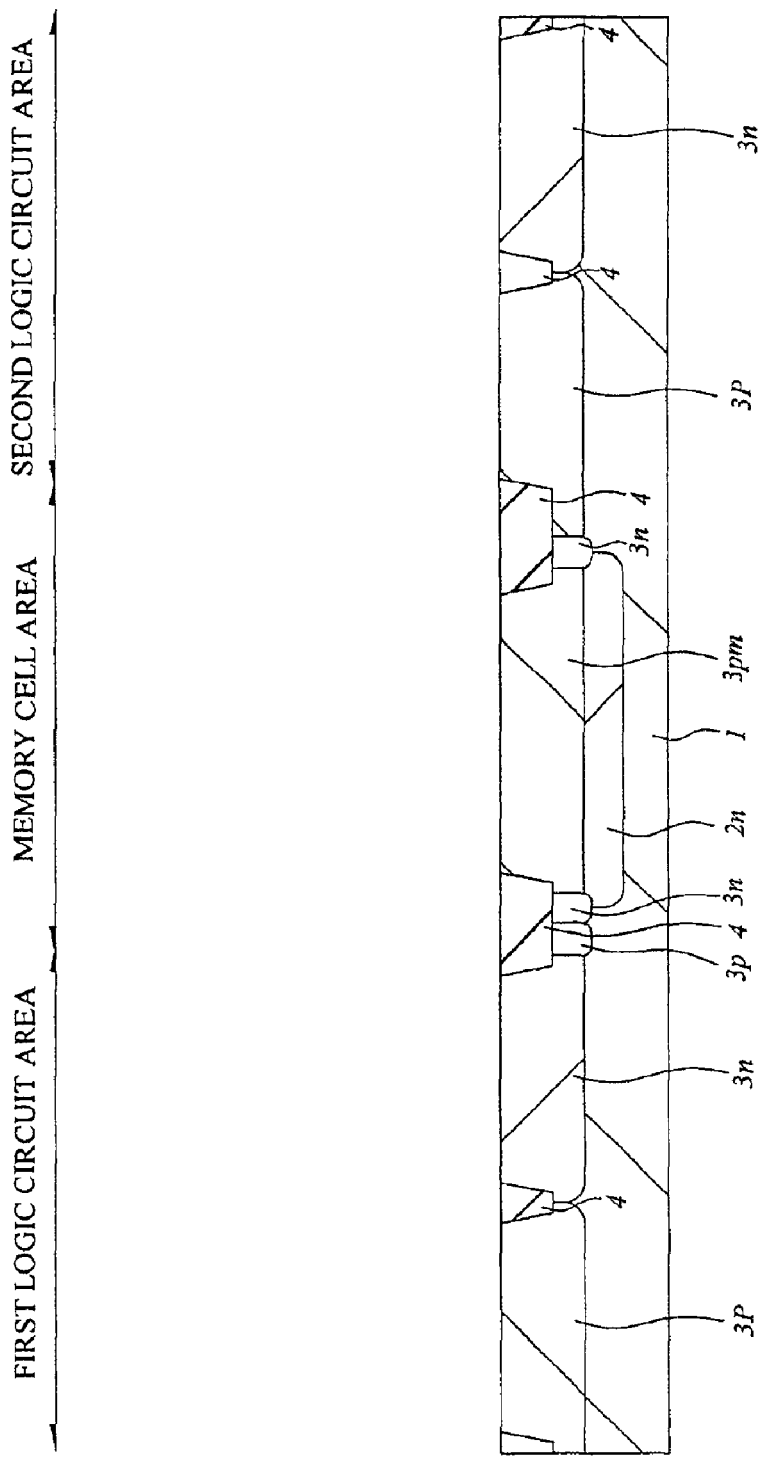
FIG. 4 is a cross-sectional view showing the principal part of the semiconductor integrated circuit device of FIG. 1 during the production process.

Next, after a removal of the resist film, a heat treatment is performed relative to the semiconductor substrate 1, and thereby a deep n well 2n, p wells 3pm and 3p, and an n well 3n are formed in the semiconductor substrate 1 as shown in FIG. 4.

In this embodiment, the deep n well 2n is used to prevent noise from entering the p well 3pm in the memory cell area from an I/O circuit or the like through the semiconductor substrate 1 and to prevent the electric charge accumulated in the memory cell from vanishing. However, it is also possible to use no deep n well 2n in order to prevent the substrate voltage from being applied to the memory cell area.

Next, a p type impurity such as $BF_2$ or the like for adjustment of the threshold voltage is ion-implanted into the n channel MISFET (Qn and QN) forming areas (p well 3p) in the first and second logic circuit areas.

Next, an n impurity such as phosphorus or the like for adjustment of the threshold voltage is ion-implanted into the p channel MISFET (Qp and QP) forming areas (n well 3n) in the first and second logic circuit areas.

Next, a p type impurity such as boron or the like for punch-through prevention is ion-implanted into the memory cell area.

In this embodiment, for simplification of processes, the ion implantation for adjustment of the threshold voltage of the MISFETs (Qn and Qp) each having a later-described relatively thin gate insulating film in the first logic circuit area, and the ion implantation for adjustment of the threshold voltage of the MISFETs (QN and QP) each having a later-described relatively thick gate insulating film in the second logic circuit area are performed simultaneously and under the same condition. However, these ion implantations for adjustment of the threshold voltage can of course be performed under different conditions and in different steps.

For example, after a p type impurity such as $BF_2$ or the like for adjustment of the threshold voltage is implanted into the n channel MISFET (Qn) forming area (p well 3p) having a relatively thin gate insulating film in the first logic circuit area, a p type impurity such as $BF_2$ or the like for adjustment of the threshold voltage can be of course ion-implanted into the n channel MISFET (QN) forming area (p well 3p) having a relatively thick gate insulating film in the second logic circuit area.

In addition, after an n type impurity such as phosphorus or the like for adjustment of the threshold voltage is ion-implanted into the p channel MISFET (Qp) forming area (n well 3n) having a relatively thin gate insulating film in the first logic circuit area, an n type impurity such as phosphorus or the like for adjustment of the threshold voltage can be of course ion-implanted into the p channel MISFET (QP) forming area (n well 3n) having a relatively thick gate insulating film in the second logic circuit area.

In this embodiment, the ion implantation for adjustment of each threshold voltage of the p channel MISFETs (Qp and QP) is used to appropriately set each threshold voltage. However, for the simplification of the processes, it is of course possible to perform the ion implantation simultaneously with the ion implantation for forming the above-mentioned n well 3n.

In this embodiment, for appropriate setting of the threshold voltage, the ion implantation for adjustment of each threshold voltage of the n channel MISFETs in the first and second logic circuit areas and the ion implantation for the punch-through prevention of the memory cell selecting MISFET are performed in different steps. However, since the substrate concentration in the n channel MISFET and that of the memory cell selecting MISFET having a p type gate electrode are almost equal to each other, it is of course possible to perform the ion implantations simultaneously with each other under the same ion-implantation condition.

Figure 6:
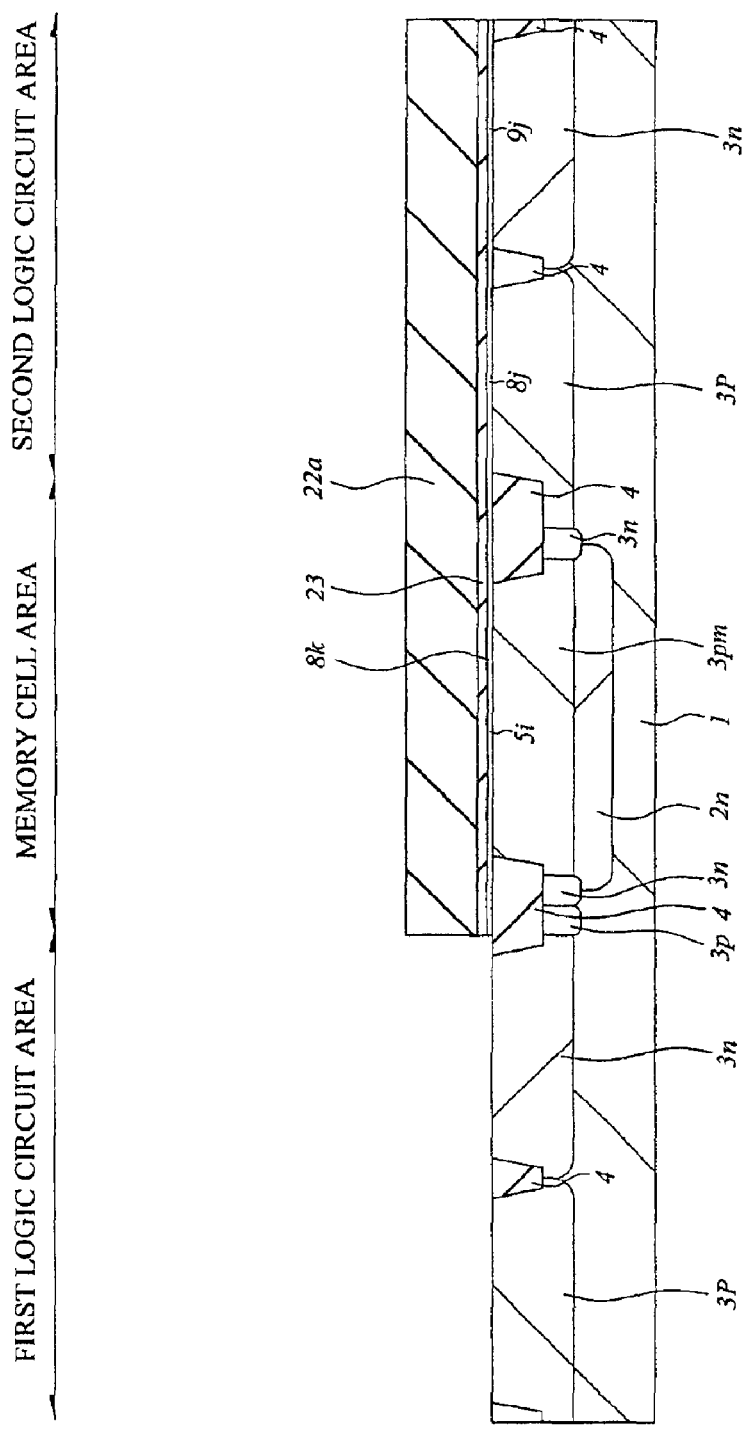
FIG. 6 is a cross-sectional view showing the principal part of the semiconductor integrated circuit device of FIG. 1 during the production process.

Subsequently, a first thermal oxidation treatment is performed relative to the semiconductor substrate 1, and thereby a gate insulating film 8k is formed on the semiconductor substrate 1 as shown in FIG. 5. A wet oxidation treatment at, for example, about 750° C. is employed in this oxidation treatment. The gate insulating film 8k at this stage has a uniform thickness in all areas of the main surface of the semiconductor substrate 1, and the thickness thereof is, for example, about 5.1 nm. Next, as shown in FIG. 6, a silicon oxide film 23 is deposited on the semiconductor substrate 1 to a thickness of about 10 nm by the CVD method.

Next, a resist film 22a in which the first logic circuit area (area for forming a relatively thin gate insulating film) is exposed is formed on the semiconductor substrate 1, and thereafter is used as an etching mask to remove the silicon oxide film 23 and the gate insulating film 8k. Thereby, both of the silicon oxide film 23 and the gate insulating film 8k are left only in the memory cell area and the second logic circuit area.

Subsequently, after the resist film 22a is removed, the silicon oxide film 23 in the memory cell area and the second logic circuit area is removed by the known cleaning method. At this time, to prevent the remaining gate insulating film 8k from being cut off, the silicon oxide film 23 is removed under the condition that the silicon oxide film 23 has a high etching selective ratio with respect to the gate insulating film.

Figure 7:
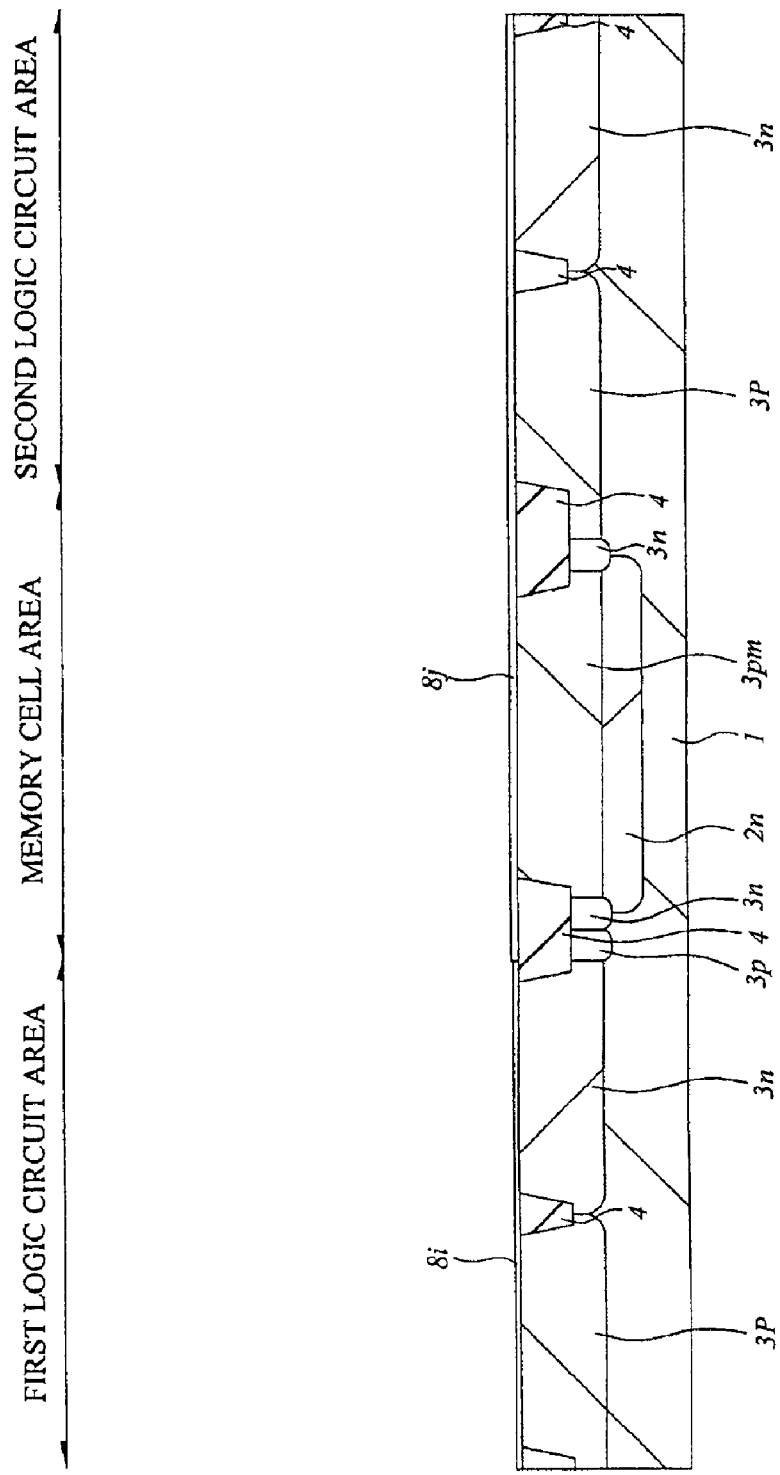
FIG. 7 is a cross-sectional view showing the principal part of the semiconductor integrated circuit device of FIG. 1 during the production process.

Next, a second thermal oxidation treatment is performed relative to the semiconductor substrate 1, and thereby gate insulating films 8i and 8j that are different from each other in thickness is formed on the semiconductor substrate 1 as shown in FIG. 7. The wet oxidation treatment at, for example, about 750° C. is employed in this oxidation treatment.

Subsequently, an oxide nitridation treatment is performed relative to the semiconductor substrate 1 by the known method. In this state, the gate insulating films 8i and 8j are different from each other in thickness, and the thickness of the relatively thick gate insulating film 8j is, for example, about 6 nm and that of the relatively thin gate insulating film 8i is, for example, about 3.5 nm.

Figure 8:
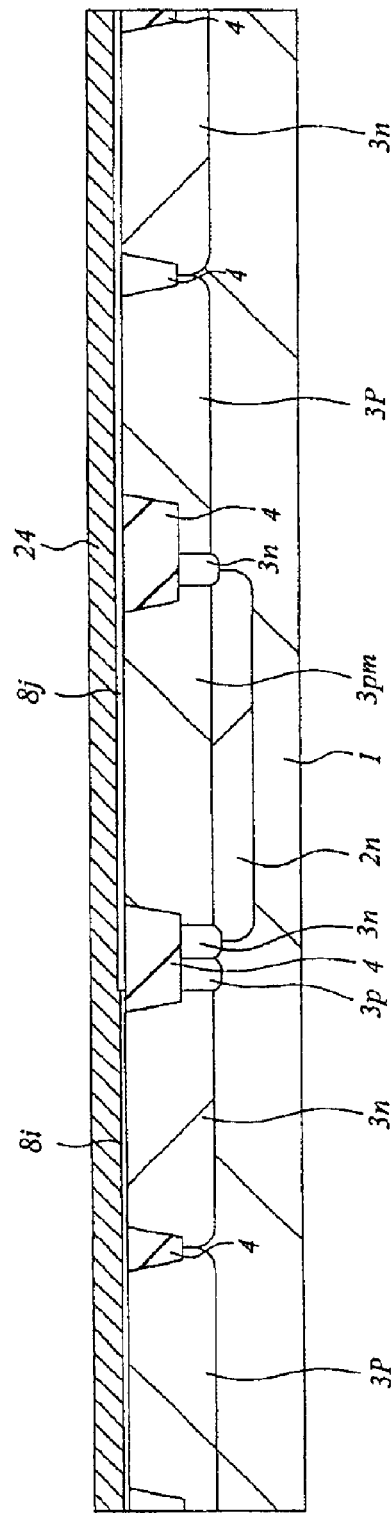
FIG. 8 is a cross-sectional view showing the principal part of the semiconductor integrated circuit device of FIG. 1 during the production process.

Next, a polycrystalline silicon film 24 is deposited over the semiconductor substrate 1 by the CVD method or the like as shown in FIG. 8.

Subsequently, impurities are introduced into each gate electrode of the MISFETs to be formed on the semiconductor substrate 1.

Figure 9:
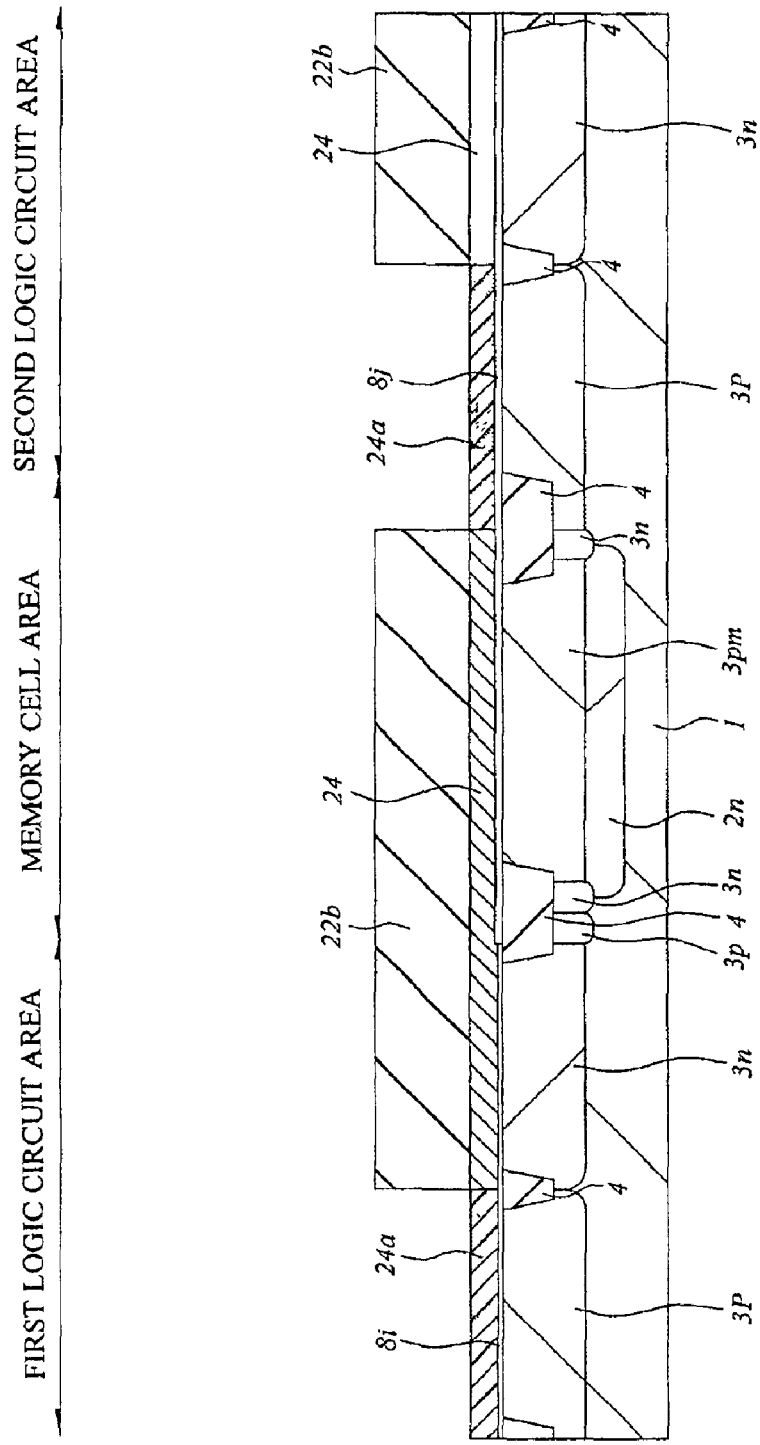
FIG. 9 is a cross-sectional view showing the principal part of the semiconductor integrated circuit device of FIG. 1 during the production process.

More specifically, as shown in FIG. 9, a resist film 22b in which the n channel MISFET (Qn and QN) forming areas in the first and second logic circuit areas are exposed is formed on the polycrystalline silicon film 24, and thereafter is used as a mask to ion-implant an n type impurity such as phosphorus or arsenic (As) into the polycrystalline silicon film 24 and to form n type polycrystalline silicon areas 24a.

Figure 10:
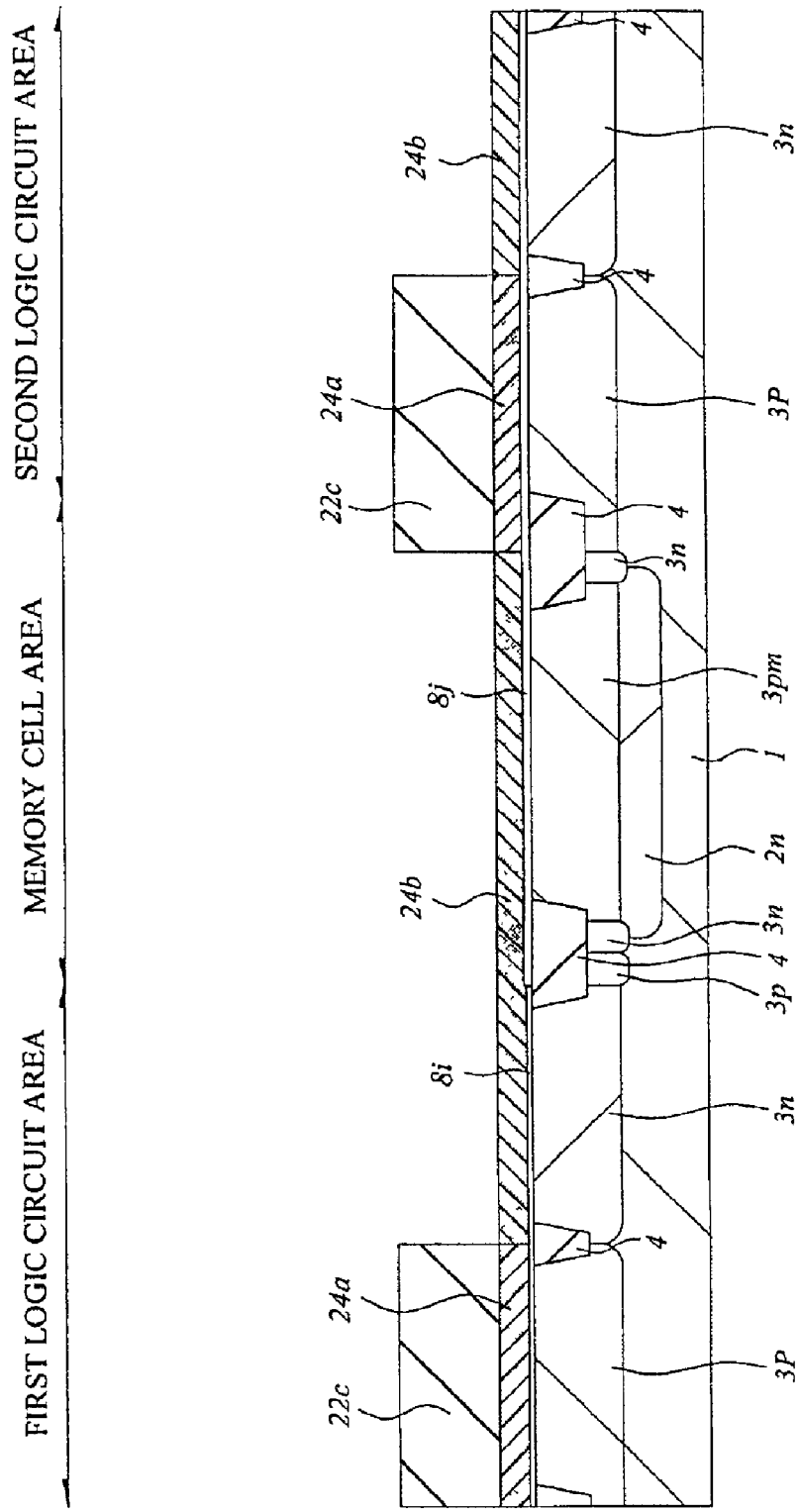
FIG. 10 is a cross-sectional view showing the principal part of the semiconductor integrated circuit device of FIG. 1 during the production process.

Next, after a removal of the resist film 22b, as shown in FIG. 10, a resist film 22c in which the p channel MISFET (Qp and QP) forming areas in the first and second logic circuit areas and the memory cell area are exposed is formed on the polycrystalline silicon film 24a, and is used as a mask to ion-implant a p type impurity such as boron or $BF_2$ into the polycrystalline silicon film 24 and thereby form p type polycrystalline silicon areas 24b.

When the p type impurity such as boron or $BF_2$ or the like is ion-implanted, it is preferable to control the implantation energy so as to prevent boron or the like from reaching a deep position in the polycrystalline silicon film 24. This is because of the suppression of a phenomenon which is thought to easily occur, the phenomenon being one that if the boron or the like reaches the deep position in the polycrystalline silicon film 24, the boron penetrates the gate insulating films 8i and 8j by the subsequent heat process and diffuses in the semiconductor substrate 1.

In this embodiment, to appropriately set the impurity concentration of the gate electrodes (24a and 24b), when an n type impurity is ion-implanted into the polycrystalline silicon film 24 in the n channel MISFET (Qn and QN) forming areas, other areas (the p channel MISFET (Qp and QP) forming areas and the memory cell area) are covered with the resist film 22. However, after an n type impurity is ion-implanted into the whole area of the polycrystalline silicon film 24, a resist film in which the p channel MISFET (Qp and QP) forming areas and the memory cell area are exposed may be formed thereon, and be used as a mask to ion-implant a p type impurity into the polycrystalline silicon film 24.

In contrast, after a p type impurity is ion-implanted into the whole area of the polycrystalline silicon film 24, a resist film in which the n channel MISFET (Qn and QN) forming areas and the memory cell area are exposed may be formed thereon, and be used as a mask to ion-implant an n type impurity into the polycrystalline silicon film 24.

As described above in this embodiment, since the conductive type of the gate electrode is set at an n type or p type by the ion implantation, it is possible to improve the characteristic of the gate electrode. In addition, the conductive type of the gate electrode of the p channel MISFET constituting the logic circuit is set at a p type. Therefore, in the channel area of the p channel MISFET constituting the logic circuit, an n type impurity having the same conductive type as the substrate in this channel area is ion-planted, and thereby it is possible to adjust the threshold voltage of the p channel memory cell MISFET to a desired value.

Also, in a step of the ion implantation into the polycrystalline silicon film 24, to prevent the boron penetration, nitrogen molecule ions may be implanted.

Figure 11:
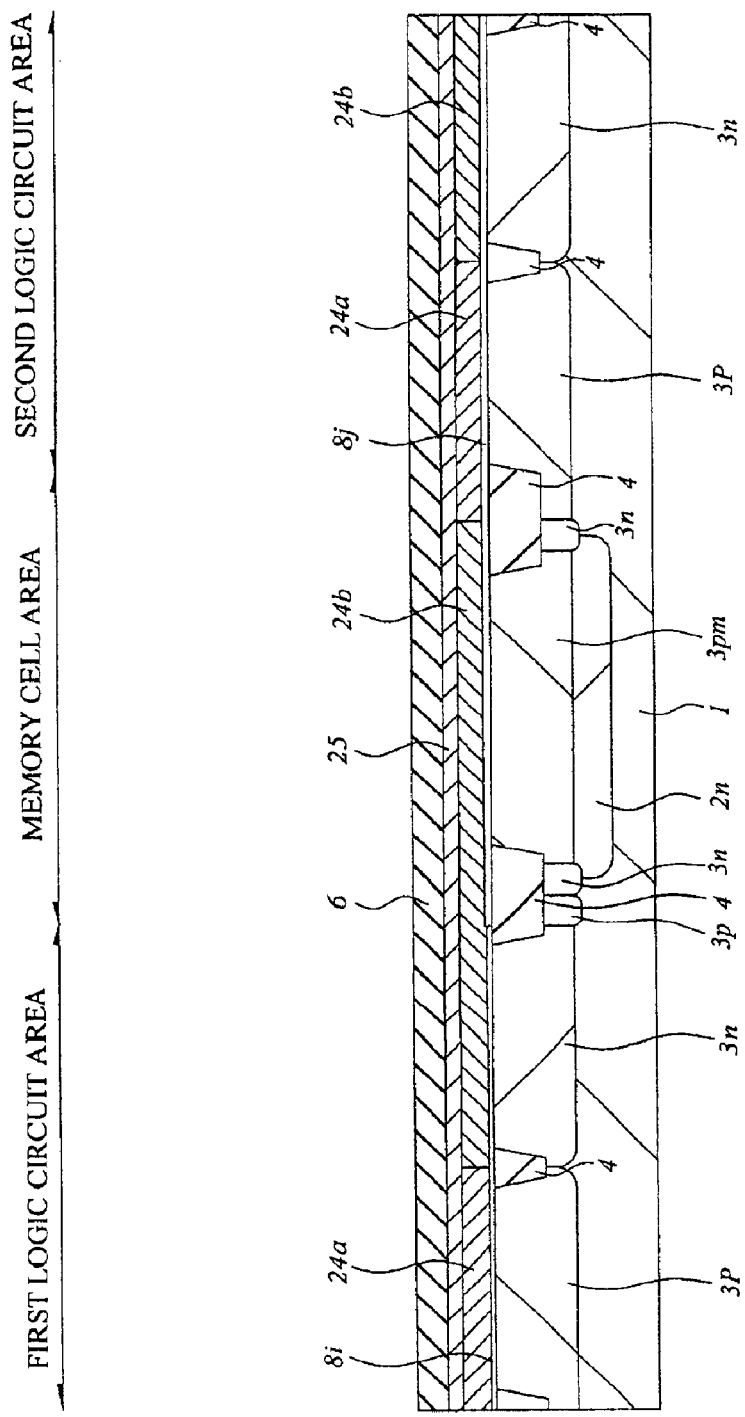
FIG. 11 is a cross-sectional view showing the principal part of the semiconductor integrated circuit device of FIG. 1 during the production process.

Subsequently, as shown in FIG. 11, a barrier metal film (not shown) made of, for example, tungsten nitride (WN) or the like is deposited on the polycrystalline silicon films 24a and 24b, and then a metal film 25 made of, for example, tungsten or the like is deposited thereon.

Next, a silicon oxide film 6 is deposited on the metal film 25. Although the silicon oxide film 6 is used in this case, any film may be used if containing less amount of material, such as hydrogen or the like, that promotes the boron penetration in comparison to the silicon nitride film.

Subsequently, a resist film (not shown) is formed on the silicon oxide film 6, and the silicon oxide film 6 is etched and thereby is left as a hard mask in the area in which the gate electrode is to be formed.

Figure 12:
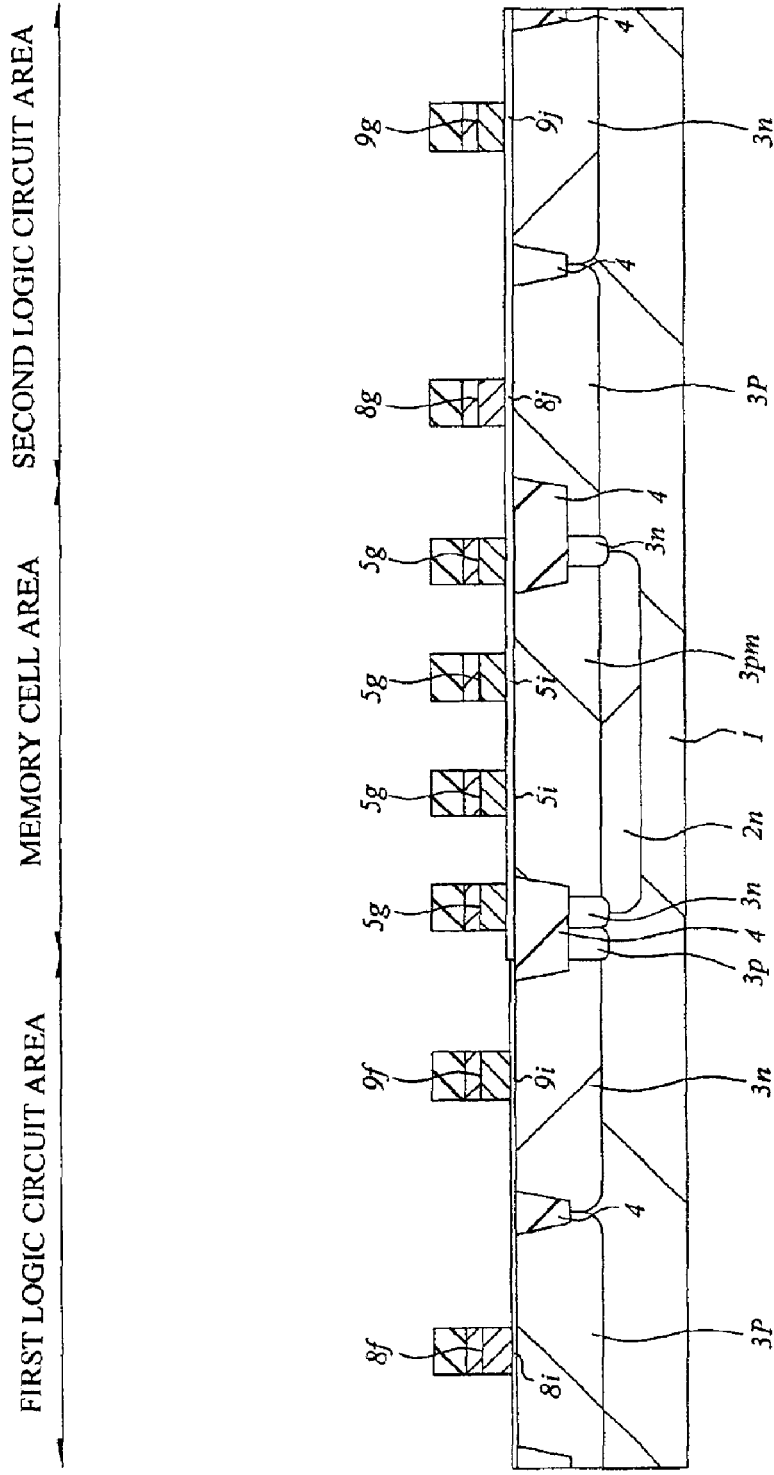
FIG. 12 is a cross-sectional view showing the principal part of the semiconductor integrated circuit device of FIG. 1 during the production process.

Next, as shown in FIG. 12, the hard mask of the above-mentioned silicon oxide film 6 is used as a mask to dry-etch the polycrystalline silicon films 24a and 24b, the barrier metal film (not shown), and the metal film 25 and thereby form gate electrodes 5g (word line WL), gate electrodes 8f, 8g, 9f, and 9g. In this case, the gate insulating films under the gate electrodes 8f, 8g, 5g, 9f and 9g are referred as 8i, 8j, 5i, 9i and 9j, respectively.

The gate electrode 5g constitutes a part of the memory cell selecting MISFET and functions as the word line WL in the area other than the element forming area (on the isolation area).

A width of the gate electrode 5g, namely, a gate length thereof is set to be the minimum dimension (e.g., 0.11 $\mu$m) within the allowable range capable of suppressing the short channel effect of the memory cell selecting MISFET and keeping the threshold voltage higher than a predetermined value. Also, an interval between two adjacent gate electrodes 5g is set to be the minimum dimension (e.g., 0.11 $\mu$m) determined by the resolution limit of the photolithography.

The gate electrodes 8f, 8g, 9f and 9g constitute a part of each of the n channel MISFET and the p channel MISFET of the logic circuit.

Figure 13:
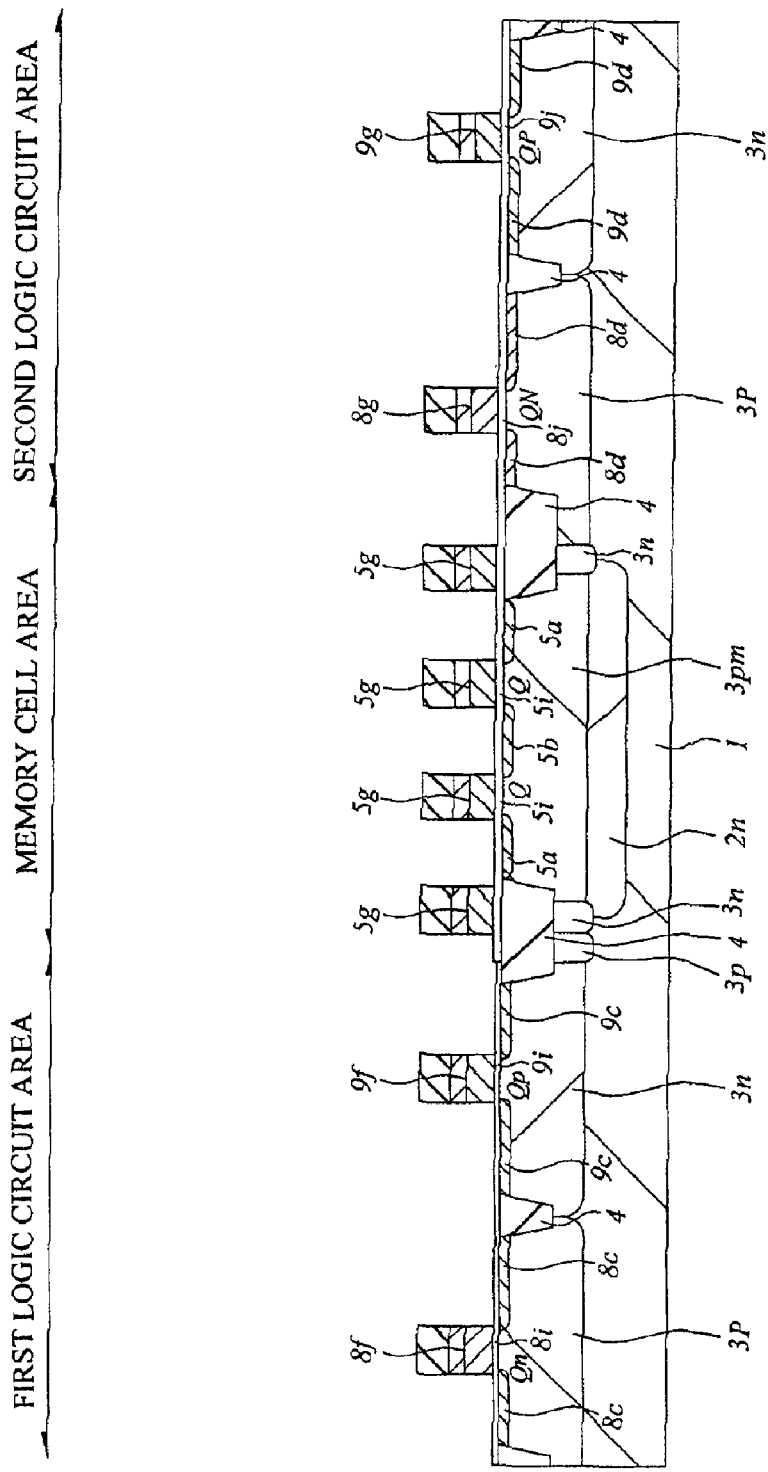
FIG. 13 is a cross-sectional view showing the principal part of the semiconductor integrated circuit device of FIG. 1 during the production process.

Next, the gate electrodes and the resist film are used as masks to implant impurities and thereby form semiconductor areas 5a and 5b in the memory cell area and semiconductor areas 8c, 8d, 9c and 9d in the first and second logic circuit areas (FIG. 13).

More specifically, phosphorus is ion-implanted into the memory cell area (p well 3pm) to about an implantation amount of 1 to $2\times10^{13}/cm^2$, and arsenic is ion-implanted into the p well 3p of the first logic circuit area to an implantation amount of about 1 to $2\times10^{14}/cm^2$, and $BF_2$ or boron is ion-implanted into the n well 3n of the first logic circuit area to an implantation amount of about 1 to $2\times10^{14}/cm^2$. In addition, to decrease the electric field from the viewpoint of measures for the hot-carrier effects, phosphorus is ion-implanted into the p well 3p of the second logic circuit area to an implantation amount of about 0.5 to $2\times10^{14}/cm^2$, and $BF_2$ or boron is ion-implanted into the n well 3n of the second logic circuit area to an implantation amount of about 0.5 to $2\times10^{14}/cm^2$. Then, the semiconductor substrate 1 is heated at 950° C. and for 10 seconds to activate the implanted impurities and thereby form the semiconductor areas (5a, 5b, 8c, 8d, 9c and 9d).

Figure 14:
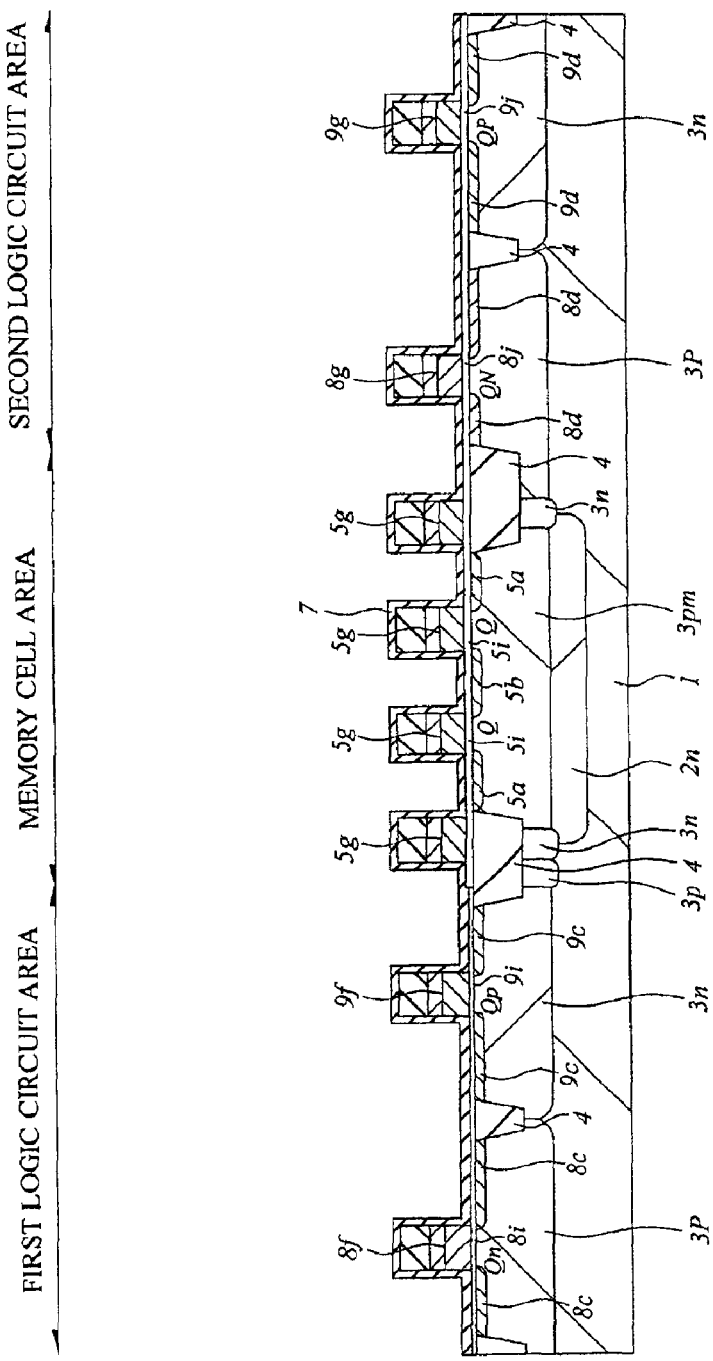
FIG. 14 is a cross-sectional view showing the principal part of the semiconductor integrated circuit device of FIG. 1 during the production process.

Next, as shown in FIG. 14, a silicon oxide film 7 is deposited to a thickness of 10 to 15 nm over the semiconductor substrate 1 by the CVD method. Although the silicon oxide film is used in this case, any film may be used if containing less amount of material, such as hydrogen or the like, that promotes the boron penetration in comparison to a silicon nitride film.

Figure 15:
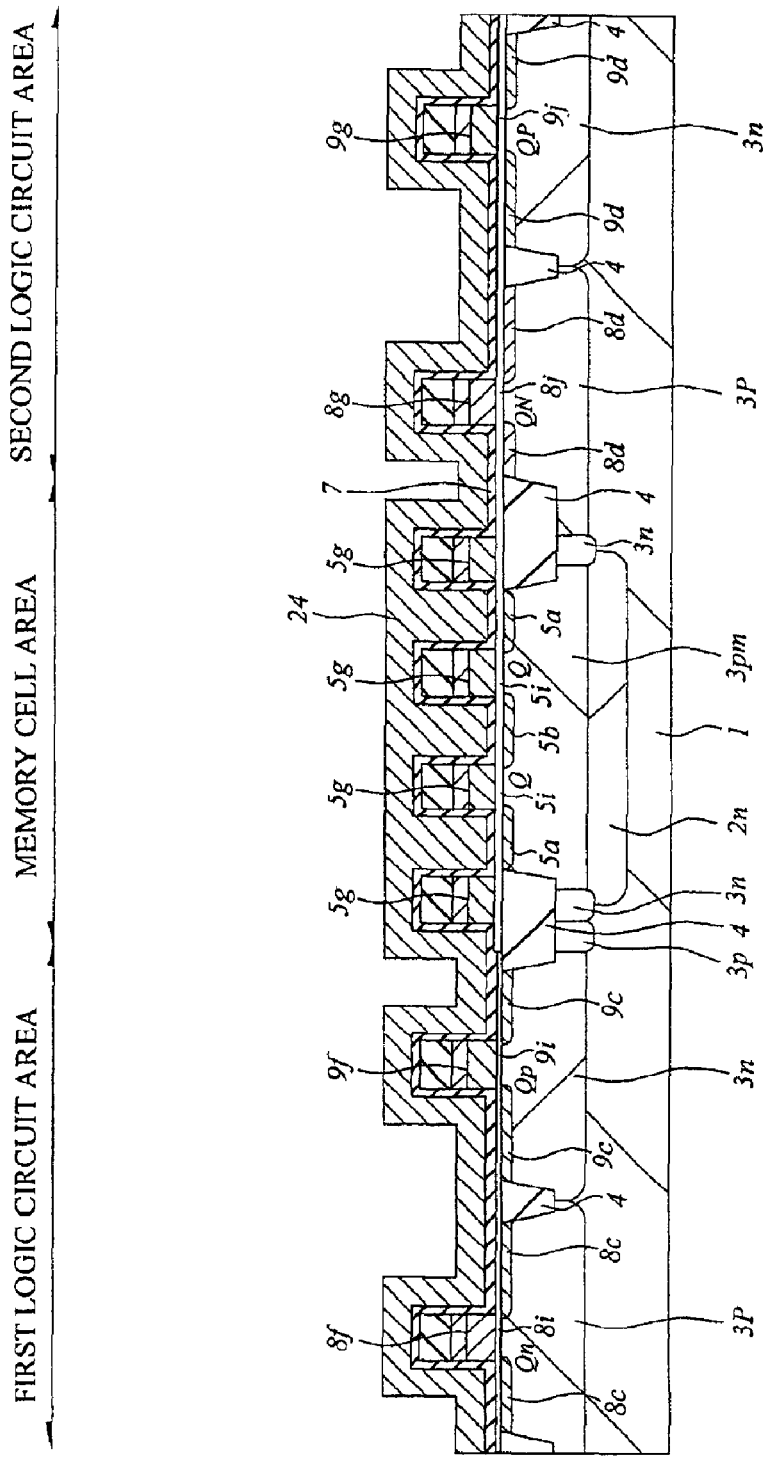
FIG. 15 is a cross-sectional view showing the principal part of the semiconductor integrated circuit device of FIG. 1 during the production process.

Subsequently, a polycrystalline silicon film 24 is deposited on the whole surface thereof by the CVD method, as shown in FIG. 15. The film thickness of the polycrystalline silicon film 24 is set at such a film thickness or more as to be capable of completely burying the spaces between the gate electrodes 5g in the memory cell area. This embodiment is set at, for example, 80 nm.

Figure 16:
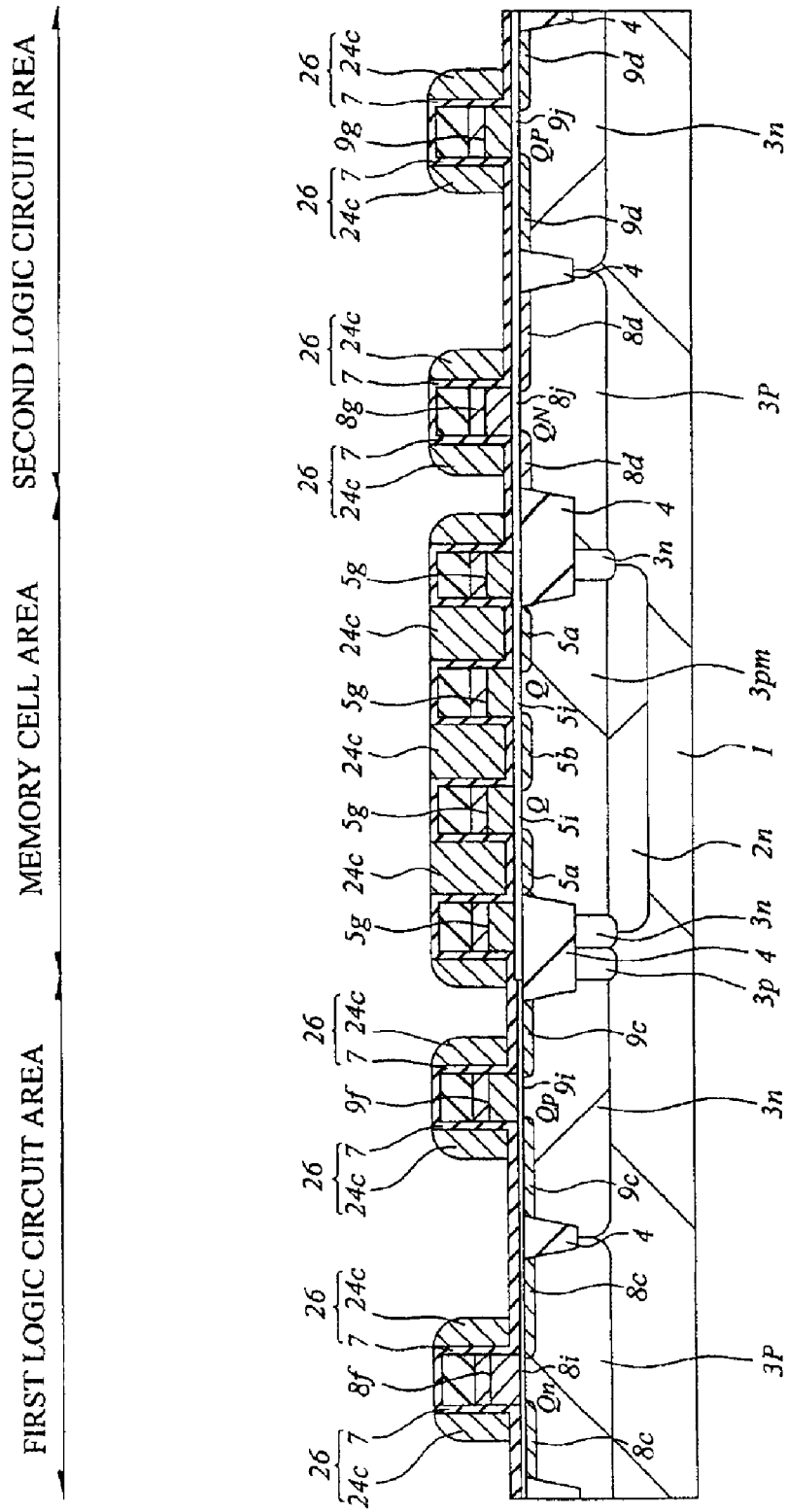
FIG. 16 is a cross-sectional view showing the principal part of the semiconductor integrated circuit device of FIG. 1 during the production process.

Next, an anisotropic etching treatment is performed as shown in FIG. 16. By doing so, a insulating film 7 and a polycrystalline silicon films 24c are left in the memory cell area, and a sidewall spacer film (hereinafter, referred to as sidewall film) 26 composed of the silicon oxide film 7 and the polycrystalline silicon film 24c is formed on each sidewall of the gate electrodes 8f, 8g, 9f and 9g in the first and second logic circuit areas. In order to minimize the cut-off amounts of the gate insulating films 8i and 8j or the like and the insulating films 4 buried in the isolation area, this etching employs such etching gas that an etching rate of the polycrystalline silicon film to the silicon oxide film becomes high.

Thus, according to this embodiment, since the polycrystalline silicon film is deposited and used as a hard mask in the memory cell area, it is possible to reduce the photoresist step from the steps of forming the laminated sidewall film of the gate electrode in the logic circuit area.

Figure 17:
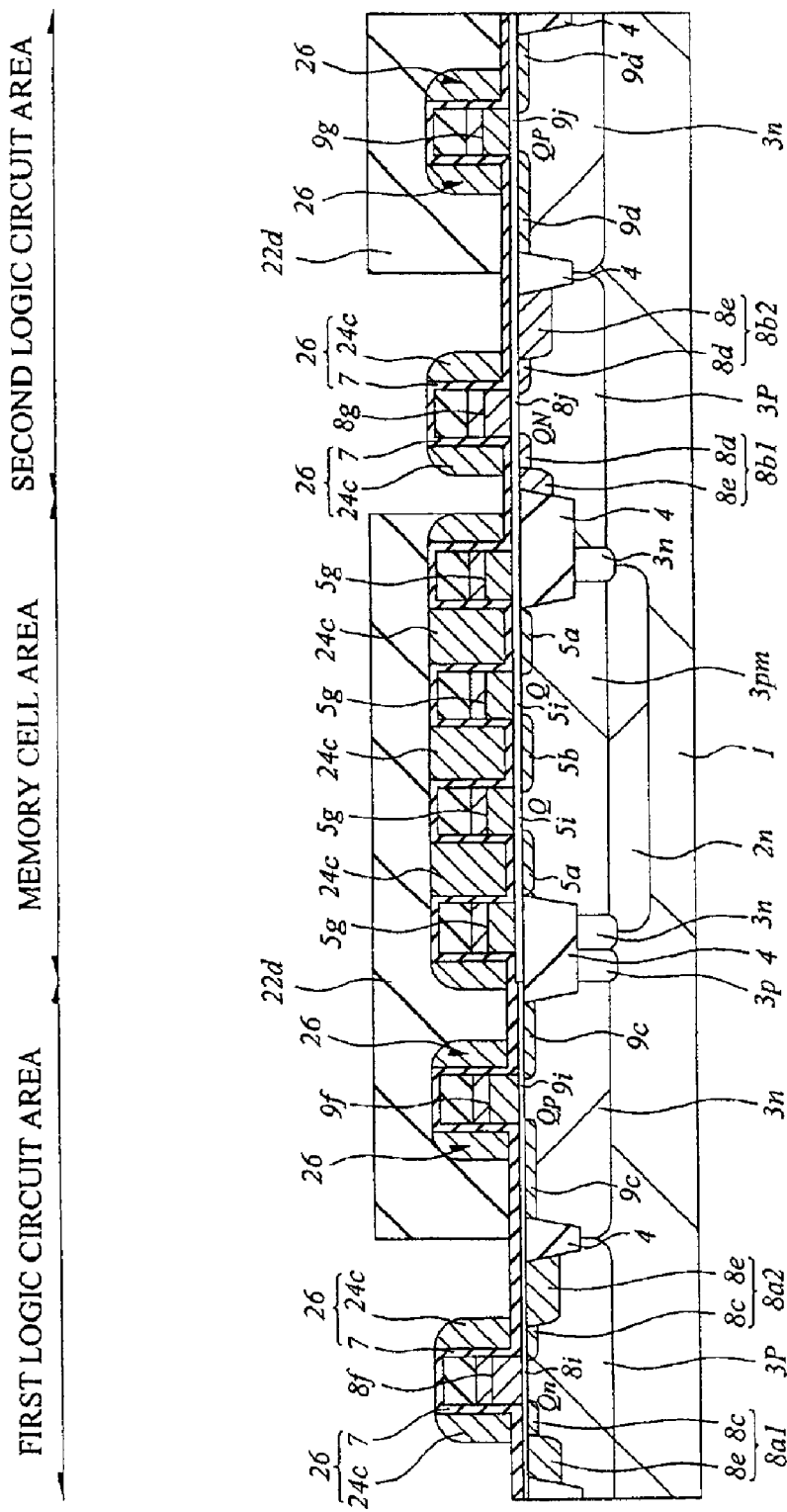
FIG. 17 is a cross-sectional view showing the principal part of the semiconductor integrated circuit device of FIG. 1 during the production process.

Subsequently, a resist film 22d in which the n channel MISFET (Qn and QN) forming areas in the first and second logic circuit areas are exposed is formed over the semiconductor substrate 1. Thereafter, an n type impurity such as As is introduced by the ion implantation method or the like with using, as masks, the resist film 22d, the gate electrodes 8f and 8g, and the laminated sidewall film 26 composed of the silicon oxide film 7 and the polycrystalline silicon film 24c, and thereby a high-concentration semiconductor area 8e is formed (FIG. 17).

Figure 18:
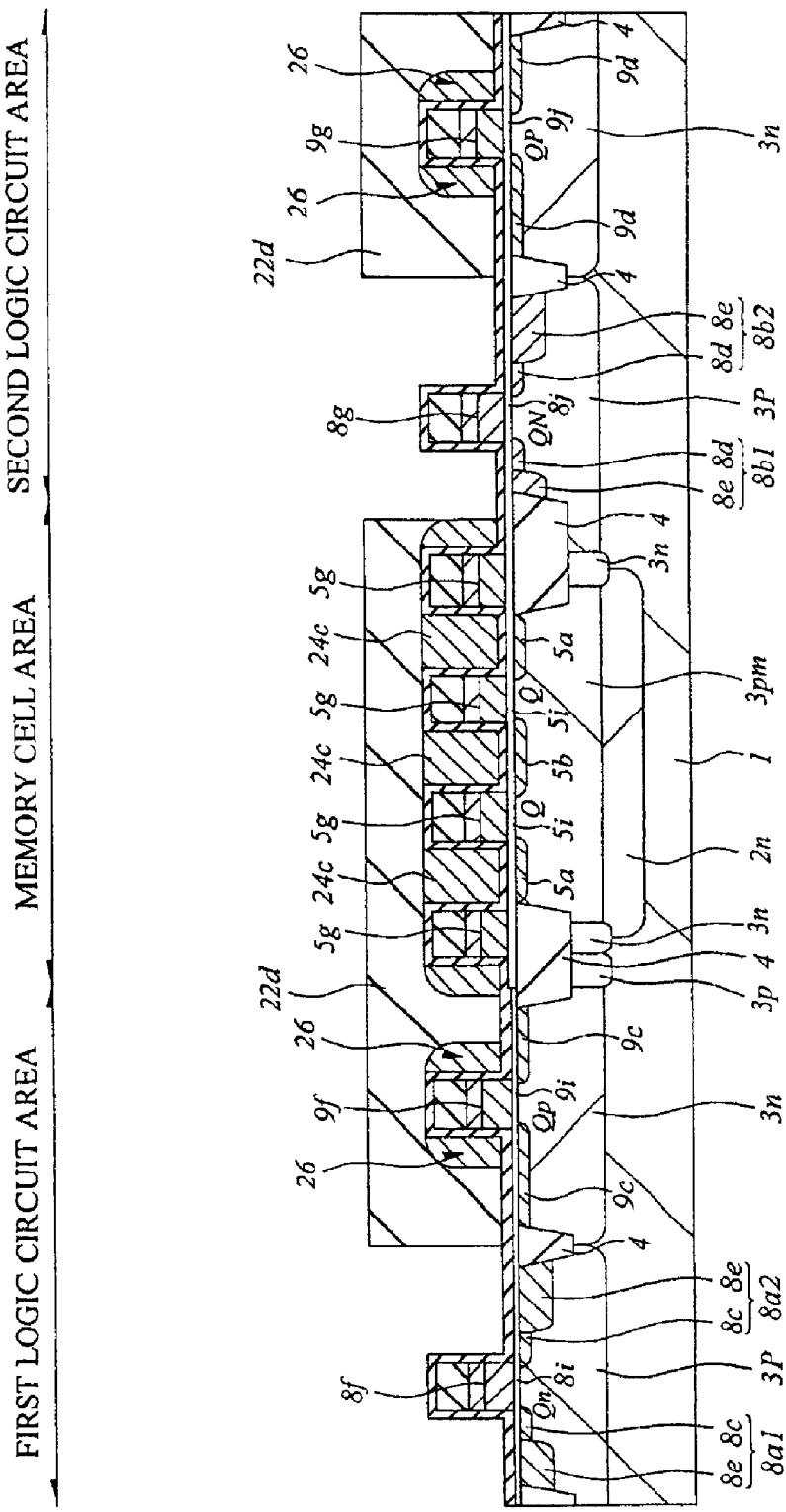
FIG. 18 is a cross-sectional view showing the principal part of the semiconductor integrated circuit device of FIG. 1 during the production process.

Next, as shown in FIG. 18, an isotropic dry etching treatment is performed relative to each polycrystalline silicon film 24c of the n channel MISFET forming areas in the first and second logic circuit areas, and thereby the polycrystalline silicon film 24c is removed. This etching employs such etching gas that an etching rate of the polycrystalline silicon film to the silicon oxide film becomes high.

In this embodiment, although the silicon oxide film 7 is left on the semiconductor substrate 1 and on the sidewalls of the gate electrodes 8f and 8g and the like, the silicon oxide film 7 along with the polycrystalline silicon film 24c can be of course removed.

Figure 19:
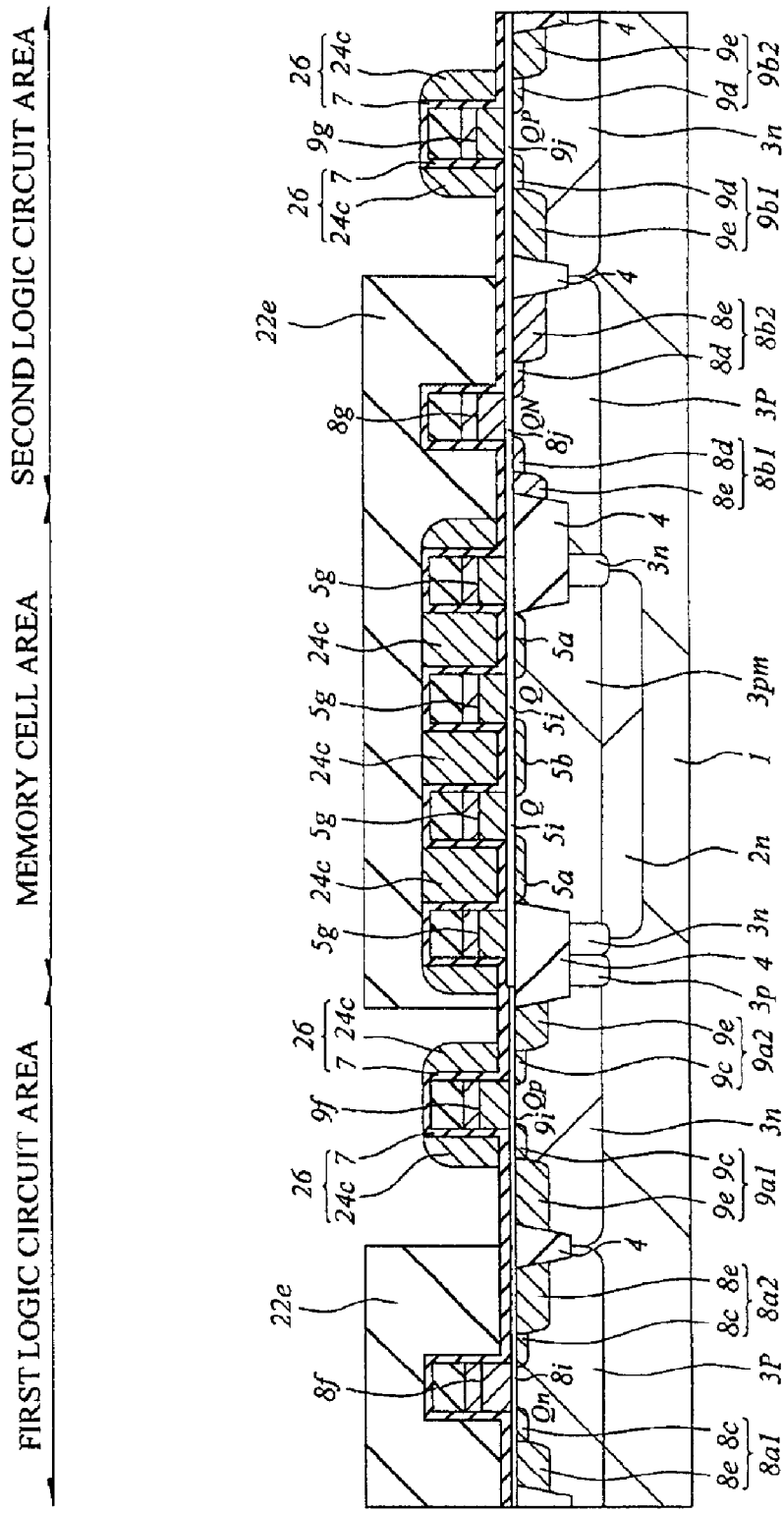
FIG. 19 is a cross-sectional view showing the principal part of the semiconductor integrated circuit device of FIG. 1 during the production process.

Next, a resist film 22e in which the p channel MISFET (Qp and QP) forming areas in the first and second logic circuit areas are exposed is formed over the semiconductor substrate 1. Thereafter, the resist film 22e, the gate electrodes 9f and 9g, and the laminated sidewall film 26 composed of both of the silicon oxide film 7 and the polycrystalline silicon film 24c are used as masks to introduce a p type impurity such as boron by ion implantation and thereby form a high-concentration semiconductor area 9e(FIG. 19).

Figure 20:
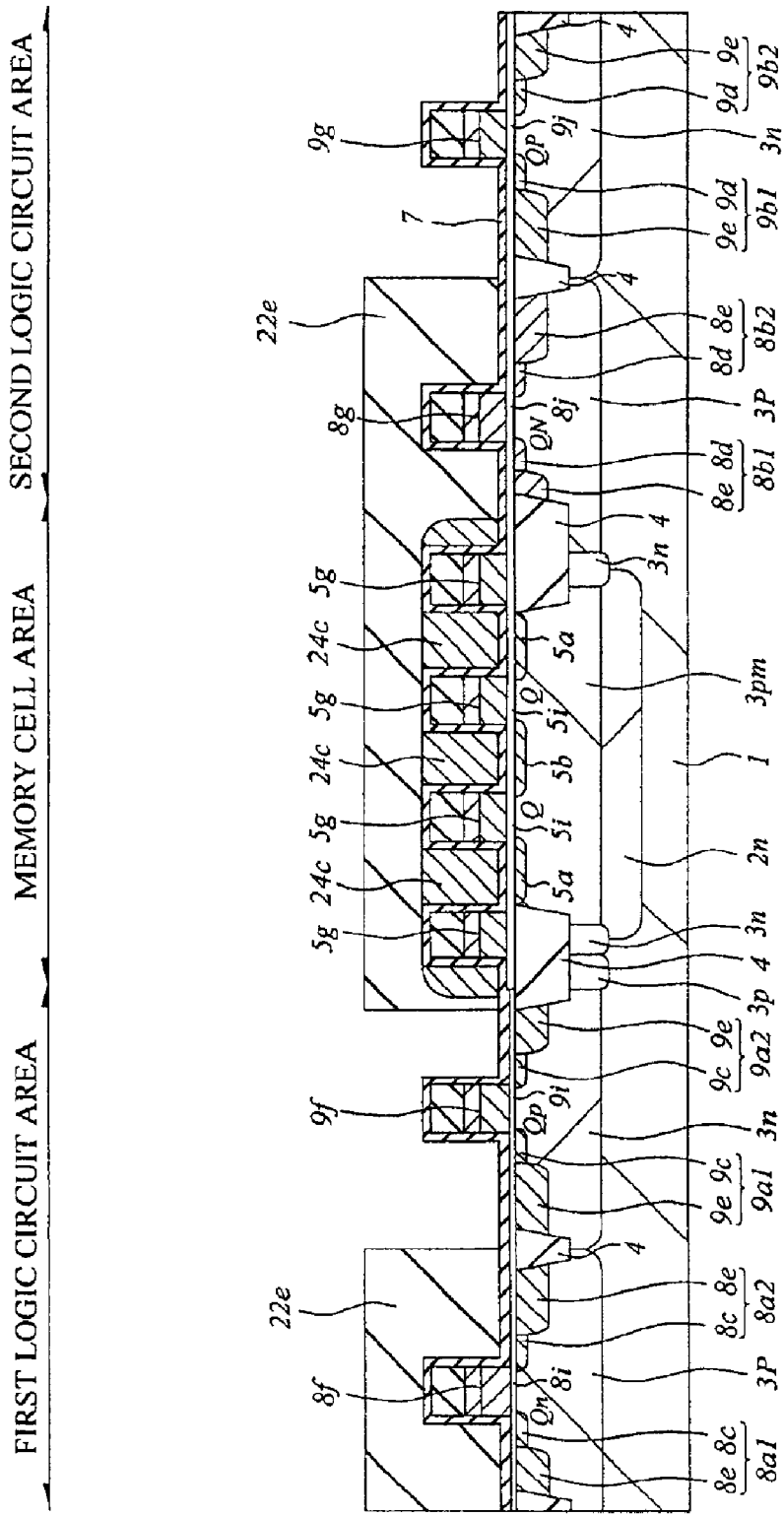
FIG. 20 is a cross-sectional view showing the principal part of the semiconductor integrated circuit device of FIG. 1 during the production process.

Next, as shown in FIG. 20, an isotropic dry etching treatment is performed relative to the polycrystalline silicon film 24c of the p channel MISFET forming areas in the first and second logic circuit areas, and thereby the polycrystalline silicon film 24c is removed. This etching employs such etching gas that an etching rate of the polycrystalline silicon film to the silicon oxide film becomes high.

In this embodiment, the silicon oxide film 7 is left on the semiconductor substrate 1 and on the sidewall or the like of each of the gate electrodes 9f and 9g. However, it is of course possible to remove the silicon oxide film 7 along with the polycrystalline silicon film 24c.

Figure 21:
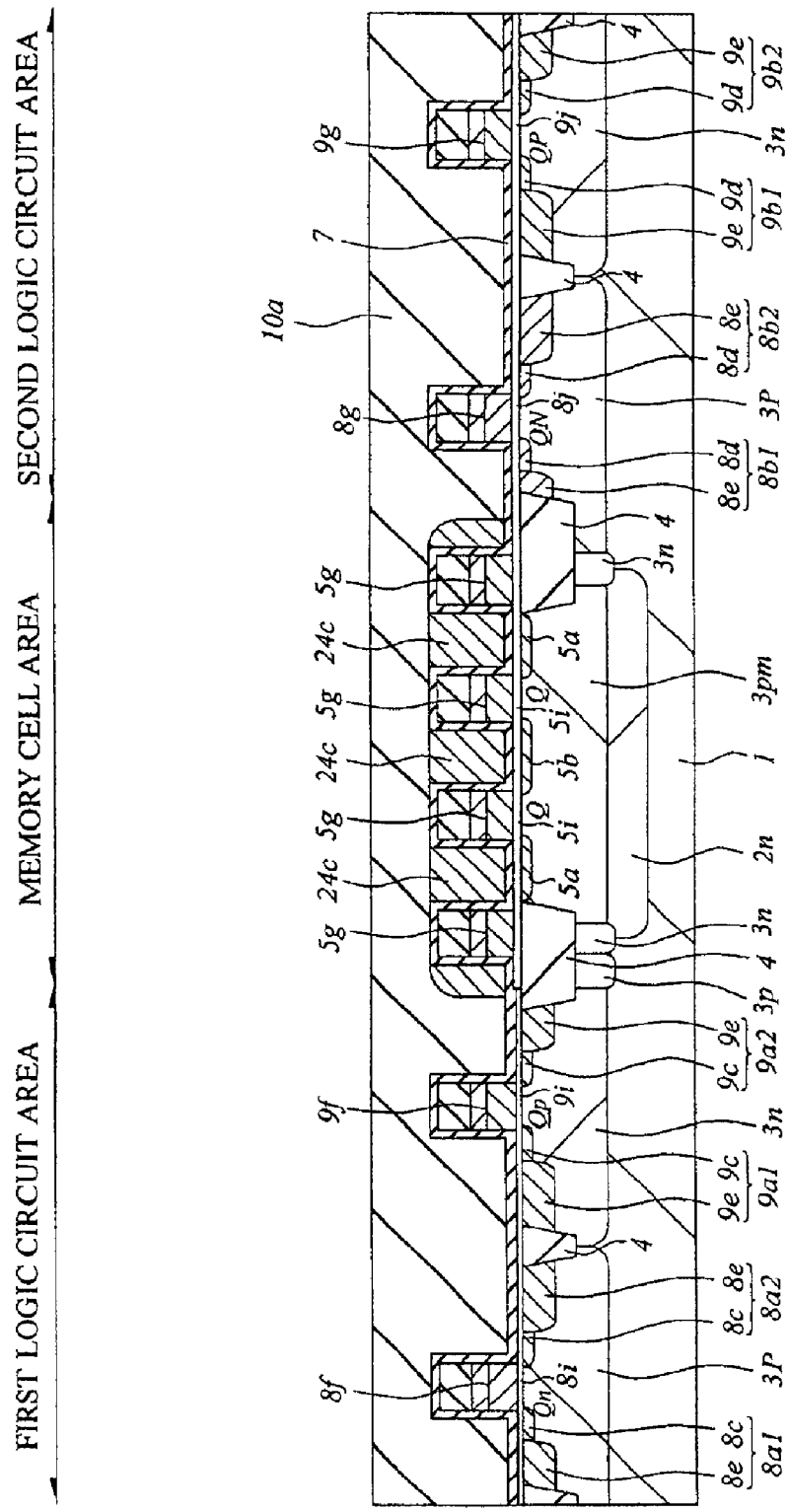
FIG. 21 is a cross-sectional view showing the principal part of the semiconductor integrated circuit device of FIG. 1 during the production process.
Figure 22:
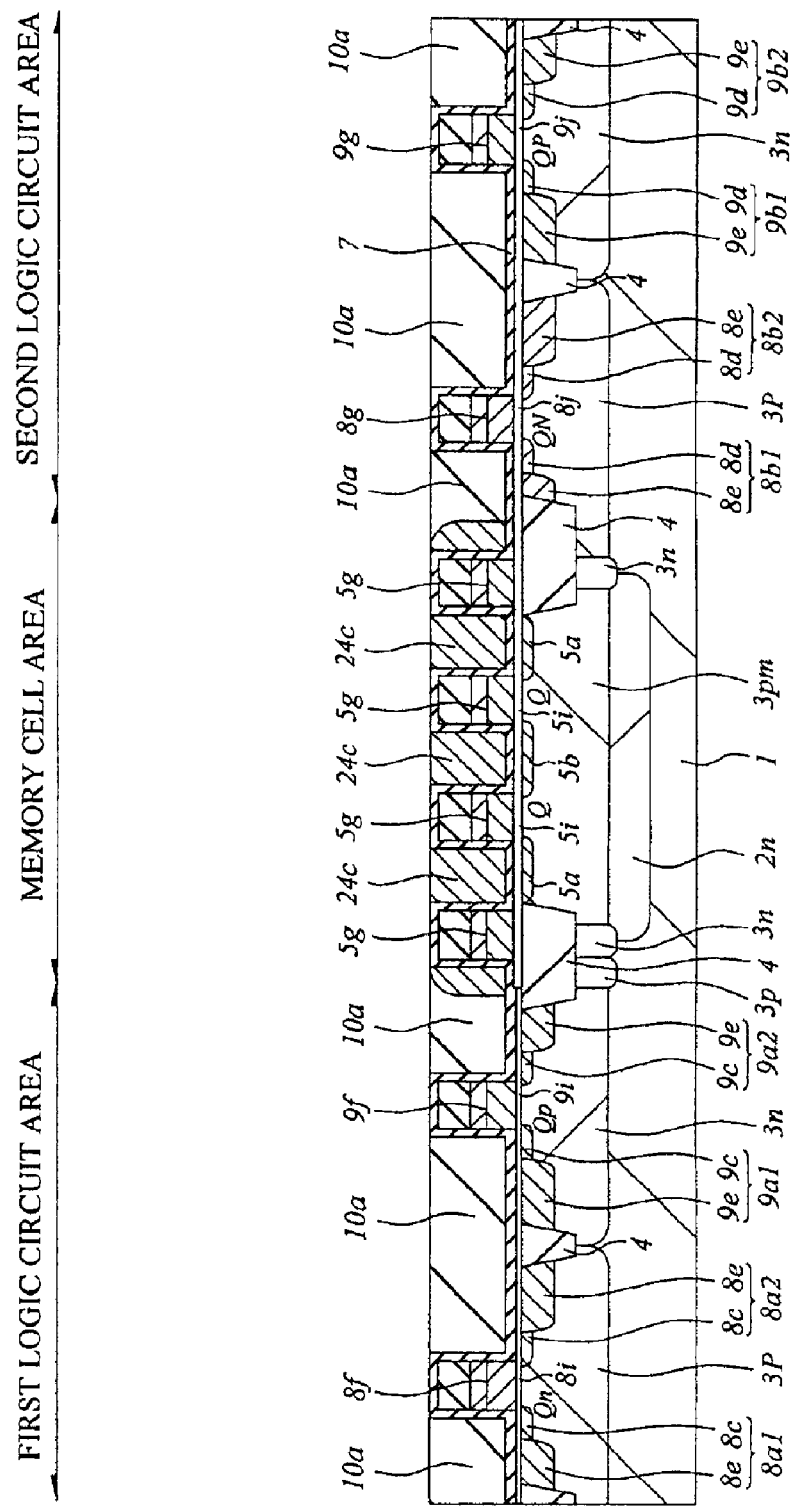
FIG. 22 is a cross-sectional view showing the principal part of the semiconductor integrated circuit device of FIG. 1 during the production process.

Next, as shown in FIG. 21, a silicon oxide film 10a is deposited to a thickness of about 0.7 μm over the semiconductor substrate 1, and the surface unevenness located in an upper portion thereof and caused by the gate electrodes is flattened by the known CMP method such that the height thereof in all of the memory cell area and the first and second logic circuit areas is almost the same. Furthermore, polishing is performed until the surface of the silicon oxide film 7 is exposed, and thereby the silicon oxide film 10a on each of the gate electrodes (silicon oxide film 7) is removed completely as shown in FIG. 22.

Figure 23:
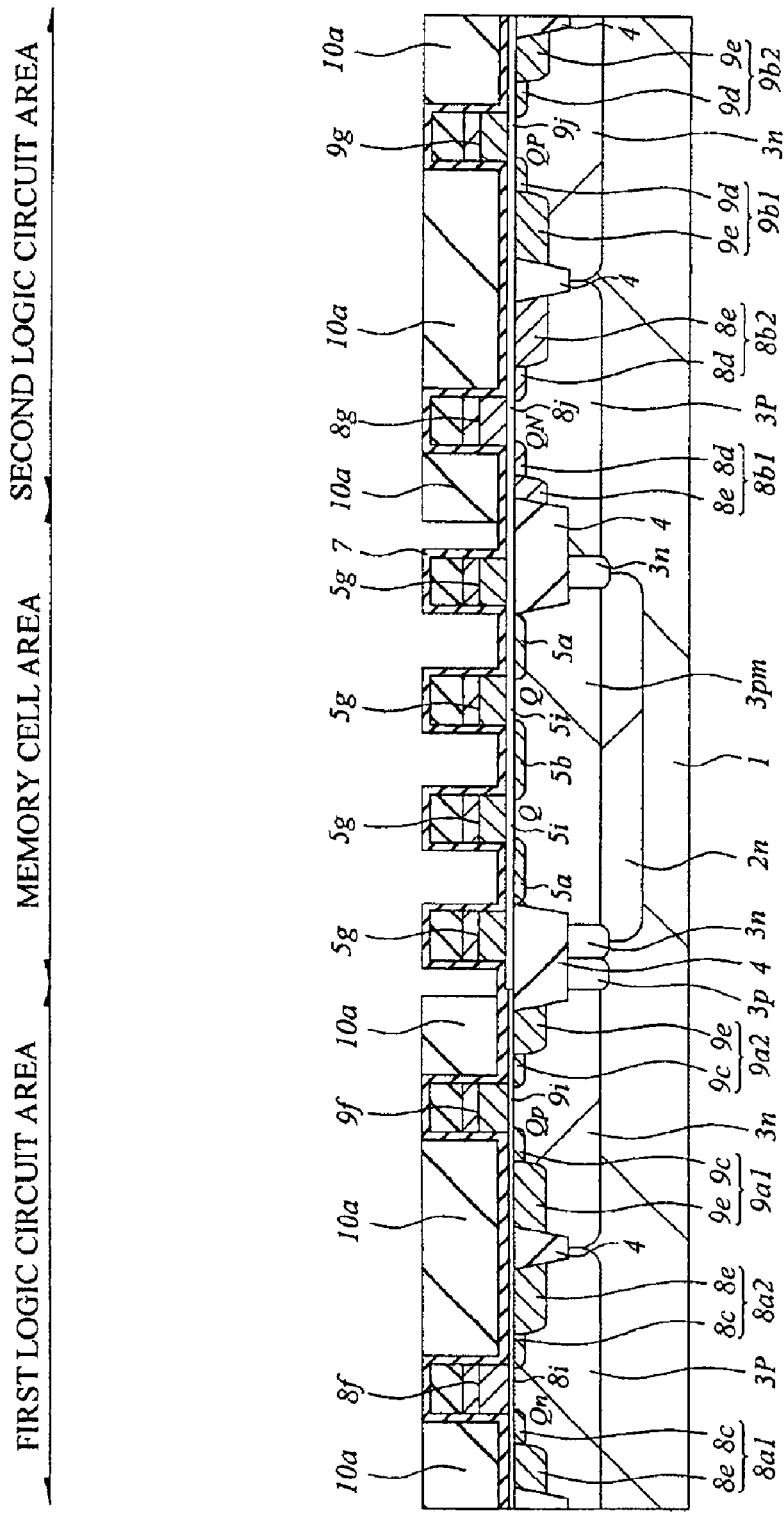
FIG. 23 is a cross-sectional view showing the principal part of the semiconductor integrated circuit device of FIG. 1 during the production process.

Next, by the isotropic dry etching, the polycrystalline silicon film 24c in the memory cell area is removed as shown in FIG. 23. At this time, in order to prevent the gate electrode from being exposed, the process of the polycrystalline silicon film is performed under the condition that the polycrystalline silicon film have a high etching selective ratio with respect to the silicon oxide film.

Figure 24:
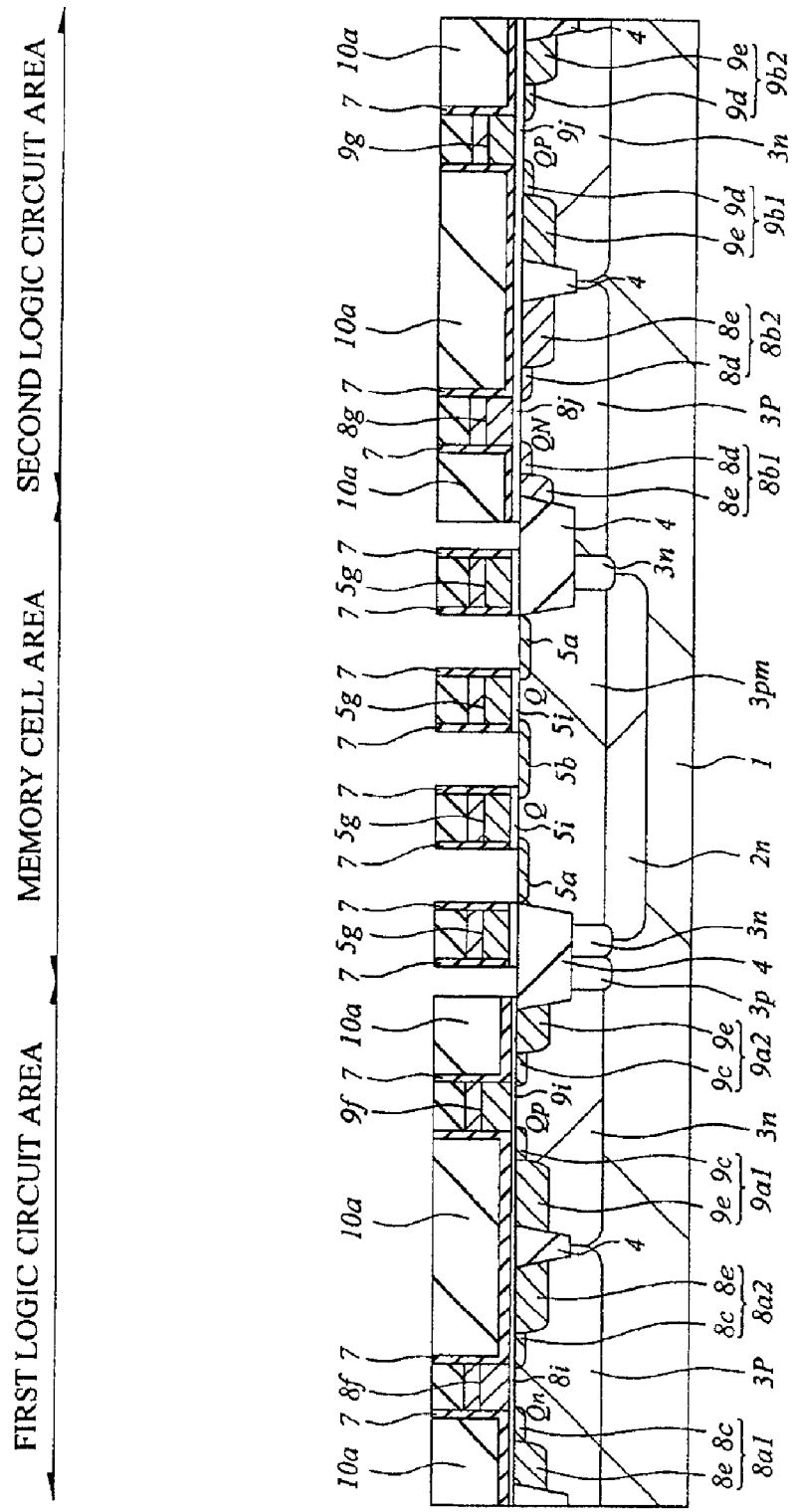
FIG. 24 is a cross-sectional view showing the principal part of the semiconductor integrated circuit device of FIG. 1 during the production process.

Subsequently, as shown in FIG. 24, the silicon oxide film 7 in the memory cell area is removed by the anisotropic dry etching. As a result, the silicon oxide film 7 on each of the cap insulating film 6 and the surface of the semiconductor substrate 1 is removed, and the silicon oxide film 7 is left only on each sidewall of the gate electrode 5g and the cap insulating film 6 in the memory cell area. The gate insulating film 5i on the semiconductor substrate 1 is also removed. At this time, in order to prevent the gate electrodes from being cut off, the process of the silicon oxide film is performed under the condition that the silicon oxide film has a high etching selective ratio with respect to the silicon.

Next, an n type impurity such as phosphorus is further ion-implanted into the semiconductor areas 5a and 5b exposed from the spaces between the gate electrodes 5g in the memory cell area (not shown). This is an impurity introduction step for decreasing the electric field.

Figure 25:
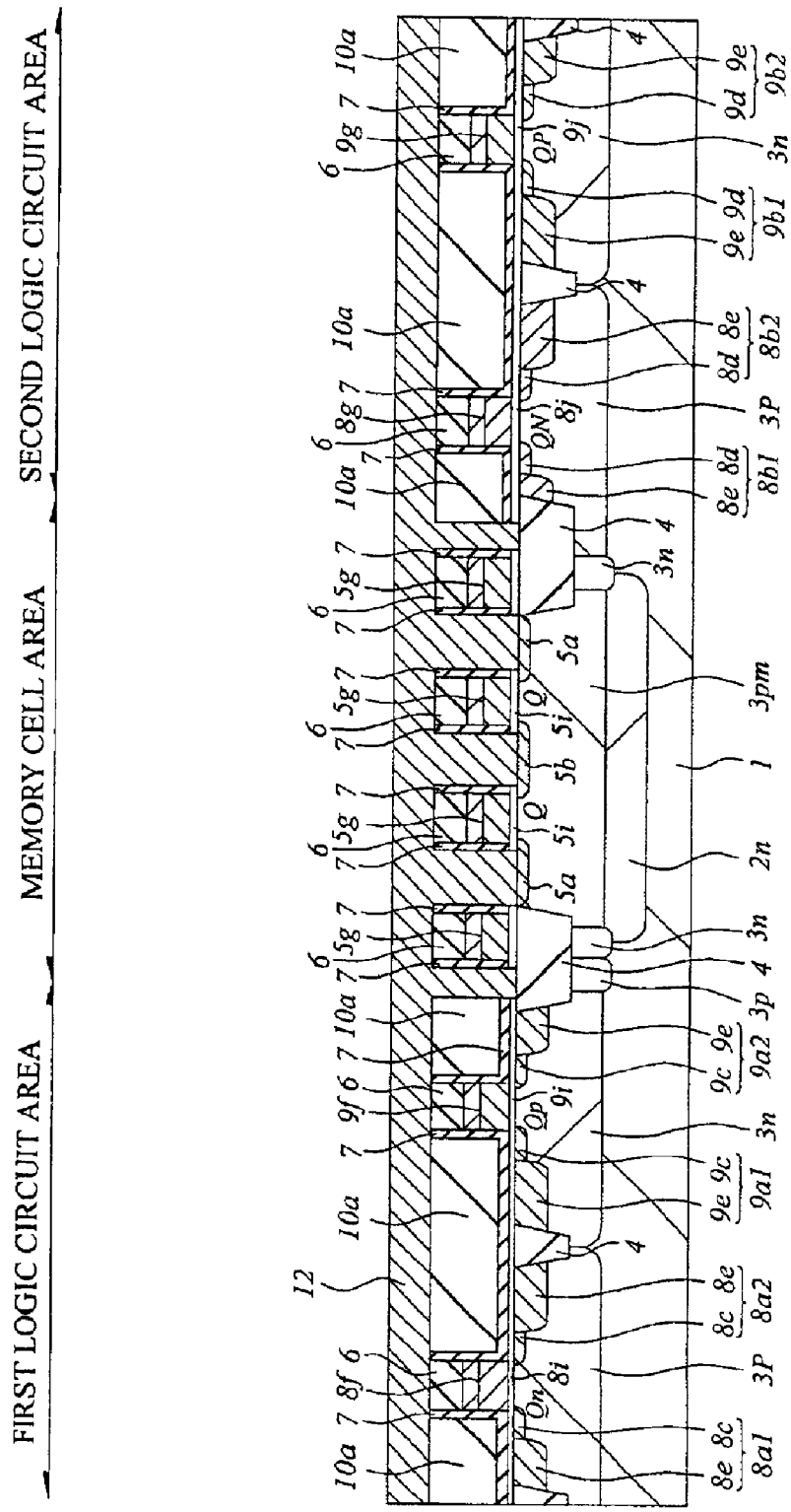
FIG. 25 is a cross-sectional view showing the principal part of the semiconductor integrated circuit device of FIG. 1 during the production process.

Subsequently, a polycrystalline silicon film 12 containing impurities with high concentration is coated on and over the semiconductor substrate 1 as shown in FIG. 25.

Next, the surface unevenness located in the surface of the polycrystalline silicon film 12 and caused by the gate electrodes is flattened by the known CMP method such that the height thereof in all of the memory cell area and the first and second logic circuit areas is almost the same. Furthermore, polishing is performed until the cap insulating film 6 is exposed, and thereby the polycrystalline silicon film 12 on the gate electrodes (cap insulating film 6) is removed completely. As a result, the polycrystalline silicon film 12 is left on each of the spaces between the gate electrodes 5g in the memory cell area.

Figure 51:
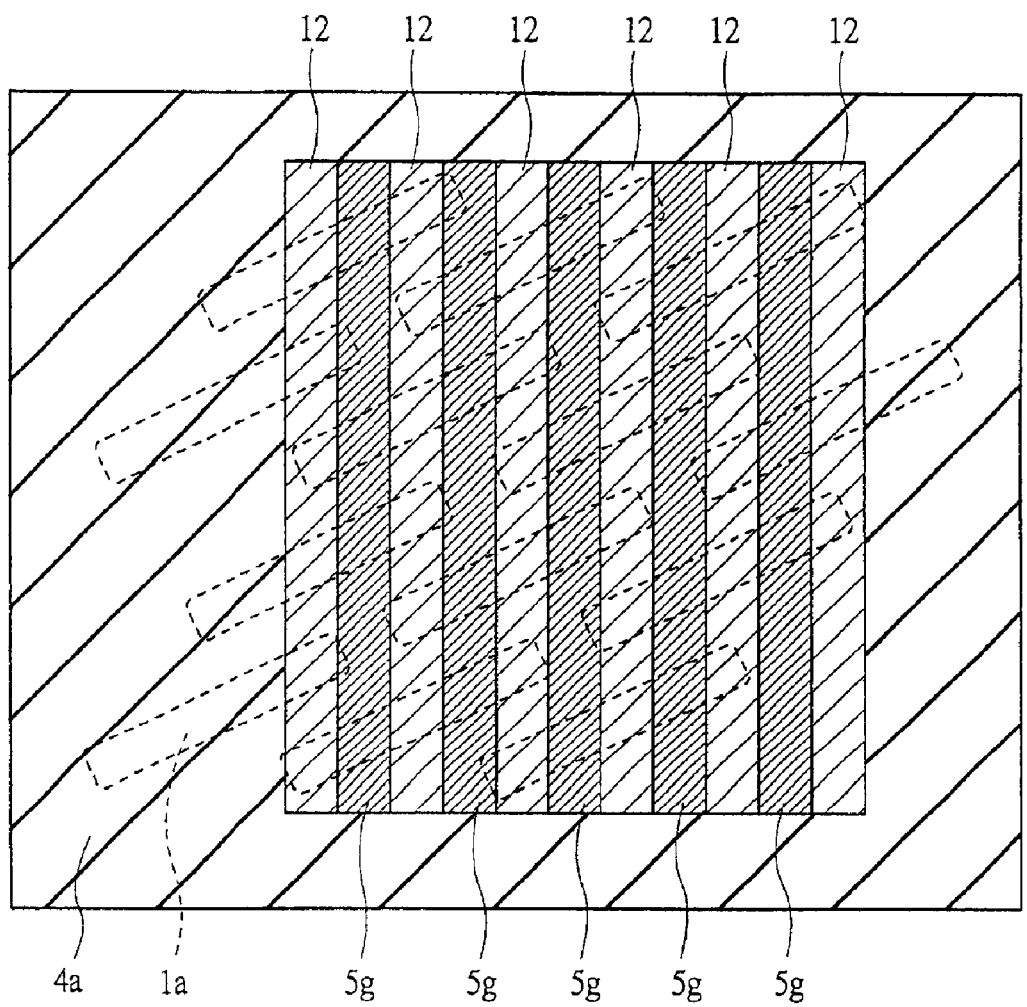
FIG. 51 is a plan view showing the principal part of the semiconductor integrated circuit device of FIG. 1 during the production process thereof.

FIG. 51 is a plan view showing the principal part of the semiconductor substrate 1 after the polycrystalline silicon film 12 in the memory cell area is formed. As shown in FIG. 51, the polycrystalline silicon film 12 is separately formed in each of the spaces between the gate electrodes 5g (word line).

Figure 26:
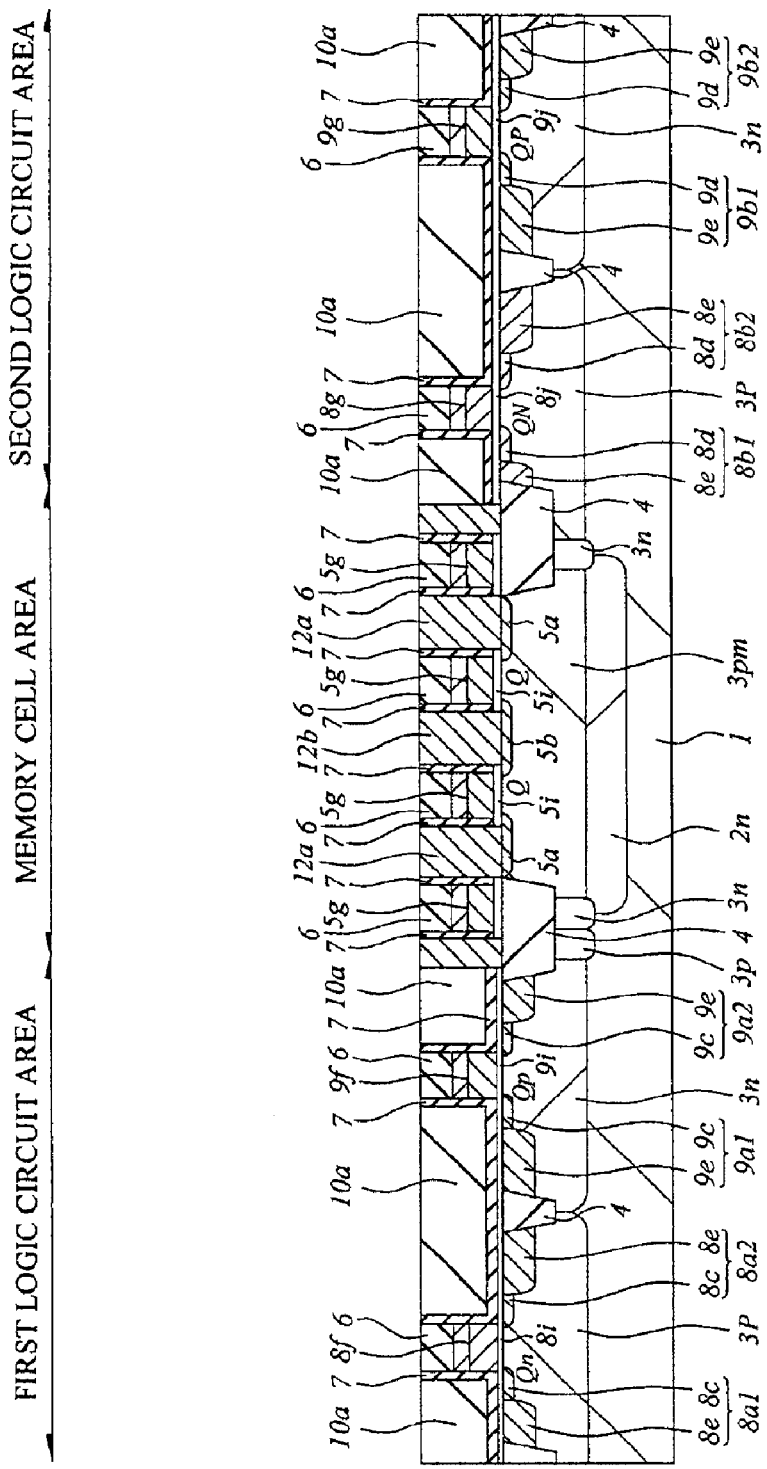
FIG. 26 is a cross-sectional view showing the principal part of the semiconductor integrated circuit device of FIG. 1 during the production process.
Figure 27:
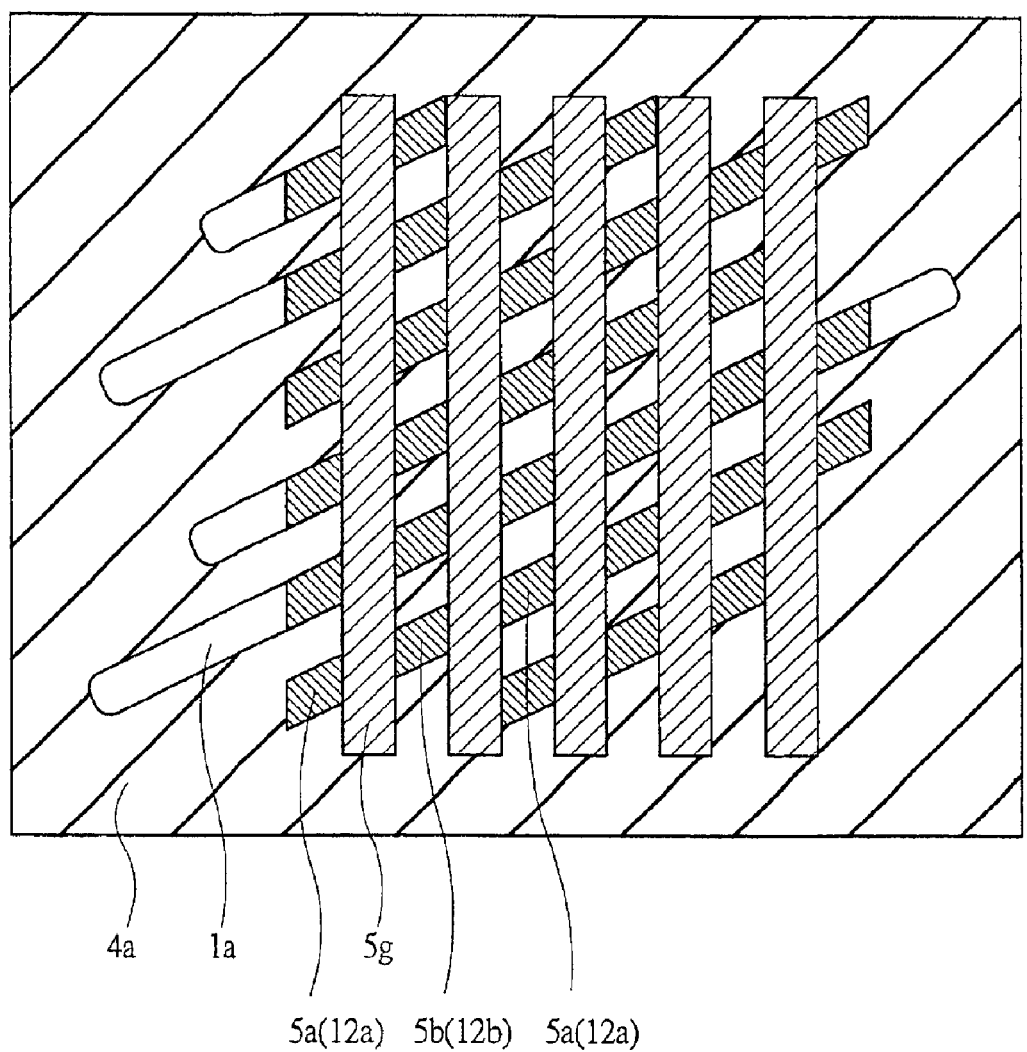
FIG. 27 is a plan view showing the principal part of the semiconductor integrated circuit device of FIG. 1 during the production process.
Figure 52:
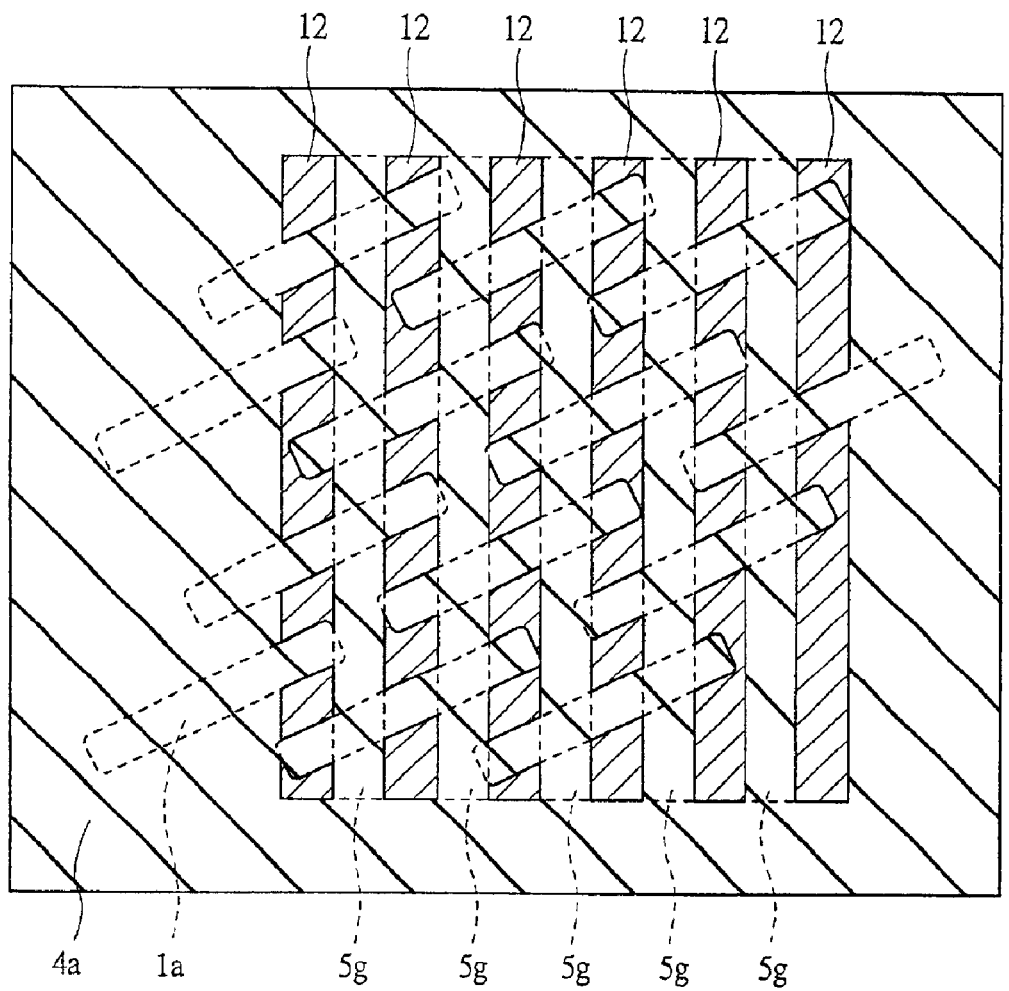
FIG. 52 is a plan view showing the principal part of the semiconductor integrated circuit device of FIG. 1 during the production process thereof.

Next, a photoresist FR (FIG. 52) is formed over the semiconductor substrate 1, the photoresist FR in which areas serving as the isolation area in the memory cell area and having polycrystalline silicon between the word lines (gate electrodes 5g) are exposed. Thereafter, the photoresist FR is used as a mask to remove the polycrystalline silicon film 12 located on each isolation area between the word lines. At this time, in order to prevent the silicon oxide film on each of the gate electrodes and the isolation area from being cut off, the process of the polycrystalline silicon film is performed under the condition that the polycrystalline silicon film has a high etching selective ratio with respect to the silicon oxide film. As a result, polycrystalline silicon films 12a and 12b are formed separately on the semiconductor areas 5a and 5b between the gate electrodes 5g (word line) (FIG. 26). The polycrystalline silicon films 12a and 12b function to connect the bit line BL or the capacitor C, and the source and drain (semiconductor areas 5a and 5b) of the memory cell selecting MISFET Q as described above. FIG. 27 is a plan view showing the principal part of the semiconductor substrate 1 in the memory cell area after the polycrystalline silicon films 12a and 12b are formed.

In this embodiment, from the viewpoint of easily forming the resist film, the photoresist is formed on and over the semiconductor substrate 1, the photoresist in which the areas serving as the isolation areas in the memory cell area and having the polycrystalline silicon film between the word lines are exposed, and thereafter the photoresist is used as a mask to remove the polycrystalline silicon film between the word lines. However, a photoresist in which the isolation area in the memory cell area is exposed can be of course formed on and over the semiconductor substrate 1, and thereafter used as a mask to remove the polycrystalline silicon film between the word lines.

Next, an interlayer insulating film 11a made of, for example, a silicon nitride film is deposited on the whole surface of the semiconductor substrate 1, and subsequently an interlayer insulating film 10b made of, for example, a silicon oxide film, is deposited on the interlayer insulating film 11a. The interlayer insulating film 11a functions as an etching stopper when the interlayer insulating film 10b is etched.

Alumina ($Al_2O_3$) or silicon carbide (SiC) may be also used as an etching stopper for the silicon oxide film.

Next, a resist film (not shown) is formed on the interlayer insulating film 10b, and is used as an etching mask to etch the interlayer insulating films 10b and 11a on the polycrystalline silicon film 12b and thereby form a connection hole 13c. The upper surface of the polycrystalline silicon film 12b is exposed on the bottom surface of the connection hole 13c.

Subsequently, after the resist film is removed, a resist film (not shown) is formed on the interlayer insulating film 10b, and is used as an etching mask to etch the interlayer insulating films 10a, 10b and 11a and the like on the semiconductor areas 8a2, 8b2, 9a1 and 9b1 and thereby form connection holes 15c. The semiconductor areas 8a2, 8b2, 9a1 and 9b1 are exposed on the bottom surfaces of the connection holes 15c, respectively.

Subsequently, after a removal of the resist film, for example, a titanium film and a titanium nitride film are sequentially deposited from below on the interlayer insulating film 10b and in the connection holes 13c and 15c by the sputtering method or the like, and thereby a barrier metal film 27 made of these films is formed. A tungsten film 25 is, for example, stacked up thereon by the CVD method or the like, and thereby the connection holes 15c are filled. Next, each upper portion of these films is polished by the known CMP method until the upper portion of the interlayer insulating film 10b is exposed and respective tungsten films 26 and the like in the connection holes 13c and 15c have the same height. As a result, a contact electrode 13 composed of the barrier metal film 27 and the tungsten film 25 is formed on the polycrystalline silicon film 12b, and also contact electrodes 15 composed of the barrier metal film 27 and the tungsten film 25 are formed on the semiconductor areas 8a2, 8b2, 9a1 and 9b1.

Next, an interlayer insulating film 11b made of, for example, silicon nitride is formed on the whole surface of the semiconductor substrate 1, and further an interlayer insulating film 10c made of, for example, silicon oxide is deposited thereon. The above-mentioned interlayer insulating film 11b functions as an etching back stopper when the interlayer insulating film 10c is etched.

Then, a resist film (not shown) having openings on the contact electrodes 13 and 15 is formed on the interlayer insulating film 10c, and is used as an etching mask to etch the interlayer insulating films 10c and 11b and thereby form a bit line trench and a first-layer wiring trench.

Next, an insulating film such as a silicon oxide film is deposited to a thickness of about 200 nm on the interlayer insulating film 10c and in the bit line trench and the first-layer wiring trench. By the anisotropic etching, sidewalls (not shown) are formed on the inner side surfaces of the bit line trench and the first-layer wiring trench. Thus, since the sidewall is formed in the bit line trench, it is possible to make the bit line BL thin and prevent the later-described short circuit between the contact electrode 12c and the bit line BL.

Figure 28:
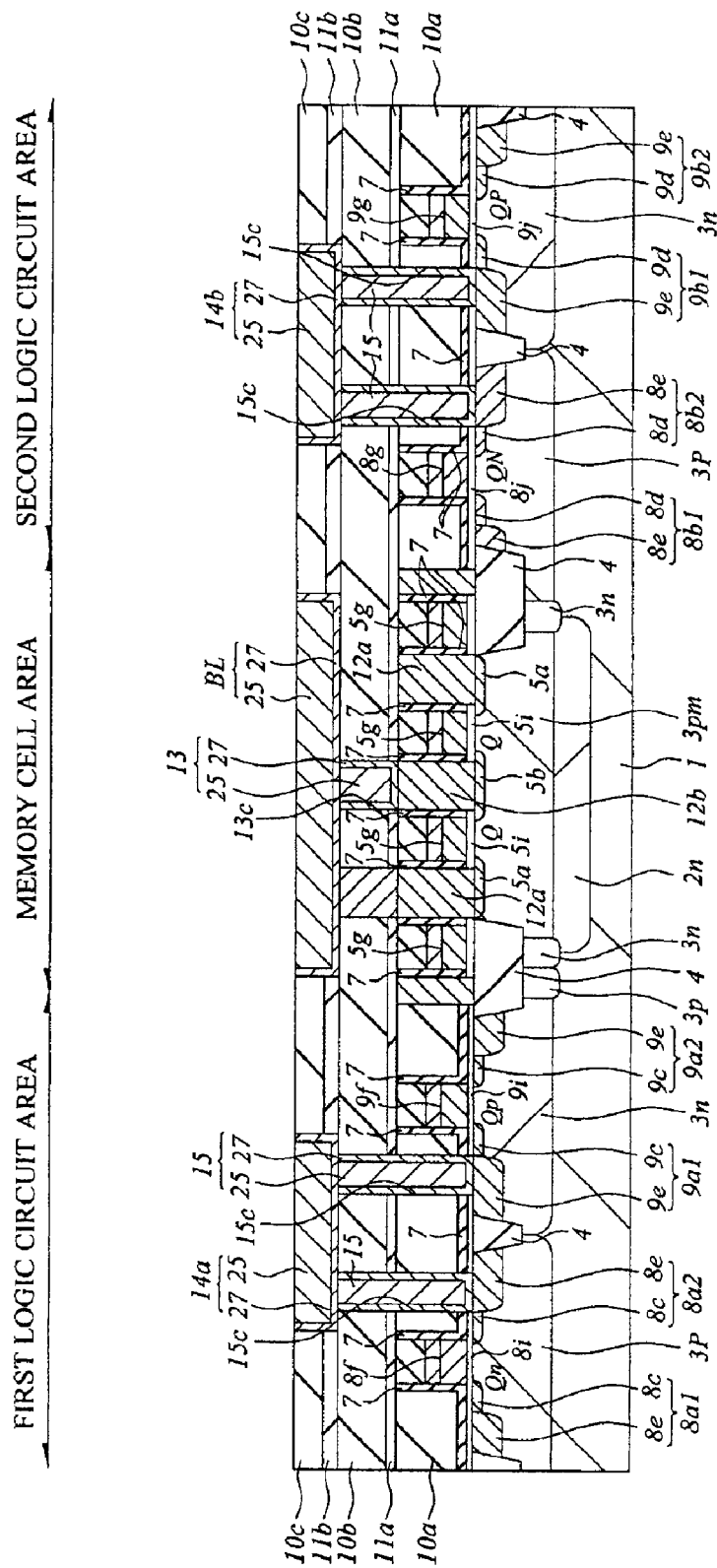
FIG. 28 is a cross-sectional view showing the principal part of the semiconductor integrated circuit device of FIG. 1 during the production process.

Next, a titanium film and a titanium nitride film are sequentially deposited from below on the interlayer insulating film 10c and in the bit line trench and the first-layer wiring trench by the sputtering method or the like, and thereby a barrier metal film 27 composed of these films is formed. Further, a tungsten film 25 is, for example, stacked up thereon by the CVD method or the like. Subsequently, these films are etched-back until the upper surface of the interlayer insulating film 10c is exposed and the upper surfaces of the tungsten and the like have each the same height, and thereby the bit line BL and the first-layer wirings 14a and 14b are formed (FIG. 28).

Subsequently, a silicon nitride oxide film or an aluminum 11c is deposited to a thickness of about 0.7 μm over the semiconductor substrate 1. Subsequently, a polycrystalline silicon film (not shown) is deposited thereon. Then, the polycrystalline silicon film located on the polycrystalline silicon film 12a is removed by the etching, and thereby a polycrystalline silicon hard mask (not shown) is formed.

Subsequently, a polycrystalline silicon film is further deposited on the polycrystalline silicon hard mask, and a polycrystalline sidewall (not shown) is formed on the sidewall of the polycrystalline silicon hard mask by the back etching. Thus, the use of the sidewall (not shown) makes it possible to make the connection holes fine, and prevent short circuit between the bit line BL and the later-described contact electrode 12c.

Next, the polycrystalline silicon hard mask and the sidewall (not shown) is used to remove the interlayer insulating films 11a, 10b, 11b, 10c and 11c on each contact electrode 12a, and thereby form a connection hole.

Subsequently, a polycrystalline silicon film 12c containing impurities with a high concentration is deposited over the semiconductor substrate 1, and the etch back of the polycrystalline silicon film 12c is performed under the condition that the polycrystalline silicon film 12c has a high etching selective ratio with respect to the interlayer insulating film 11c, and thereby the upper portion of the interlayer insulating film 11c is exposed. After the complete isolation of the polycrystalline silicon film 12c buried in the above-mentioned connection hole, the etch back of the surface of the polycrystalline silicon film 12c is performed to a depth of about 0.1 μm.

Figure 29:
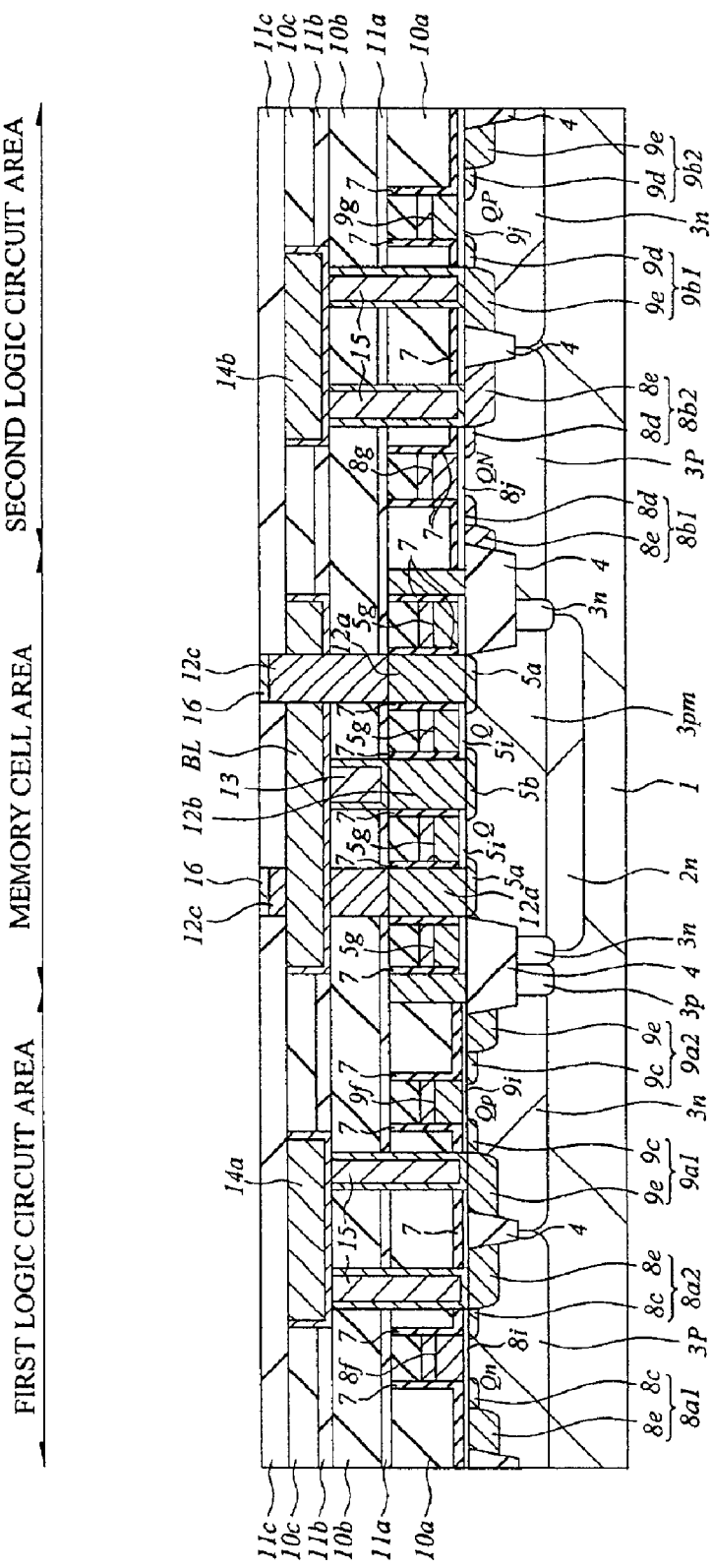
FIG. 29 is a cross-sectional view showing the principal part of the semiconductor integrated circuit device of FIG. 1 during the production process.

Next, an oxidation barrier film 16 made of, for example, tantalum nitride is deposited over the semiconductor substrate 1, and the etch back of the oxidation barrier film 16 is performed by the known CMP method until the upper portion of the interlayer insulating film 11c is exposed, and thereby an oxidation barrier film 16 is formed on the polycrystalline silicon film 12c (FIG. 29). Note that FIG. 29 shows the bit line BL extending between two polycrystalline silicon films 12c. Also, although a tantalum nitride film is used as the oxidation barrier film 16 in this embodiment, a titanium nitride film may be used.

In this embodiment, since ruthenium is used as an electrode of the capacitor C as described later, the oxidation barrier film 16 is formed thereon to prevent the oxidation of polycrystalline silicon film 12c. However, only polycrystalline silicon can be, of course, used to form a contact in the case of using polycrystalline silicon or the like as an electrode of the capacitor C.

Next, to form a three-dimensional capacitor electrode, a silicon oxide film 10d used as an interlayer insulating film is deposited to a thickness of about 1.4 μm, and a tungsten hard mask (not shown) is formed thereon. Thereafter, the silicon oxide film 10d is dry-etched, and thereby a deep trench is formed in the oxidation barrier film 16.

Next, a ruthenium film to be a storage electrode 17a of the capacitor C is deposited to, for example, a thickness of about 30 nm on the silicon oxide film 10d and in the deep trench. The use of the metal such as ruthenium or the like as a material of the lower electrode of the capacitor makes it possible to decrease the annealing temperature for forming the capacitor to 600° C. or lower. As a result, the penetration of boron that is an impurity in the gate electrode can be reduced.

As a material of the storage electrode 17a of the capacitor, polycrystalline silicon, tungsten, titanium nitride, platinum or the like are also used in addition to ruthenium. Particularly, platinum is preferable as a material of the storage electrode when a high permittivity film such as BST (strontium barium titanate) and PZT (lead zirconate titanate) or a ferro-electric film is used film.

Subsequently, the etch back of the ruthenium film on the silicon oxide film 10d is performed by the CMP method, and thereby the storage electrodes 17a is left only in the deep trenches to form the storage electrode 17a separately in each memory cell.

Next, a capacitor insulating film 17b made of, for example, tantalum oxide is formed on the surface of the storage electrode 17a, and further a plate electrode 17c made of, for example, ruthenium is formed thereon so as to cover the capacitor insulating film 17b.

Note that the material of the capacitor insulating film is not limited to tantalum oxide. The conventional laminated film of a silicon oxide film and a silicon nitride film may be used, or a high permittivity film or a ferroelectric film may be used when platinum as a material of the storage electrode is used.

Figure 30:
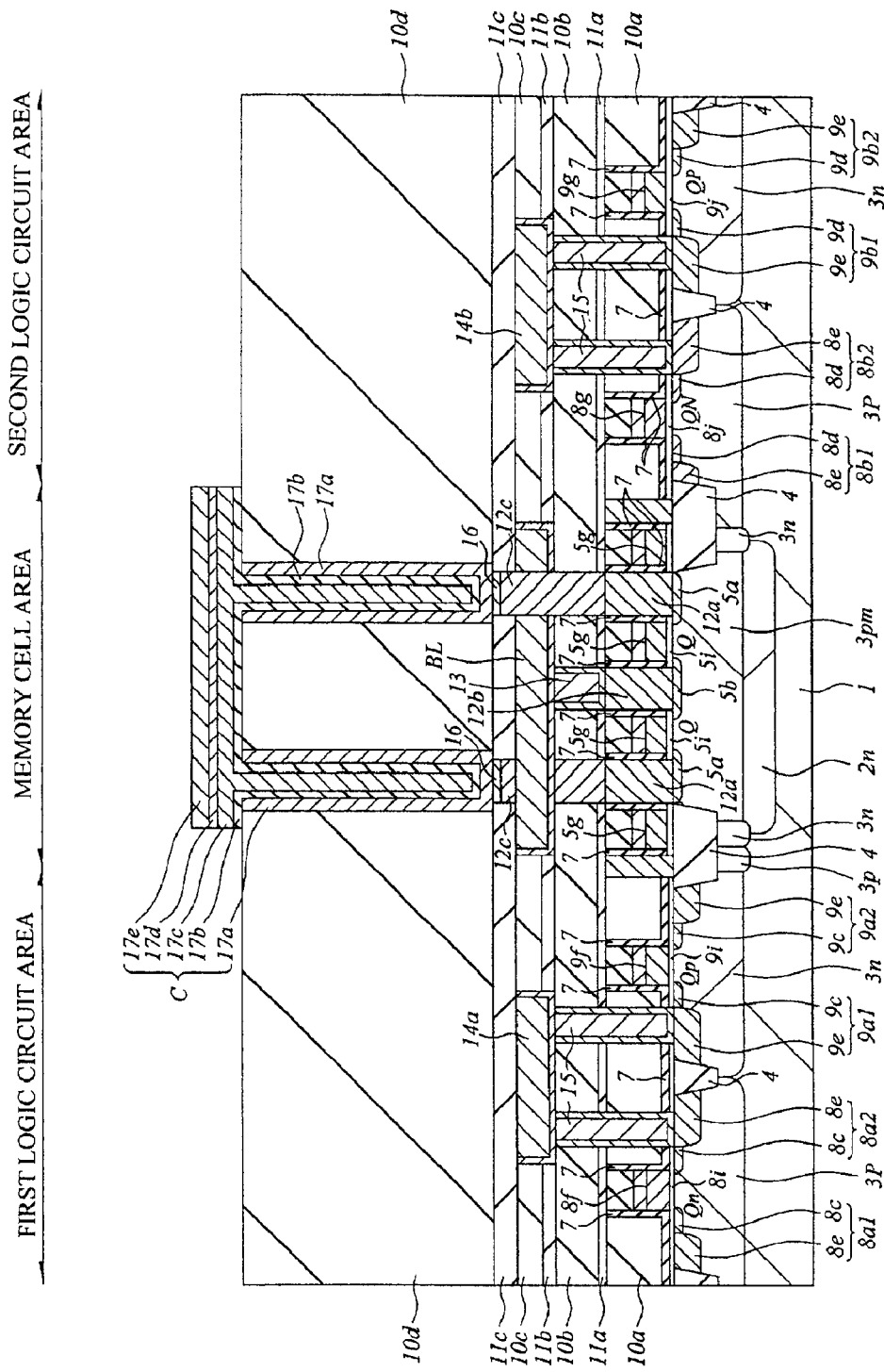
FIG. 30 is a cross-sectional view showing the principal part of the semiconductor integrated circuit device of FIG. 1 during the production process.

Subsequently, a titanium nitride film 17d and a tungsten film 17e are deposited on the plate electrode 17c, and the pattering thereof is performed with using a tungsten hard mask (not shown) to form plate electrode wirings (17c, 17d and 17e) (FIG. 30).

Next, an interlayer insulating film 10e is deposited so as to cover the plate electrode wirings (17c, 17d and 17e). Subsequently, the dry etching is performed with using a tungsten hard mask (not shown), and thereby connection holes 19c are formed on the tungsten film 17e in the memory cell area and on the first-layer wirings 14a and 14b in the first and second logic circuit areas.

Subsequently, a titanium film and a titanium nitride film are deposited from below by the sputtering method or the like, and a barrier metal film 27 composed of these films is formed. Then, a tungsten film 25 is stacked up thereon by the CVD method or the like to fill the connection hole 19c. Next, the etch back of each of these films is performed by the known CMP method to form contact electrodes 19.

Figure 31:
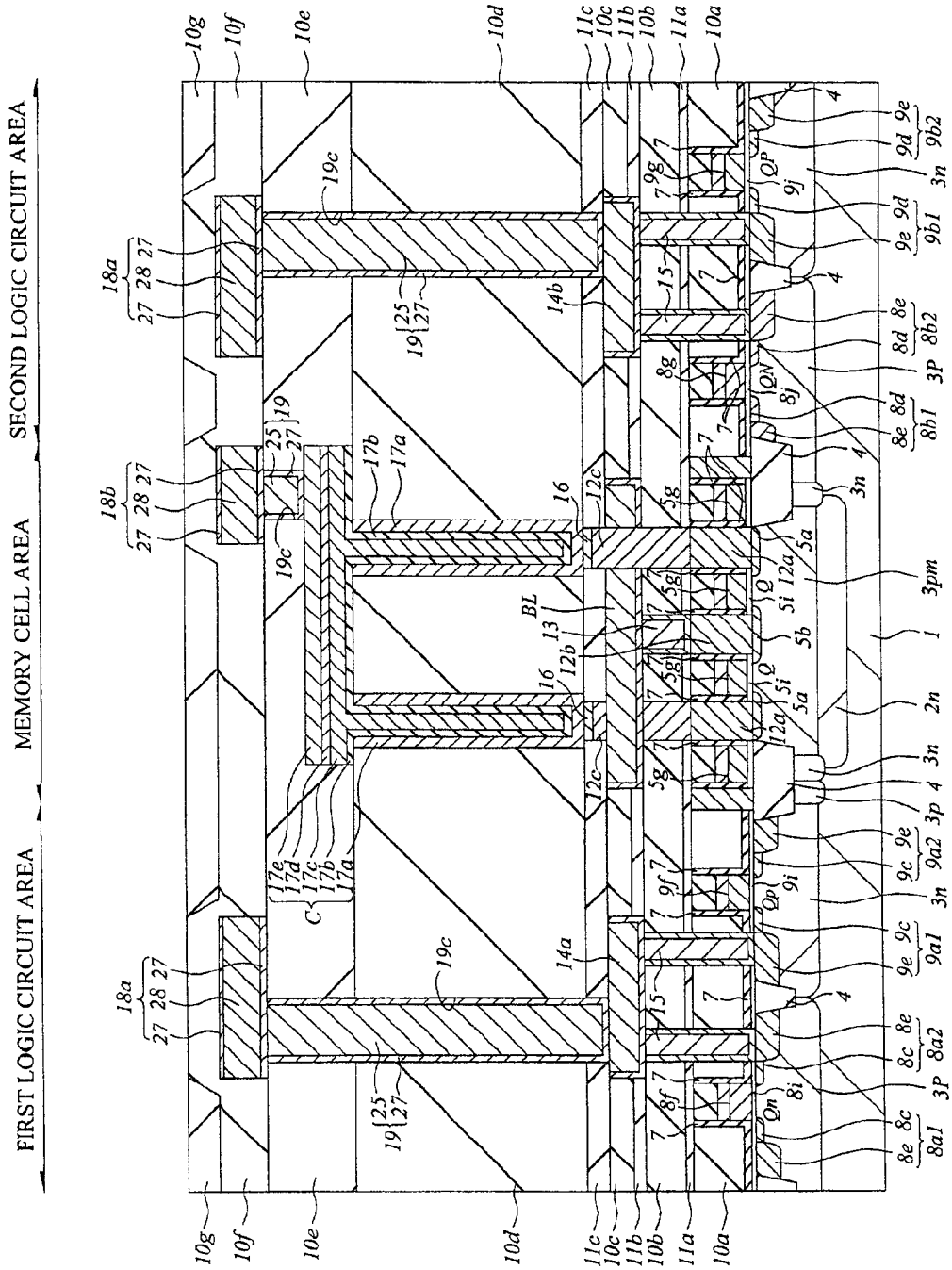
FIG. 31 is a cross-sectional view showing the principal part of the semiconductor integrated circuit device of FIG. 1 during the production process.

Next, a barrier metal film 27, an aluminum film 28, and a barrier metal film 27 are sequentially deposited and then patterned, thereby forming second-layer wirings 18a and 18b on the contact electrodes 19 (FIG. 31). Of course, it is also possible to use metal having a lower resistance, such as copper or the like, instead of aluminum.

Subsequently, a silicon oxide film 10f is deposited by a high-density CVD method, and then a CVD silicon oxide film 10g having a good embedded characteristic is deposited. Thereafter, the upper portion thereof is flattened by the known CMP method.

Next, an interlayer insulating film 10h is deposited, and then the interlayer insulating films 10f, 10g and 10h are etched to form connection holes 21.

Next, for example, a titanium film and a titanium nitride film are sequentially deposited from below by the sputtering method or the like, and a barrier metal film 27 composed of these films is formed. Then, for example, a tungsten film 25 is stacked up thereon by the CVD method or the like to fill the connection holes 21c. Subsequently, the etching back is performed by the known CMP method, and thereby contact electrodes 21 are formed.

Figure 32:
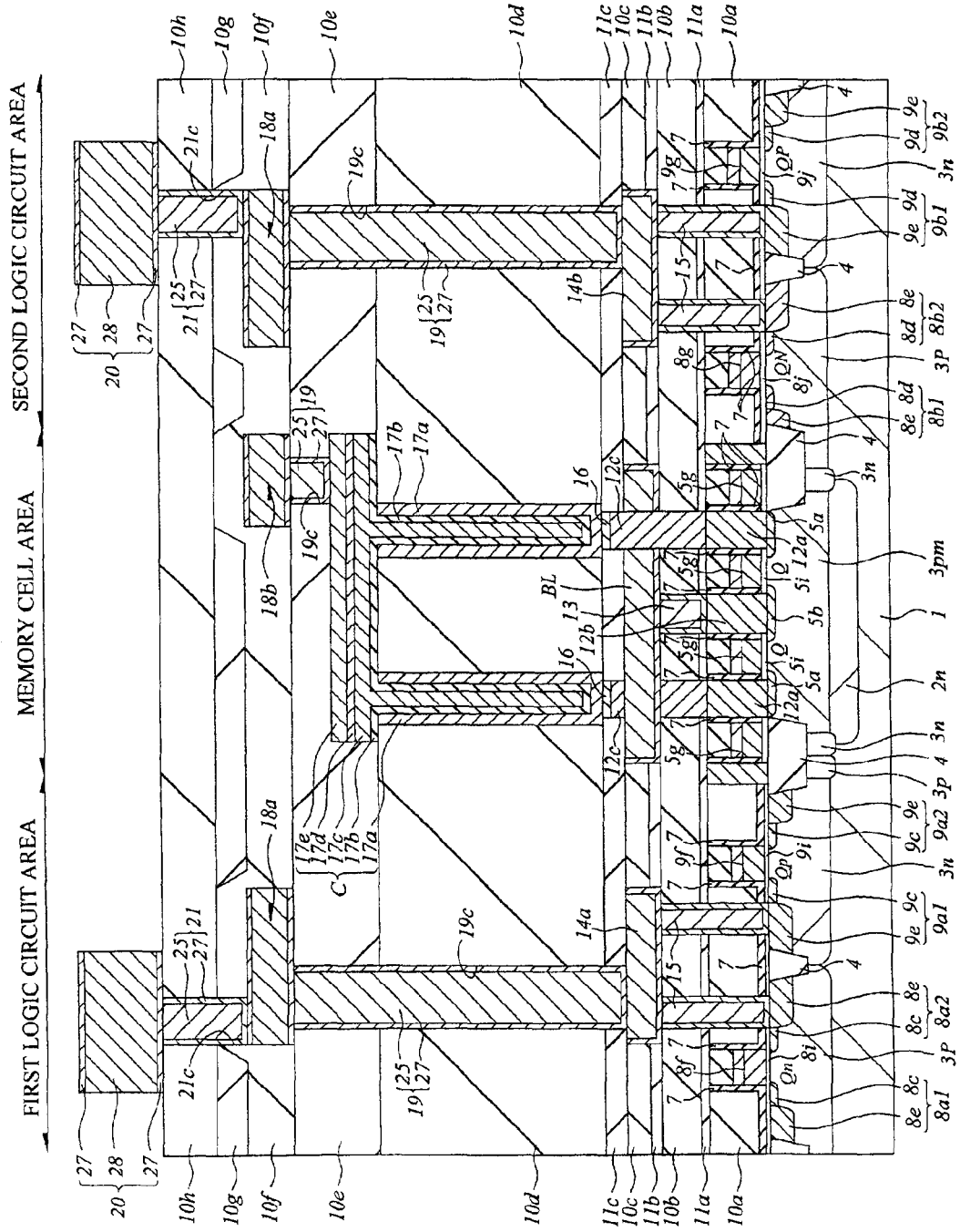
FIG. 32 is a cross-sectional view showing the principal part of the semiconductor integrated circuit device of FIG. 1 during the production process.

Subsequently, a barrier metal film 27, an aluminum film 28, and a barrier metal film 27 are sequentially deposited and etched, and thereby uppermost-layer wirings 20 are formed (FIG. 32).

Note that a passivation film composed of two insulating films and the like made by, for example, laminating a silicon oxide film and a silicon nitride film is formed on third-layer (uppermost layer) wirings 20. However, the illustrations thereof will be omitted.

According to this embodiment described above, since a silicon oxide film is used for both of the cap insulating film 6 on the gate electrodes and the sidewall film 7 on each sidewall of the gate electrodes, it is possible to reduce the stored amount of hydrogen and ammonia and the like promoting the boron penetration in comparison to the case of using a silicon nitride film and also reduce an emission amount of these. Therefore, the penetration of boron, which is an impurity in the gate electrodes, into the substrate is suppressed, and thus the variance of the threshold voltage and the degradation of the gate blocking voltage can be reduced. In addition, with using the cap insulating film 6 and the sidewall film 7, since the etch back of the n type polycrystalline silicon film deposited on the surface of the substrate is performed by the CMP method and the n type polycrystalline silicon film is separated, the contact electrodes 12a and 12b connected to the bit line BL and the capacitor C can be formed in a self-alignment manner. Also, it is unnecessary to form a connection hole used to form a contact electrode.

Further, since a p type polycrystalline silicon gate electrode having a high work function is used for the memory cell selecting n channel MISFET Q, it is unnecessary to introduce the impurities for adjustment of the threshold voltage and thus reduce the substrate concentration. Therefore, since the electric field near the junction of the connection of the semiconductor areas to be connected to the capacitor is decreased and the leakage currents of the storage node and the semiconductor substrate is reduced, it is possible to improve the refresh characteristic thereof.

In addition, since the ion implantation of boron is employed, the p type polycrystalline silicon gate electrode having a desirable impurity concentration can be formed.

Further, when the p type polycrystalline silicon gate electrode is used in each p channel MISFET of the first and second logic circuit areas, the channel thereof is a surface type. Therefore, the downsizing of the p channel MISFET is facilitated and the performance of the p channel MISFET can be improved.

Also, since a laminated film of the silicon oxide film 7 and the polycrystalline silicon film 24c is used for the sidewall film 26 on the sidewall of the gate electrode in the logic circuit area, it is possible to form the sidewall film 26 thicker in thickness than the sidewall film on the sidewall of the gate electrode in the memory cell area and thus form the source and drain of the LDD structure with high accuracy. As a result, it is possible to achieve the downsizing of the MISFET constituting the logic circuit and the improvement of the reliability thereof.

(Second Embodiment)

This embodiment relates to a production process for the source and drain (semiconductor area) in the logic circuit area. In the first embodiment, to simplify the process, the high concentration semiconductor area is formed after the (low concentration) semiconductor area is formed in the first and second logic circuit areas.

In contrast, in this second embodiment, the low concentration semiconductor area is formed after the high concentration semiconductor area is formed in the logic circuit area.

Since the production method until the process of dry-etching the gate electrode in this embodiment is the same as that in the first embodiment described with reference to FIGS. 2 to 12, the descriptions thereof will be omitted.

Figure 33:
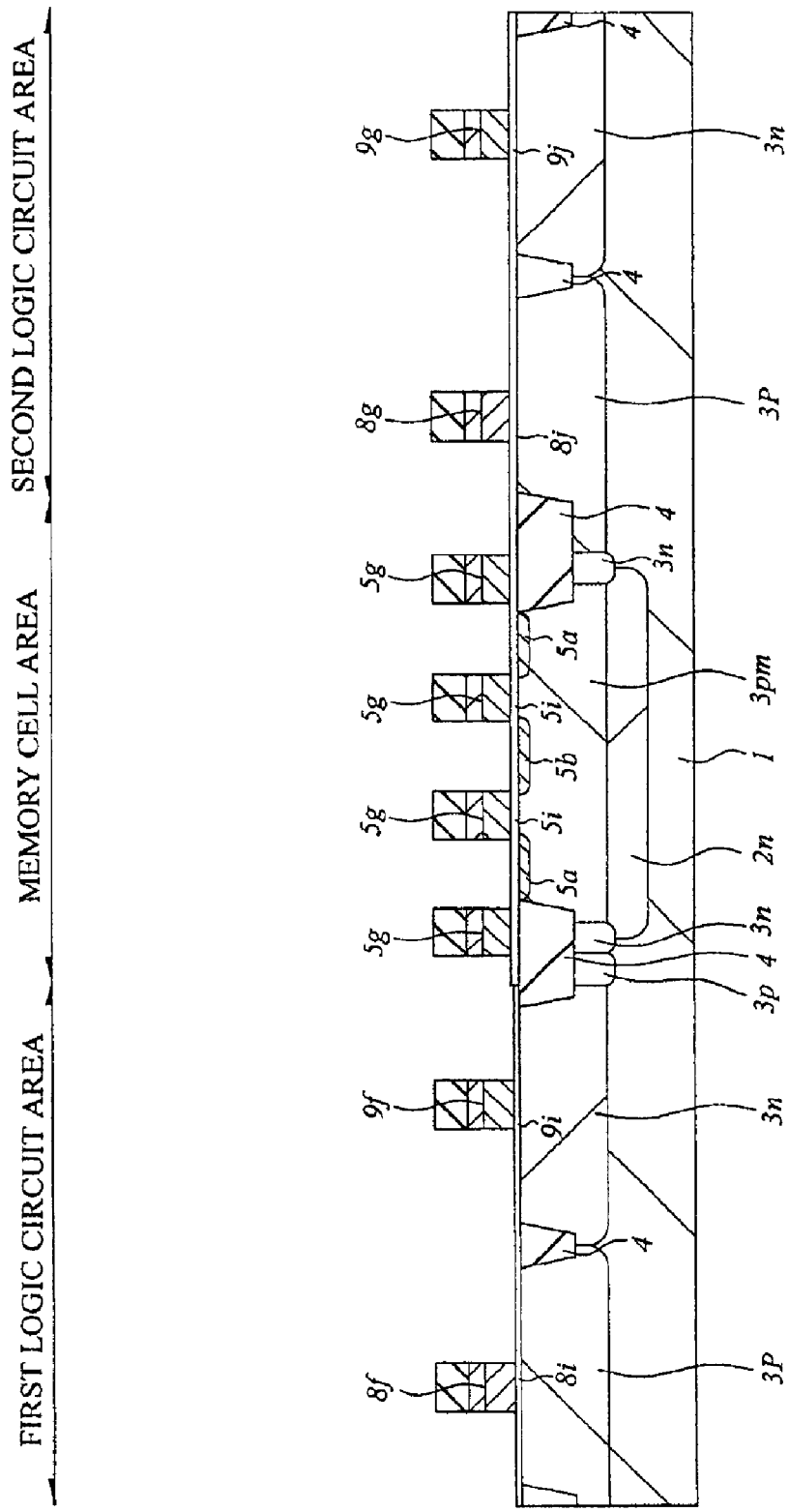
FIG. 33 is a cross-sectional view showing the principal part of a semiconductor integrated circuit device according to a second embodiment during the production process thereof.

First, the semiconductor substrate 1 shown in FIG. 12 described in the first embodiment is prepared, and impurities are implanted with using the gate electrode and a resist film (not shown) as masks, and thereby the semiconductor areas 5a and 5b are formed in the memory cell area (FIG. 33). More specifically, phosphorus is ion-implanted into the memory cell area (p well 3pm) to an implantation amount of 1 to $2 \times 10^{13}/cm^2$.

Figure 34:
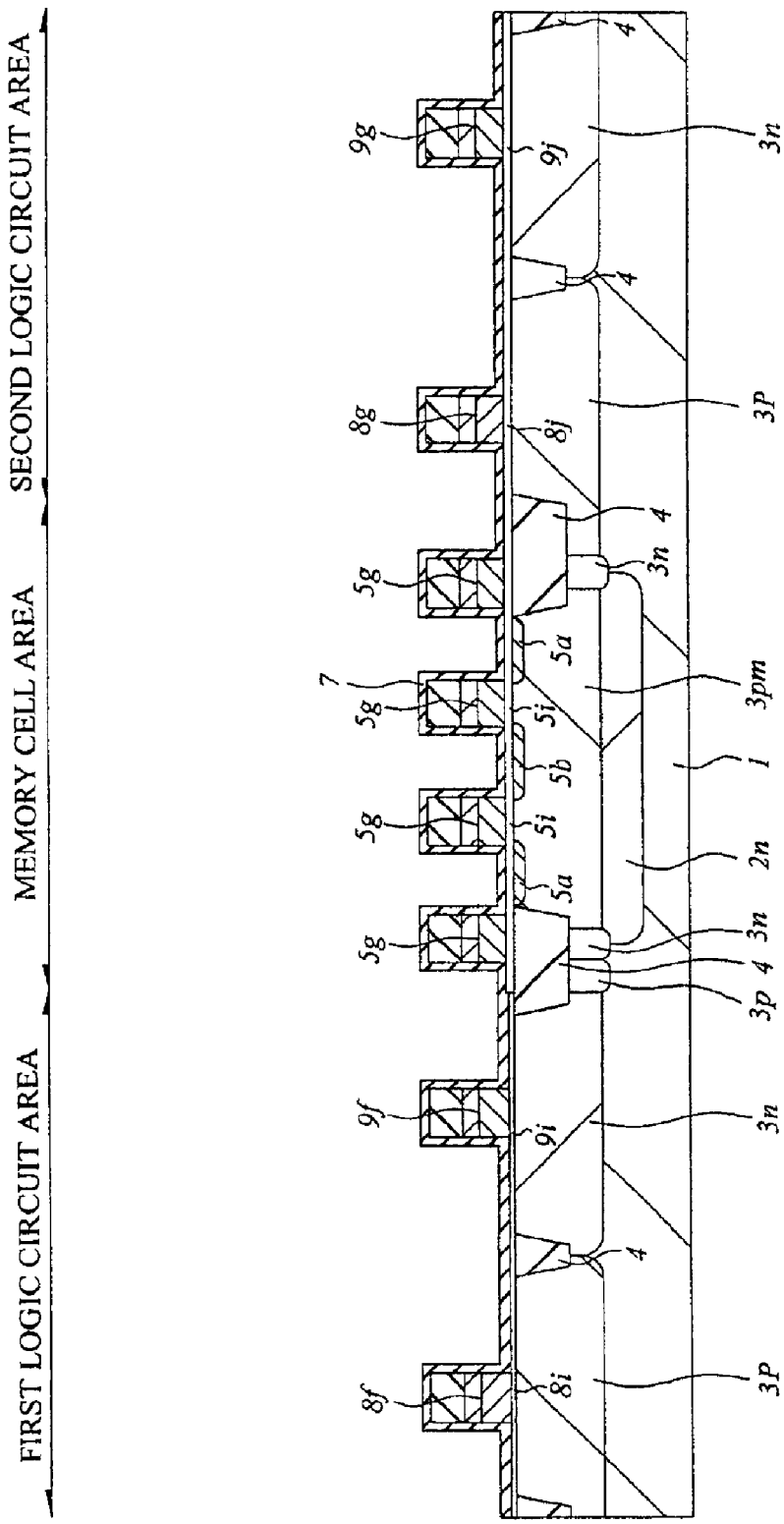
FIG. 34 is a cross-sectional view showing the principal part of the semiconductor integrated circuit device according to the second embodiment during the production process thereof.

Next, as shown in FIG. 34, a silicon oxide film 7 is deposited to a thickness of 10 to 15 nm on and over the semiconductor substrate 1 by the CVD method. In this case, although a silicon oxide film is used, any film may be used if containing less amount of material such as hydrogen or the like that promotes the boron penetration in comparison to the silicon nitride film.

Figure 35:
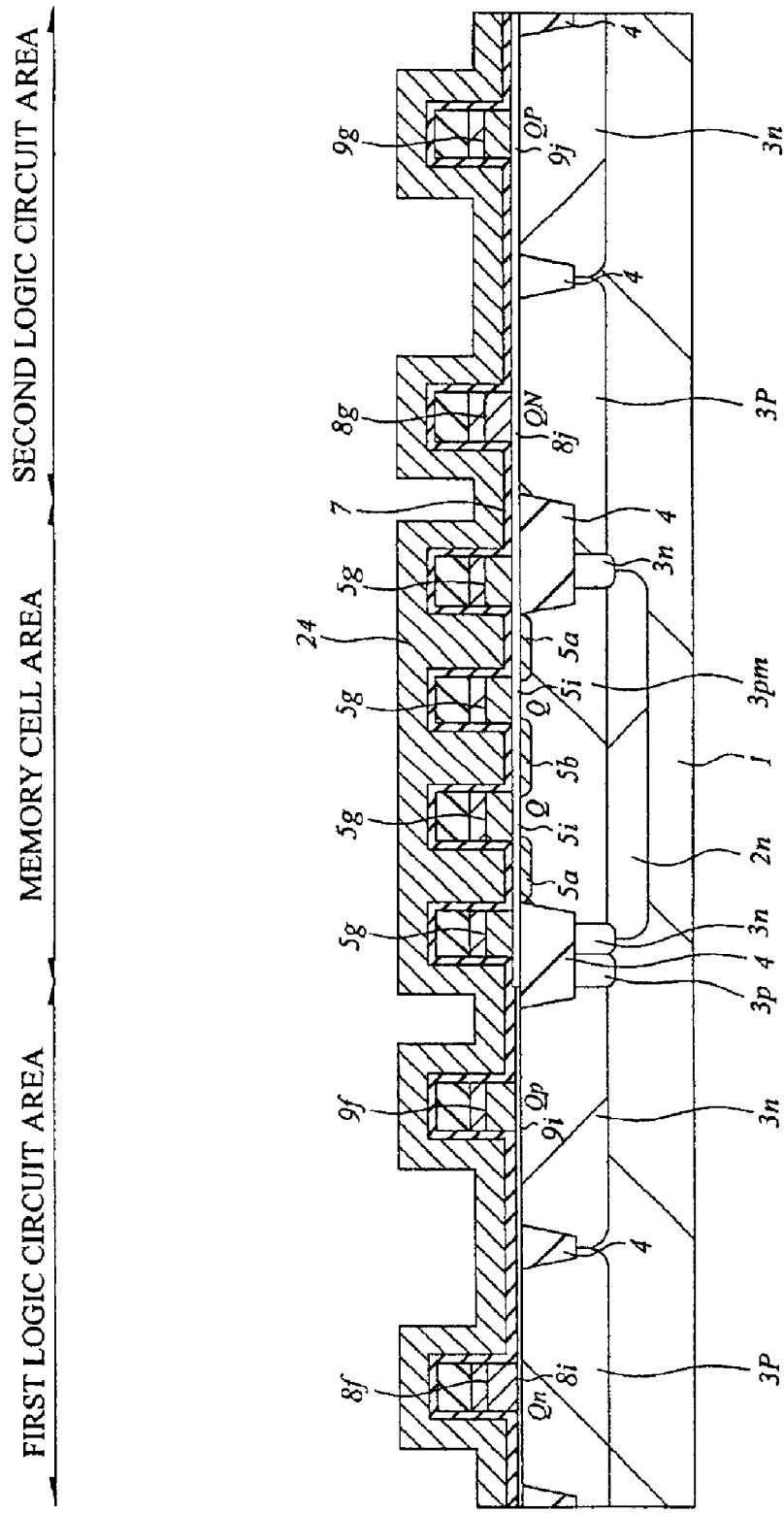
FIG. 35 is a cross-sectional view showing the principal part of the semiconductor integrated circuit device according to the second embodiment during the production process thereof.

Next, as shown in FIG. 35, a polycrystalline silicon film 24 is deposited to a thickness of about 80 nm on the silicon oxide film 7 by the CVD method. The thickness of the polycrystalline silicon film 24 is set at a thickness equal to or thicker than the thickness capable of completely burying the spaces between the gate electrodes 5g in the memory cell area, and, in this embodiment, is set at, for example, 80 nm.

Figure 36:
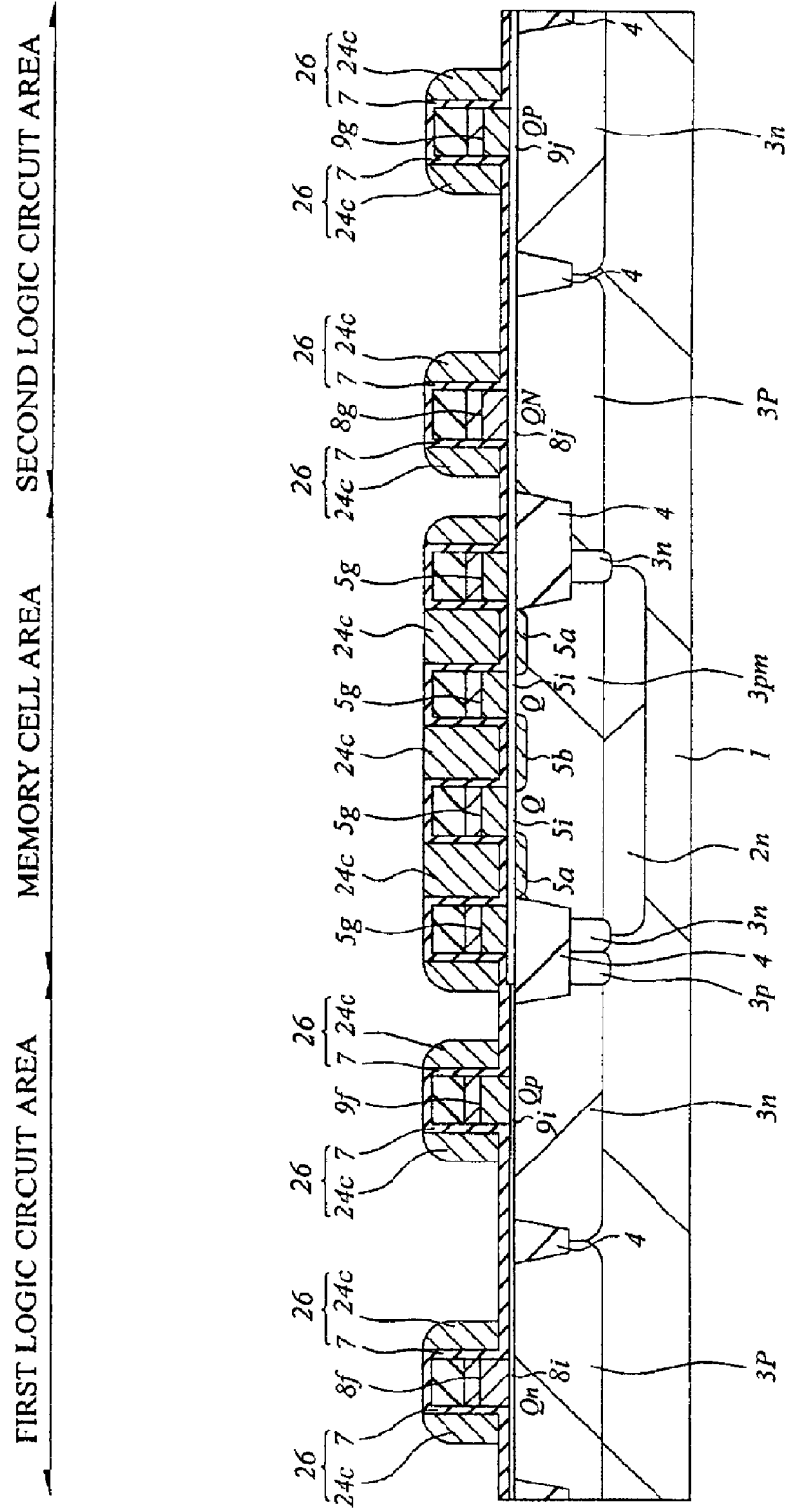
FIG. 36 is a cross-sectional view showing the principal part of the semiconductor integrated circuit device according to the second embodiment during the production process thereof.

Next, an anisotropic dry etching treatment is performed as shown in FIG. 36. Thereby, the insulating film 7 and the polycrystalline silicon film 24c are left in the memory cell area, and the sidewall film 26 composed of the silicon oxide film 7 and the polycrystalline silicon film 24c is formed on each sidewall of the gate electrodes 8f, 8g, 9f and 9g in the first and second logic circuit areas.

In order to minimize the cut-off amount of the gate insulating films 8i and 8j and the like and that of the insulating film 4 buried in the isolation area, this etching employs such etching gas that a etching rate of the polycrystalline silicon film to the silicon oxide film becomes high.

Figure 37:
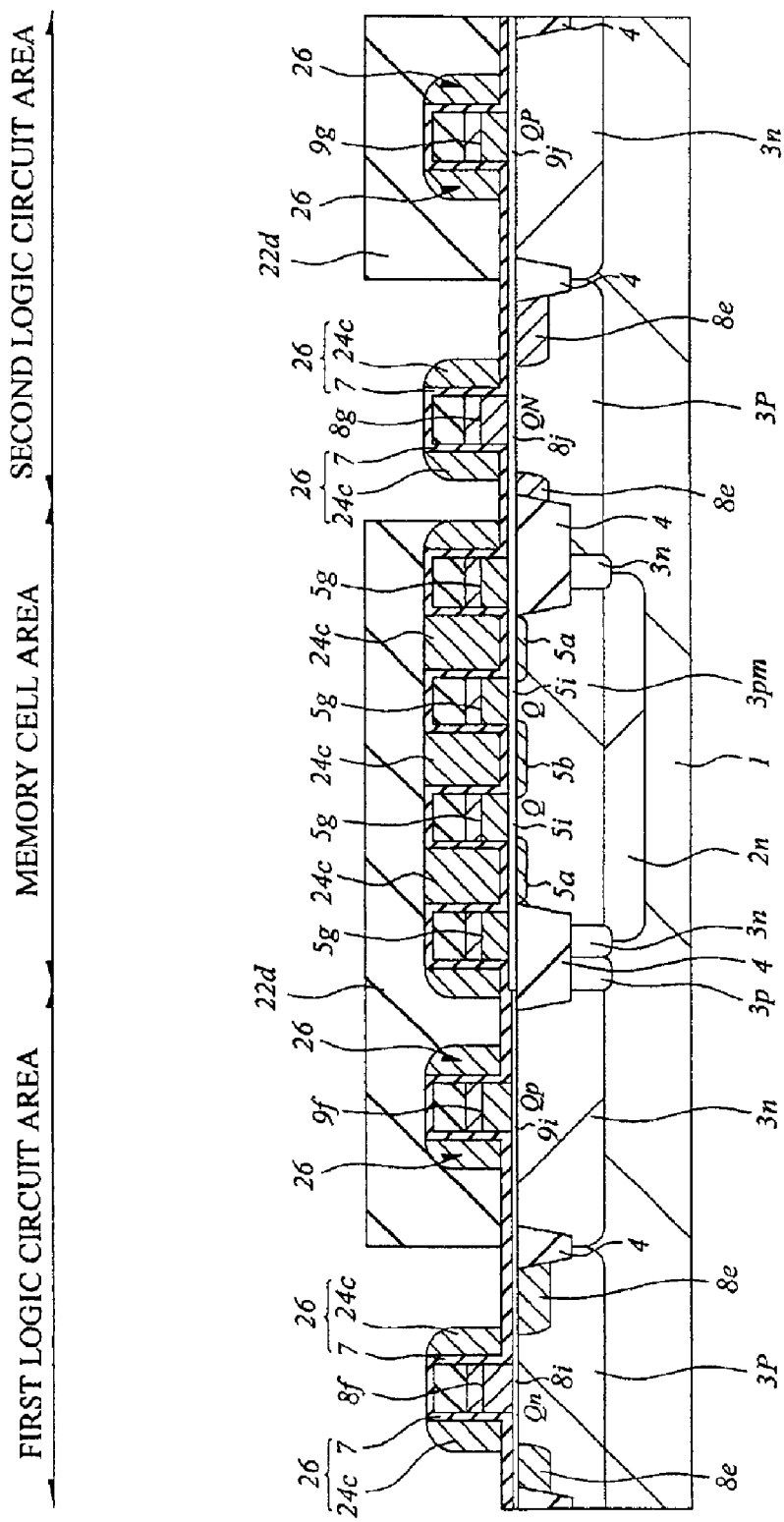
FIG. 37 is a cross-sectional view showing the principal part of the semiconductor integrated circuit device according to the second embodiment during the production process thereof.

Subsequently, a resist film 22d in which the n channel MISFET (Qn and QN) forming areas in the first and second logic circuit areas are exposed is formed over the semiconductor substrate 1. Thereafter, the resist film 22d, the gate electrodes 8f and 8g, and the laminated sidewall film 26 composed of both of the silicon oxide film 7 and the polycrystalline silicon film 24c are used as masks to introduce an n type impurity such as As by the ion implantation method or the like and thereby form high-concentration semiconductor areas 8e (FIG. 37).

Figure 38:
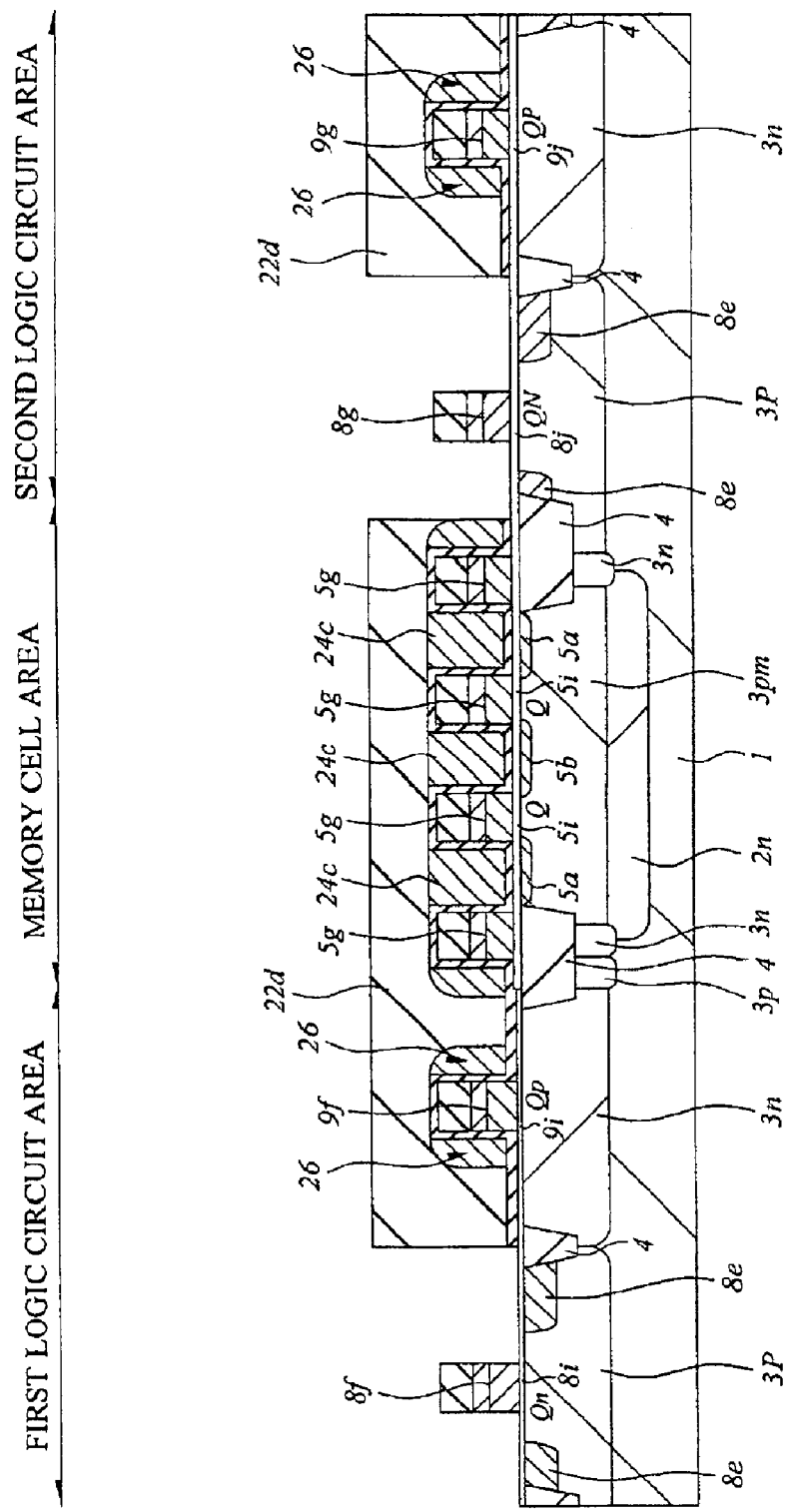
FIG. 38 is a cross-sectional view showing the principal part of the semiconductor integrated circuit device according to the second embodiment during the production process thereof.

Next, as shown in FIG. 38, an isotropic dry etching treatment is performed relative to the polycrystalline silicon film 24c of the n channel MISFET forming areas in the first and second logic circuit areas, and thereby the polycrystalline silicon film 24c is removed. Subsequently, an isotropic dry etching treatment is performed relative to the silicon oxide film 7, and thereby the silicon oxide film 7 is removed.

Figure 39:
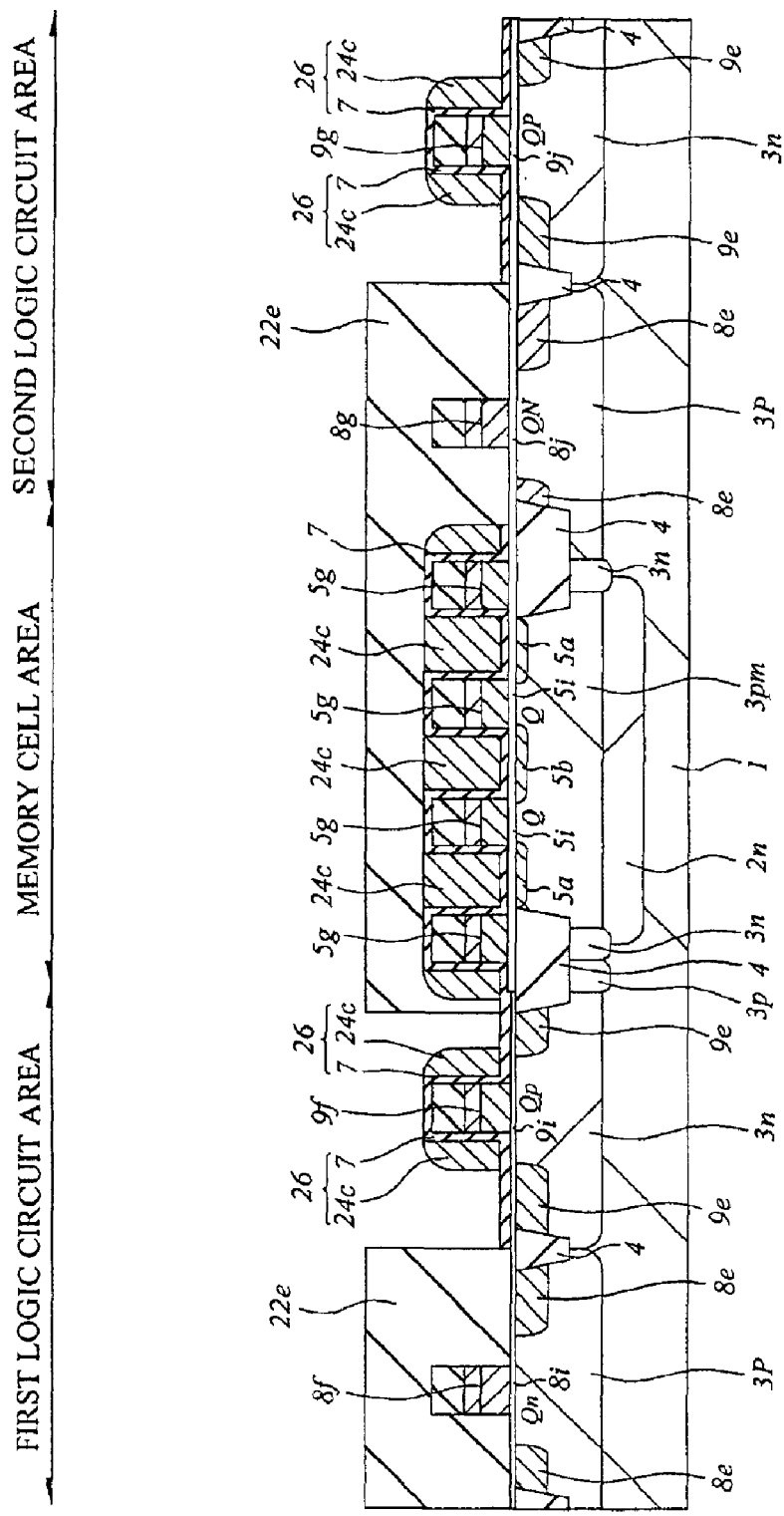
FIG. 39 is a cross-sectional view showing the principal part of the semiconductor integrated circuit device according to the second embodiment during the production process thereof.

Next, a resist film 22e in which the p channel MISFET forming areas in the first and second logic circuit areas are exposed is formed on and over the semiconductor substrate 1. Thereafter, the resist film 22e, the gate electrodes 9f and 9g, and the laminated sidewall film 26 composed of both of the silicon oxide film 7 and the polycrystalline silicon film 24c are used as masks to introduce a p type impurity such as boron or $BF_2$ by the ion implantation and thereby form high-concentration semiconductor areas 9e (FIG. 39).

Figure 40:
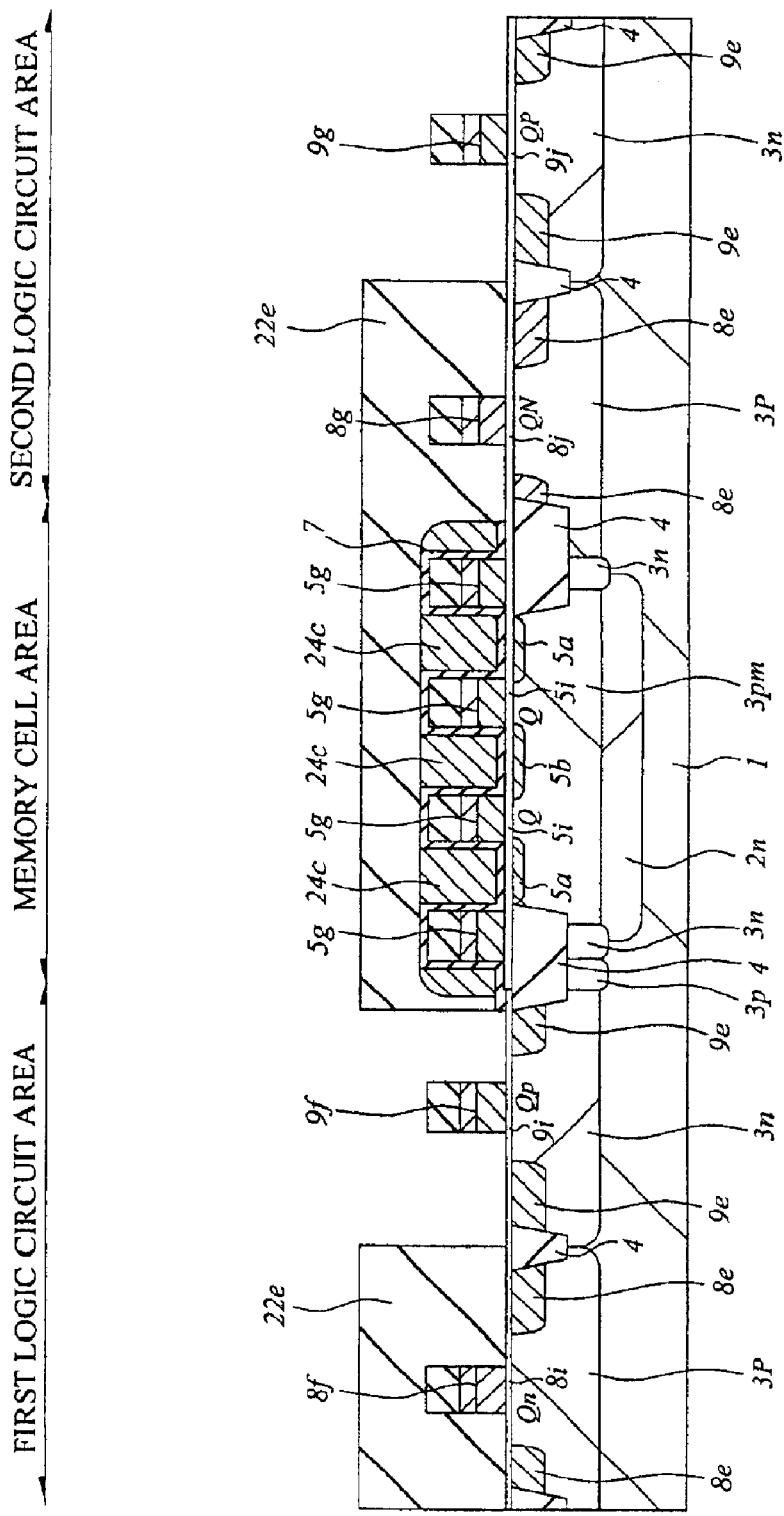
FIG. 40 is a cross-sectional view showing the principal part of the semiconductor integrated circuit device according to the second embodiment during the production process thereof.

Next, as shown in FIG. 40, an isotropic dry etching treatment is performed relative to the polycrystalline silicon film 24c of the p channel MISFET forming area in the first and second logic circuit areas, and thereby the polycrystalline silicon film 24c is removed. Subsequently, an isotropic dry etching treatment is performed relative to the silicon oxide film 7, and thereby the silicon oxide film 7 is removed.

Figure 41:
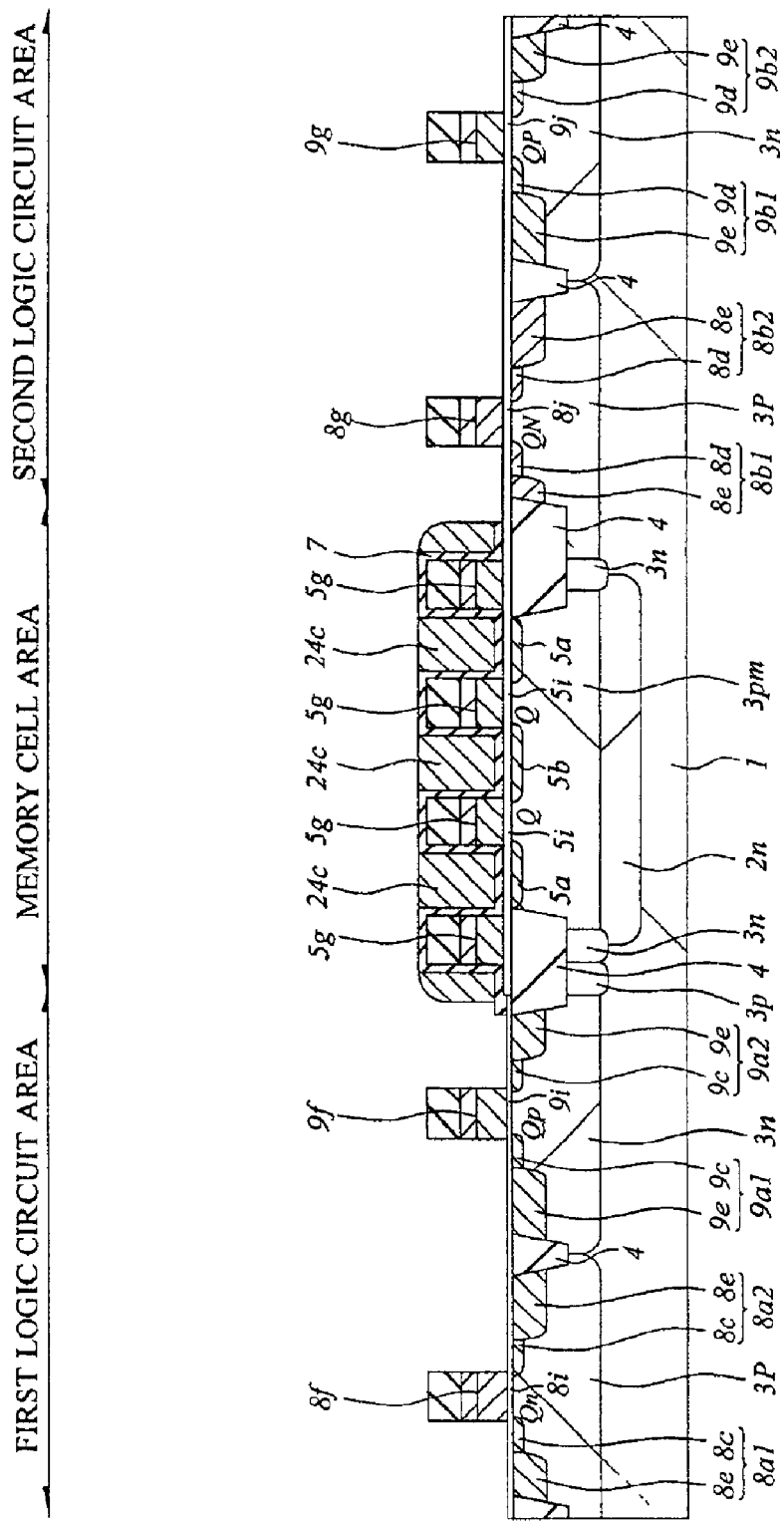
FIG. 41 is a cross-sectional view showing the principal part of the semiconductor integrated circuit device according to the second embodiment during the production process thereof.

Next, the gate electrodes and the resist film (not shown) are used as masks to implant impurities and thereby form the low-concentration semiconductor areas 8c, 8d, 9c and 9d in the first and second logic circuit areas (FIG. 41).

More specifically, arsenic is ion-implanted into the p well 3p of the first logic circuit area to an implantation amount of 1 to $2 \times 10^{14}/cm^2$, and $BF_2$ or boron is ion-implanted into the n well 3n of the first logic circuit area to an implantation amount of 1 to $2 \times 10^{14}/cm^2$. In addition, from the viewpoint of the measures for the hot-carrier effects, phosphorus capable of decreasing the electric field is ion-implanted into the p well 3p of the second logic circuit area to an implantation amount of 0.5 to $2 \times 10^{14}/cm^2$, and $BF_2$ or boron is ion-implanted into the n well 3n of the second logic circuit area to an implantation amount of 0.5 to $2 \times 10^{14}/cm^2$. Then, the semiconductor substrate is heated at 950° C. for 10 seconds to activate the implanted ions and thereby form the semiconductor areas 8c, 8d, 9c and 9d.

Figure 42:
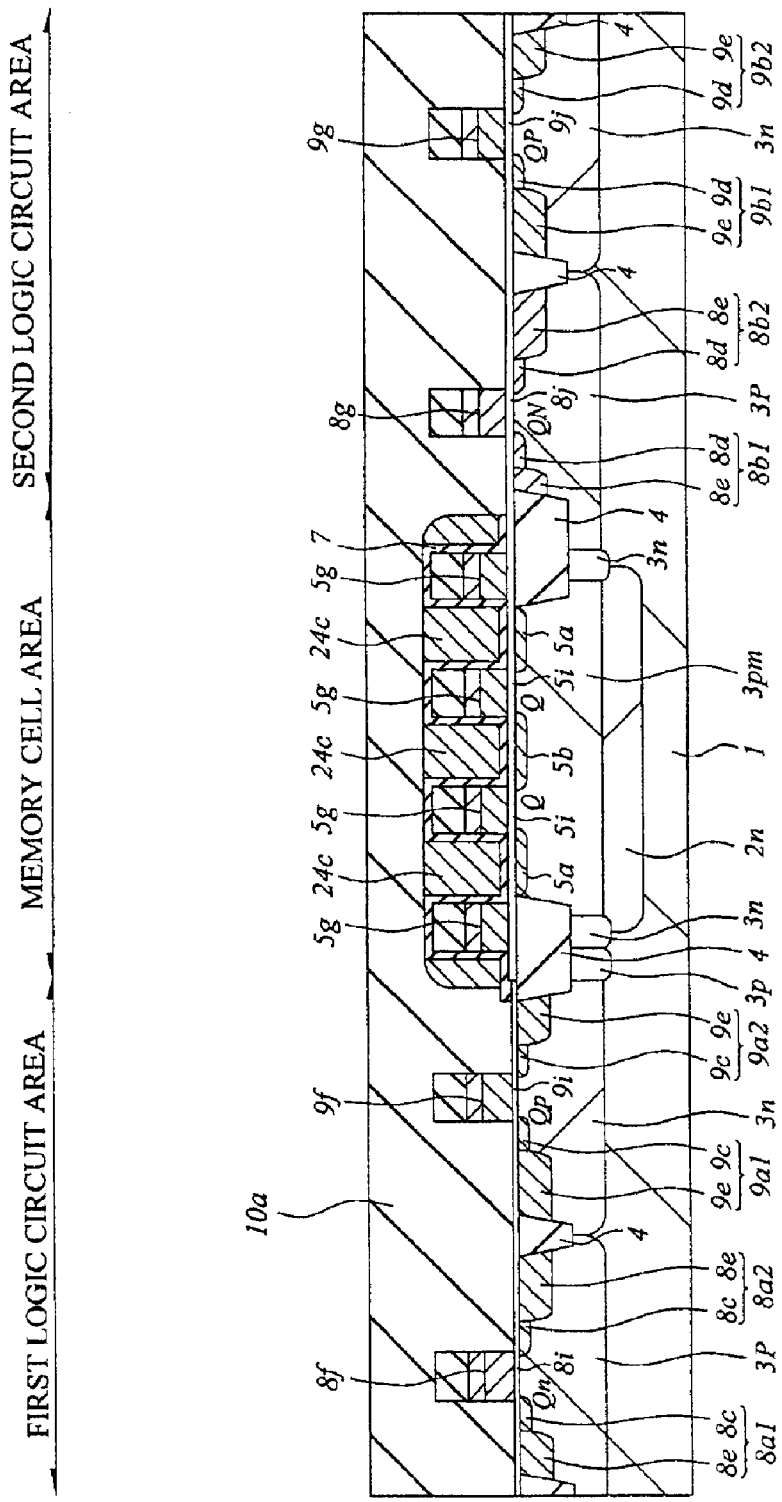
FIG. 42 is a cross-sectional view showing the principal part of the semiconductor integrated circuit device according to the second embodiment during the production process thereof.

Next, as shown in FIG. 42, a silicon oxide film 10a is deposited to a thickness of about 0.7 μm on and over the semiconductor substrate 1. The later-following production process is the same as that described with reference to FIGS. 22 to 32 in the first embodiment. Therefore, the description thereof will be omitted.

In this embodiment, the low-concentration semiconductor area in the first and second logic circuit areas is formed after the high-concentration semiconductor area in these semiconductor areas is formed. Therefore, it is possible to form the low-concentration semiconductor area with high performance. More specifically, in the case of forming the high-concentration semiconductor area after the low-concentration semiconductor area in the logic circuit area is formed, ions in the low-concentration semiconductor area are affected at the time of the ion implantation for forming the high-concentration semiconductor area, and consequently the characteristic thereof is deteriorated. In this embodiment, however, the low-concentration semiconductor area is formed after the high-concentration semiconductor area is formed. Therefore, the characteristic of the MISFET can be improved.

(Third Embodiment)

A third embodiment relates to the formation of the contact electrodes in the memory cell area. In the first embodiment, the high-concentration semiconductor area in the logic circuit area is formed after the polycrystalline silicon film 24 is formed, and further the polycrystalline silicon film 24c is removed. The removal of the polycrystalline silicon film 24c is performed to further ion-implant an n type impurity such as phosphorus into the semiconductor areas 5a and 5b and form the contact electrodes (12a and 12b) on the semiconductor areas 5a and 5b.

In contrast, in this embodiment, the n type polycrystalline silicon film is deposited on the semiconductor substrate after the source and drain (semiconductor areas) of the memory cell selecting MISFET Q are exposed.

Since the production process until the step of forming the silicon oxide film 7 in this embodiment is the same as that in the first embodiment described with reference to FIGS. 2 to 14, the descriptions thereof will be omitted.

Figure 43:
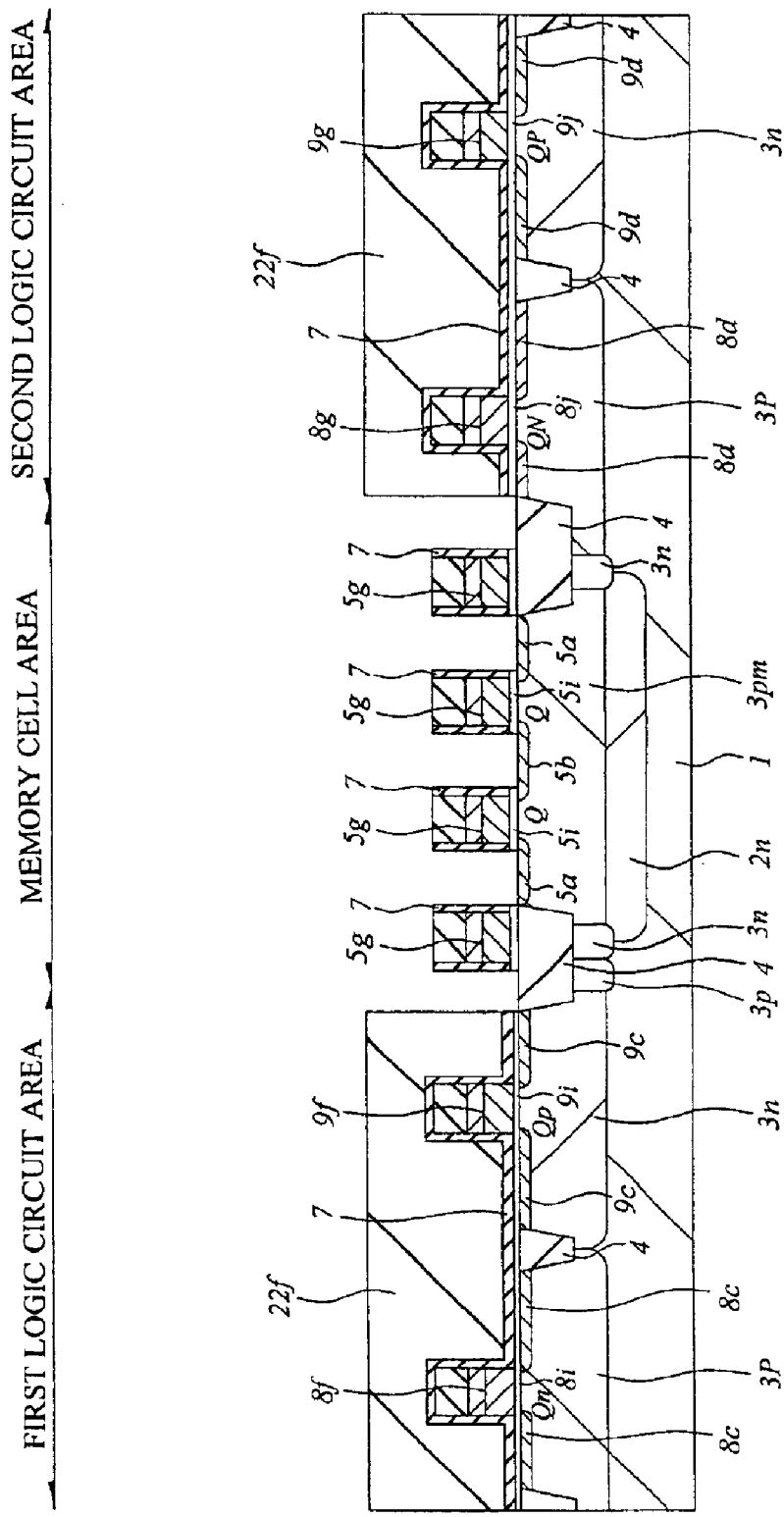
FIG. 43 is a cross-sectional view showing the principal part of a semiconductor integrated circuit device according to a third embodiment during the production process thereof.

First, the semiconductor substrate 1 described in the first embodiment and shown in FIG. 14 is prepared. Next, as shown in FIG. 43, a resist film 22f in which the memory cell forming area is exposed is formed thereon, and is used as a mask to perform an anisotropic etching treatment relative to the silicon oxide film 7. As a result, the silicon oxide film 7 on the upper surface of the cap insulating film 6 and that on the semiconductor substrate 1 are removed, and the silicon oxide film 7 is left only on the respective sidewalls of the gate electrodes 5g and the cap insulating film 6 in the memory cell area. At this time, in order to prevent the gate electrodes from being cut off, the removal of the silicon oxide film 7 is performed under the condition that the silicon oxide film 7 has a high etching selective ratio with respect to the silicon.

Next, the anisotropic dry etching treatment is performed relative to the gate insulating film 5i to remove the gate insulating film 5i and thereby expose the semiconductor areas 5a and 5b.

Next, an n type impurity such as phosphorus is ion-implanted into the semiconductor areas 5a and 5b exposed from the spaces between the gate electrodes 5g in the memory cell area (not shown). This impurity introduction process is performed with an aim to decrease the electric field.

Figure 44:
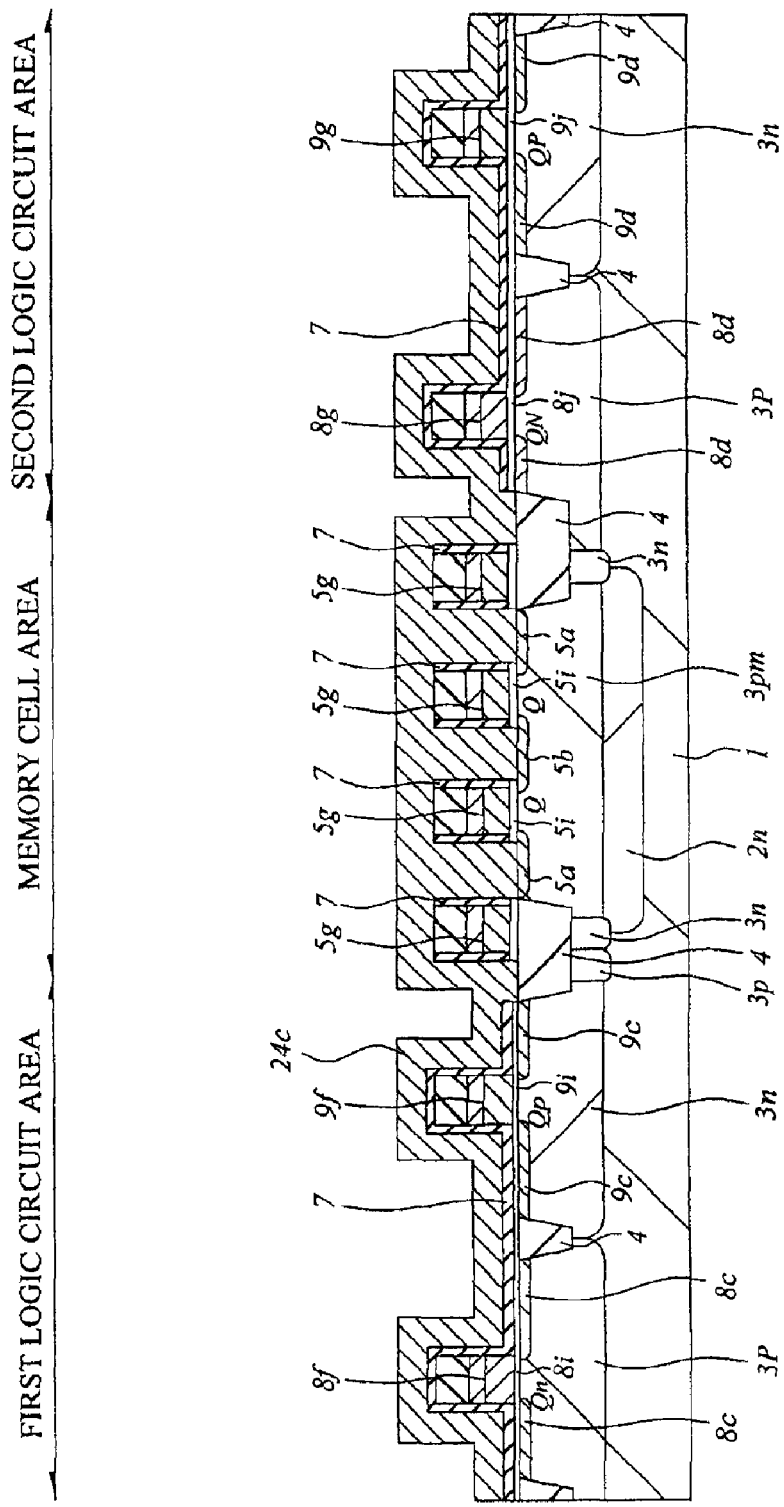
FIG. 44 is a cross-sectional view showing the principal part of the semiconductor integrated circuit device according to the third embodiment during the production process thereof.

Next, the polycrystalline silicon film 24c is deposited on the whole surface thereof by the CVD method as shown in FIG. 44. The thickness of the polycrystalline silicon film 24c is equal to or more than the thickness capable of completely burying the spaces between the gate electrodes 5g in the memory cell area, and, in this embodiment, is set at, for example, 80 nm.

Figure 45:
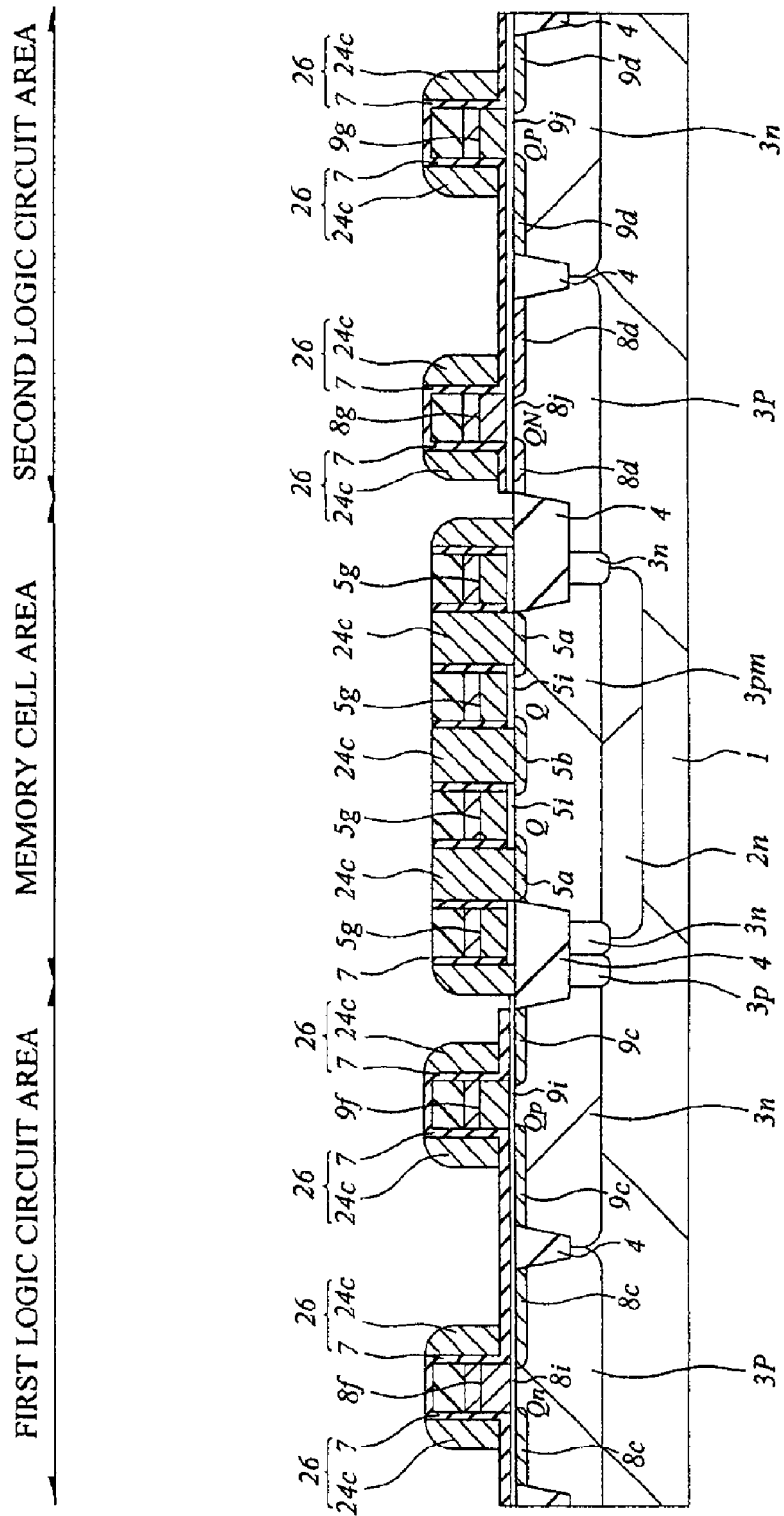
FIG. 45 is a cross-sectional view showing the principal part of the semiconductor integrated circuit device according to the third embodiment during the production process thereof.

Next, the anisotropic dry etching treatment is performed as shown in FIG. 45. Thereby, the insulating film 7 and the polycrystalline silicon film 24c are left in the memory cell area, and the sidewall film 26 composed of the silicon oxide film 7 and the polycrystalline silicon film 24c is formed on each sidewall of the gate electrodes 8f, 8g, 9f and 9g in the first and second logic circuit areas. Of the polycrystalline silicon film 24c left in the memory cell area, the polycrystalline silicon film 24c on each semiconductor area 5a functions as a connection electrode for the bit line BL, and the polycrystalline silicon film 24c on the semiconductor area 5b functions as a connection electrode for the capacitor C.

In order to minimize the cut-off amount of the gate insulating films 8i and 8j and the like and the cut-off amount of the insulating film 4 buried in the isolation area, this etching employs such etching gas that an etching rate of the polycrystalline silicon film of the silicon oxide film becomes high.

Next, similarly to the first embodiment, the high-concentration semiconductor areas 8e are formed in the n channel MISFET (Qn and QN) forming areas of the first and second logic circuit areas, and the polycrystalline silicon film 24c formed in these areas is removed. Subsequently, the high-concentration semiconductor areas 9e are formed in the p channel MISFET forming areas of the first and second logic circuit areas, and the polycrystalline silicon film 24c in these areas is removed.

Thus, according to this embodiment, the polycrystalline silicon film with high impurity concentration is deposited on the surface thereof while the semiconductor areas of the memory cell selecting MISFET are exposed, and thereby the contact electrode (polycrystalline silicon film 24c) is formed. Therefore, in the logic circuit area, the semiconductor area can be formed with using the polycrystalline silicon film 24c as a sidewall film. As described above, the sidewall films, each of which is different in thickness, can be formed in the memory cell area and the logic circuit area, respectively. Therefore, it is possible to form the MISFET having a good characteristic.

Figure 46:
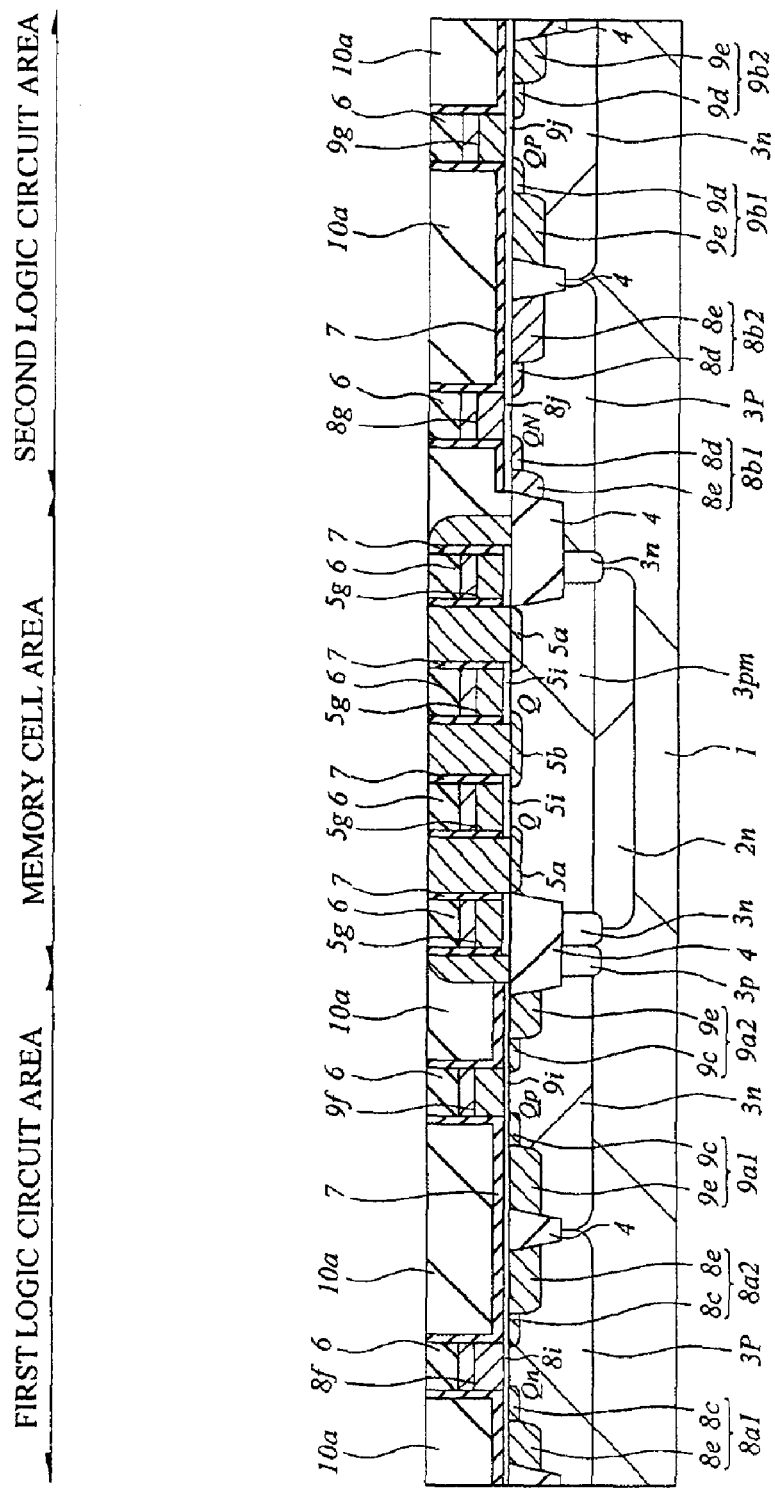
FIG. 46 is a cross-sectional view showing the principal part of the semiconductor integrated circuit device according to the third embodiment during the production process thereof.

Next, as shown in FIG. 46, the silicon oxide film 10a is deposited to a thickness of about 0.7 μm on and over the semiconductor substrate 1, and is polished until the surface of the cap insulating film 6 is exposed.

The later-following production process is the same as that the production process in the first embodiment with reference to FIGS. 26 to 32. Therefore, the descriptions thereof will be omitted.

Thus, in this embodiment, the source and drain (semiconductor areas) in the memory cell area are exposed, and thereafter the n type polycrystalline silicon film 24 is deposited, and the source and drain (semiconductor areas) in the logic circuit area are formed. Therefore, it is possible to use the polycrystalline silicon film 12 left in the memory cell area, as each of connection electrodes for the bit line BL and the capacitor C. As a result, it is possible to eliminate undesirable damages to the removal and the further burying of the polycrystalline silicon film 24c.

(Fourth Embodiment)

A fourth embodiment relates to the sidewall film formed on the sidewall of the gate electrode. In the first embodiment and the like, the sidewall film 26 is composed of the silicon oxide film 7 and the polycrystalline silicon film 24c. In the fourth embodiment, the sidewall film is formed by depositing two kinds of insulating films.

Since the production process until the step of forming the low-concentration semiconductor area in this embodiment is the same as that in the first embodiment described with reference to FIGS. 2 to 13, the descriptions thereof will be omitted.

Figure 47:
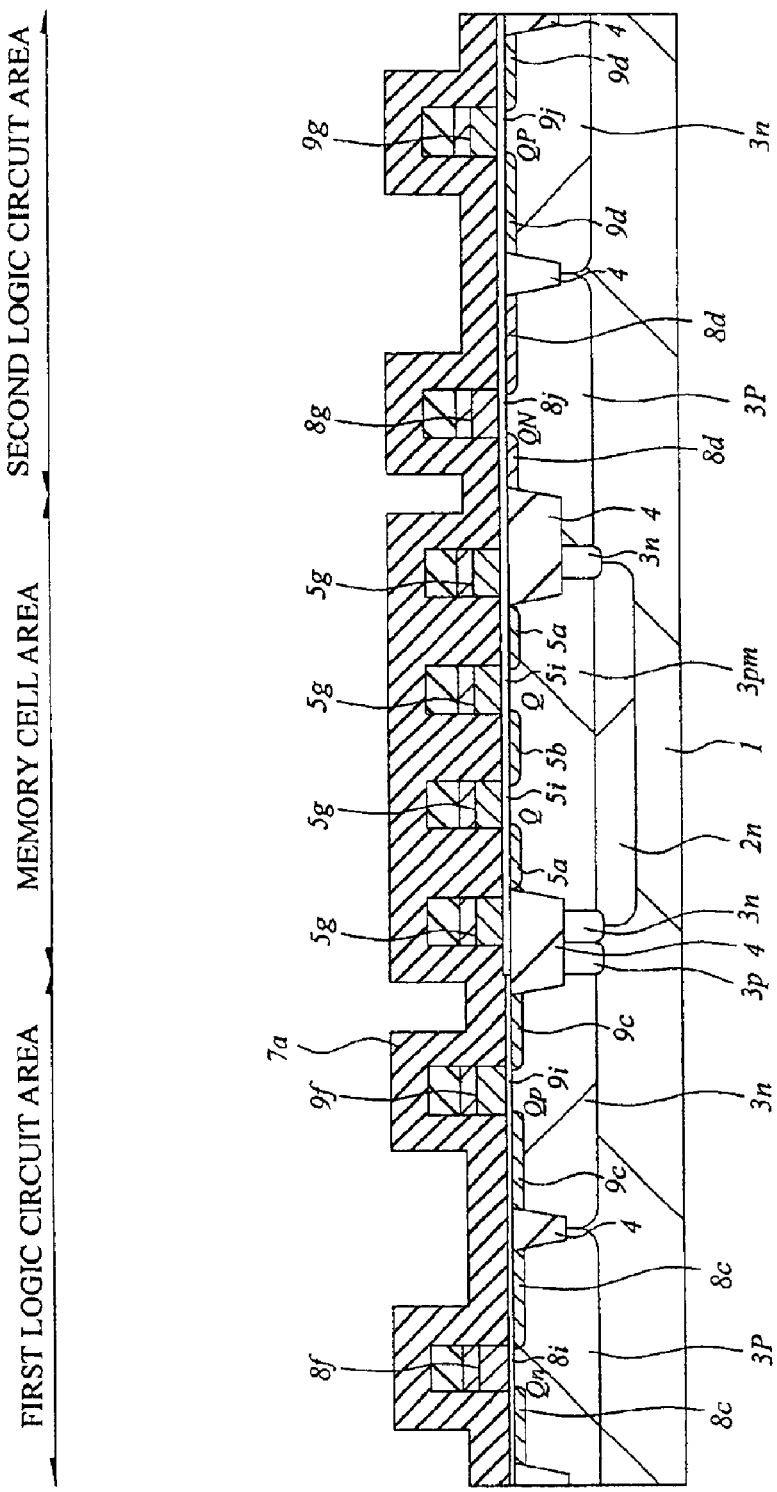
FIG. 47 is a cross-sectional view showing the principal part of a semiconductor integrated circuit device according to a fourth embodiment during the production process thereof.

First, the semiconductor substrate 1 described in the first embodiment and shown in FIG. 13 is prepared. Next, as shown in FIG. 47, the silicon oxide film 7a is deposited to a thickness of about 80 nm on the whole surface of the substrate by the CVD method.

Figure 48:
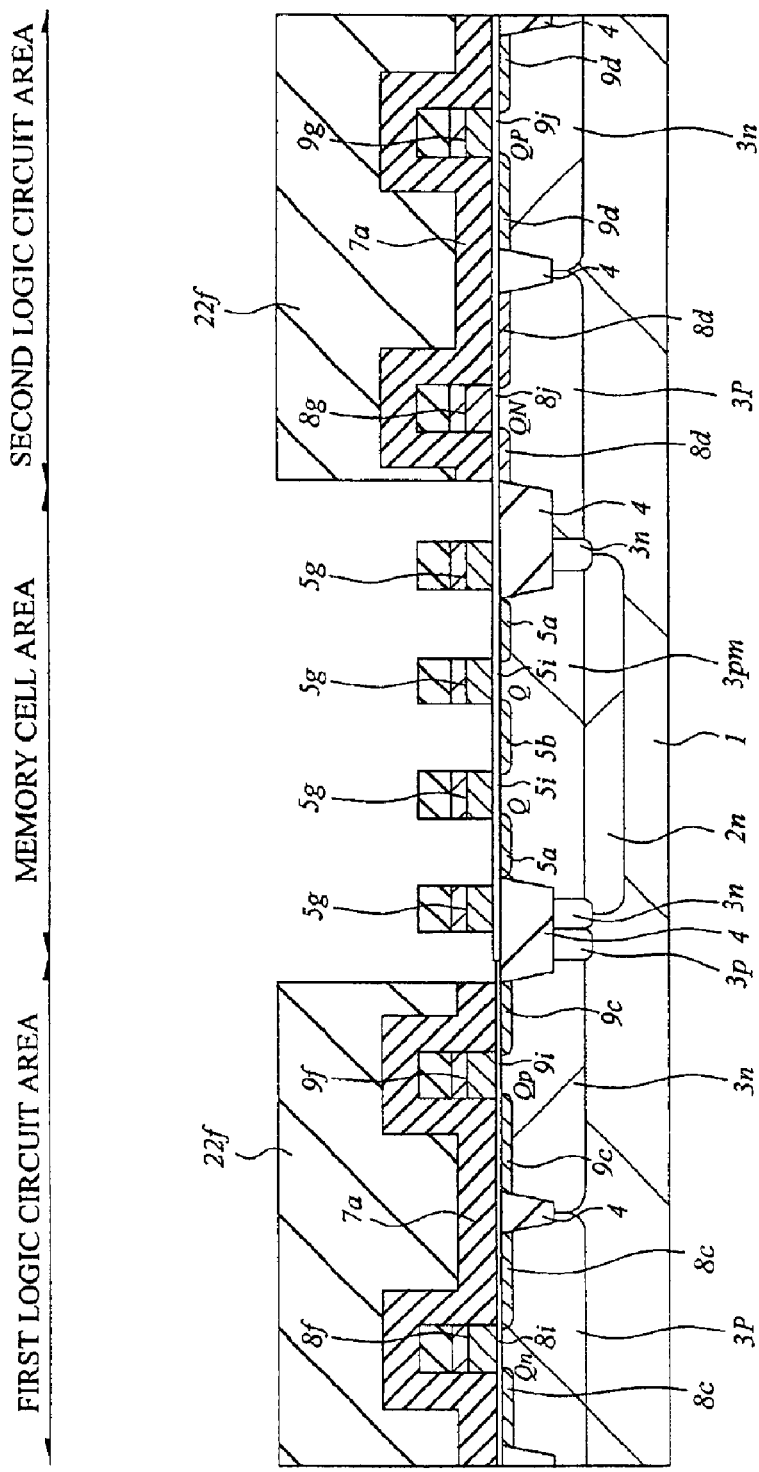
FIG. 48 is a cross-sectional view showing the principal part of the semiconductor integrated circuit device according to the fourth embodiment during the production process thereof.

Next, as shown in FIG. 48, a resist film 22f in which the memory cell area is exposed is formed, and is used as a mask to perform a dry-etching treatment relative to the silicon oxide film 7a and thereby remove the silicon oxide film 7a in the memory cell area.

Figure 49:
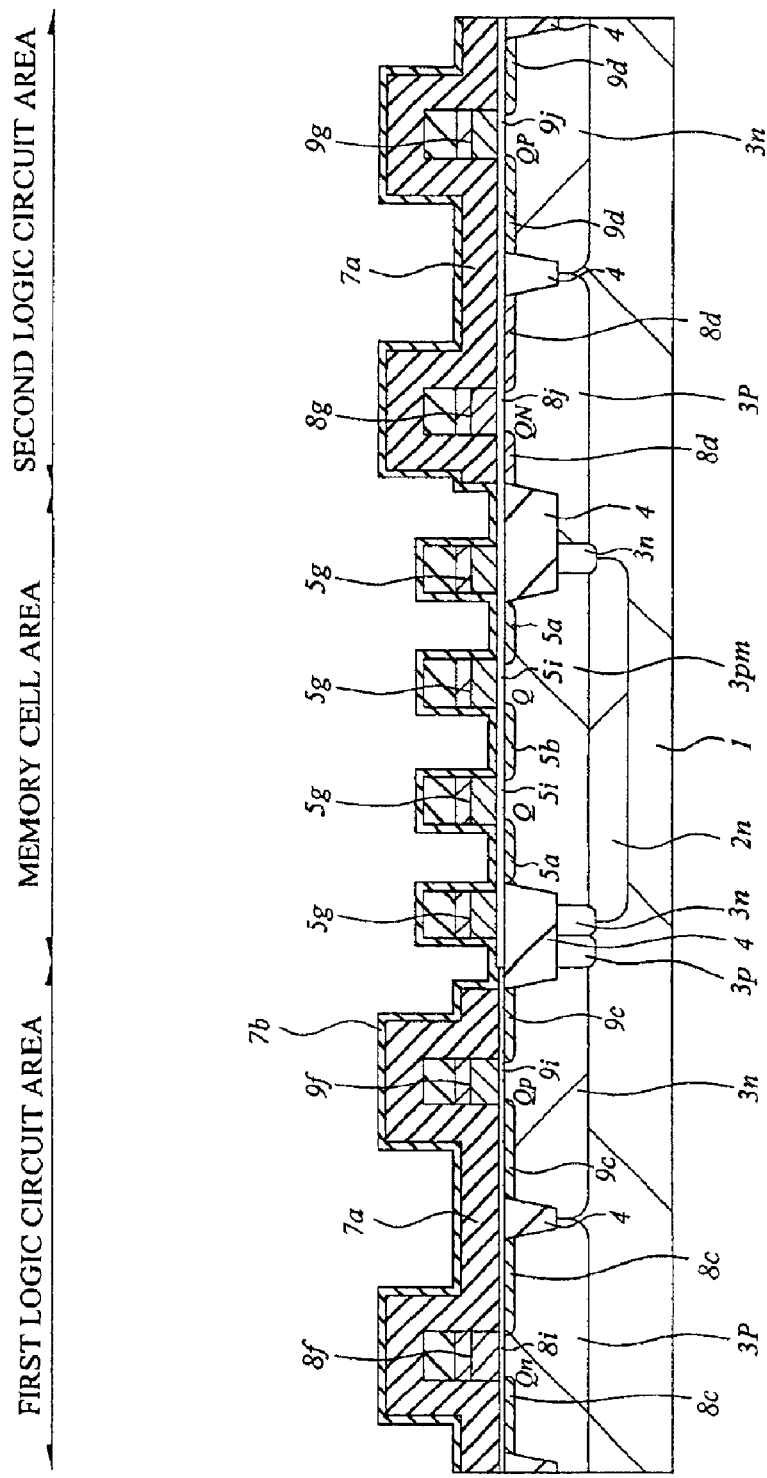
FIG. 49 is a cross-sectional view showing the principal part of the semiconductor integrated circuit device according to the fourth embodiment during the production process thereof.

Subsequently, the resist film 22f is removed. As shown in FIG. 49, the silicon oxide film 7b is deposited on the whole surface of the substrate by the CVD method. Next, an anisotropic dry etching treatment is performed. As a result, the sidewall films, each of which is different in thickness, are formed on the sidewalls of the gate electrodes 5g in the memory cell area and on the sidewalls of the gate electrodes 8f, 8g, 9f and 9g in the first and second logic circuit areas, respectively. More specifically, the sidewall film composed of the silicon oxide film 7b is left on each of the sidewalls of the gate electrodes in the memory cell area, and the sidewall films composed of the silicon oxide films 7a and 7b are left on the sidewalls of the gate electrodes in the first and second logic circuit areas, respectively.

In this case, the thickness of the first layer (7a) of the laminated sidewall film in the logic circuit area is selected so that the MISFET constituting the logic circuit can have a good characteristic. In this embodiment, the thickness thereof is set, for example, at 80 nm.

Also, the thickness of the second layer (7b) of the laminated sidewall film in the logic circuit area is selected so that the memory cell selecting MISFET can have a good characteristic. In this embodiment, the thickness thereof is set, for example, within a range of 10 to 15 nm.

Figure 50:
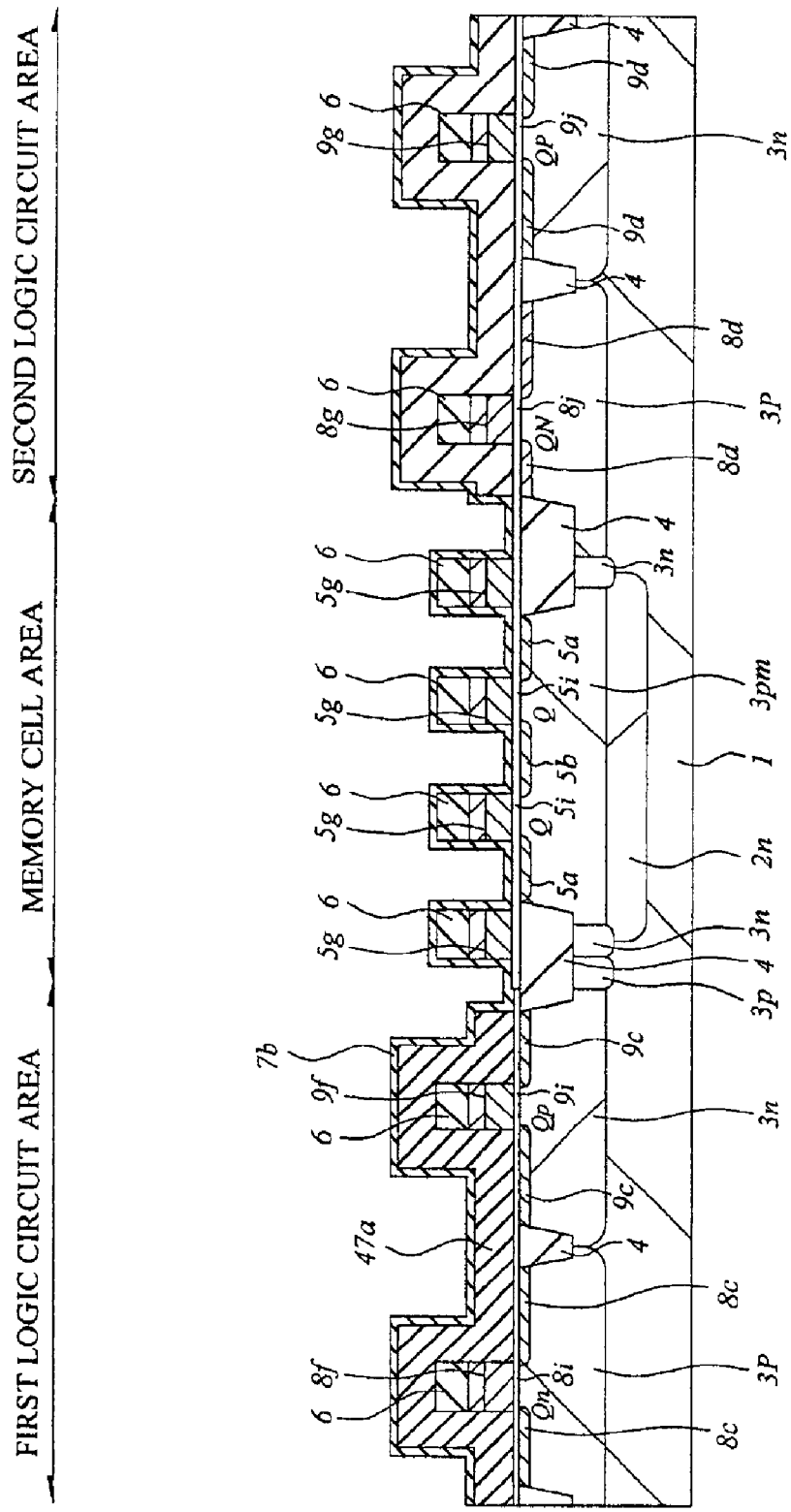
FIG. 50 is a cross-sectional view showing the principal part of the semiconductor integrated circuit device according to the fourth embodiment during the production process thereof.

In addition, it is of course possible to use different materials for the first and second layers of the laminated sidewall film in the logic circuit area. For example, as shown in FIG. 50, the silicon nitride film 47a may be used as the first layer and the silicon oxide film 7b may be used as the second layer. Also, a silicon nitride film may be used as the cap insulating film 6.

The later-following production process in this embodiment is the same as that described in the first embodiment with reference to FIGS. 17 to 32. Therefore, the descriptions thereof will be omitted. However, the step of removing the polycrystalline silicon film 24c in the first embodiment is unnecessary.

Thus, according to the embodiment, the sidewall film formed by laminating two kinds of insulating films is used as the sidewall film on each sidewall of the gate electrodes in the logic circuit areas, and so can be formed more thickly than the sidewall film on each sidewall of the gate electrodes in the memory cell area. Thus, it is possible to form the source and drain of the LDD structure with high accuracy. As a result, it is possible to achieve the downsizing of the MISFET constituting each logic circuit and the improvement of the reliability thereof. Further, if the two kinds of insulating films are used as the silicon oxide film, the boron penetration can be prevented.

Also, if the silicon nitride film is used as the first layer and the silicon oxide film is used as the second layer, it is possible to form the contact electrode in the logic circuit area in a self-alignment manner.

Also, it is possible to form the contact electrodes connected to the bit line BL and the capacitor C in a self-alignment manner, by using the cap insulating film and the sidewall film.

In the foregoing, the inventions made by the inventors thereof have been described based on the embodiments. However, it goes without saying that the present invention is not limited to the foregoing embodiments and can be variously changed and modified without departing from the gist or scope thereof.

The advantages achieved by the typical ones of the inventions disclosed in this application will be briefly described as follows.

(1) According to the present invention, since the p type gate electrode is used in the memory cell selecting n channel MISFET, it is possible to increase the threshold voltage of the n channel memory cell selecting MISFET without increasing the impurity concentration of the semiconductor substrate.

(2) According to item (1) mentioned above, it is possible to omit the step of ion-implanting the impurities into the channel area of the n channel memory cell selecting MISFET constituting the memory cell.

(3) According to the present invention, since a film such as the silicon oxide film containing no hydrogen or little hydrogen is used as the insulating film on the gate electrode and as the first film of the sidewall on the gate electrode, the boron penetration from the gate electrode is prevented. Particularly, it is possible to improve the characteristic of the p channel MISFET formed in the peripheral circuit forming area.

(4) According to the present invention, the first and second films are left on the sidewalls of the gate electrodes of the n channel MISFET and the p channel MISFET formed in the peripheral circuit forming areas, and the first and second films are used as masks to implant the impurities into both sides of each gate electrode of the n channel MISFET and the p channel MISFET described above and thereby form the semiconductor areas. Therefore, the sidewall film on the sidewall of the gate electrode in the peripheral circuit forming area can be formed more thickly than the sidewall film on the sidewall of the gate electrode in the memory cell area, and each characteristic of the n channel MISFET and the p channel MISFET that constitute the logic circuit can be improved.

(5) According to the present invention, metal is used in the lower electrode and the upper electrode of the capacitor constituting the memory cell (so-called MIM structure). Therefore, the annealing temperature at the time of forming the capacitor can be set at 600° C. or lower, and the boron penetration can be prevented.

(6) According to the present invention, since the open bit line arrangement is employed in the memory cell, it is possible to make the memory cell highly integrated.

What is claimed is:

1. A semiconductor integrated circuit device comprising:
a memory cell composed of a memory cell selecting n channel MISFET and a capacitor which are formed in a memory cell forming area of a semiconductor substrate; and an n channel MISFET and a p channel MISFET which are formed in peripheral circuit forming areas, wherein each of said n channel MISFET and said p channel MISFET in said peripheral circuit forming are includes: a source and drain formed in said semiconductor substrate; a gate electrode formed between said source and drain on the semiconductor substrate via a gate insulating film; and a silicon oxide cap insulating film formed on said gate electrode and a silicon oxide side wall insulating film formed on a side wall of said gate electrode, said memory cell selecting n channel MISFET includes:

a source and drain formed in said semiconductor substrate;

a gate electrode formed between said source and drain on the semiconductor substrate via a gate insulating film;

a silicon oxide insulating film formed on said gate electrode;

a silicon oxide side wall film formed on a sidewall of the gate electrode of said memory cell selecting n channel MISFET, wherein, a thickness of said side wall film is substantially the same at an upper portion and a lower portion along said sidewall of the gate electrode, a p type impurity is contained in the gate electrode of said memory cell selecting n channel MISFET and in the gate electrode of said p channel MISFET, and an n type impurity is contained in the gate electrode of said n channel MISFET; and a contact plug electrode through which said source or said drain of said memory cell selecting n channel MISFET is connected to the capacitor or a bit line, said contact plug electrode being formed between said side wall films of adjacent gate electrodes of the memory cell selecting n channel MISFETs wherein a height of said contact plug electrode is substantially the same as a height of said cap insulating film on said gate electrode and a width of said contact plug electrode is substantially the same at an upper portion and a lower portion along the sidewall film of the gate electrode;

wherein said side wall film formed on each gate electrode of said n channel MISFET and said p channel MISFET that are formed in said peripheral circuit forming area is thicker than said side wall film formed on the gate electrode of said memory cell selecting n channel MISFET.

2. The semiconductor integrated circuit device according to claim 1, wherein said contact plug electrode is formed on said source or said drain.

3. The semiconductor integrated circuit device according to claim 2, wherein said contact plug electrode is made from silicon.

4. The semiconductor integrated circuit device according to claim 1, wherein the film formed on the sidewall of the gate electrode of said memory cell selecting n channel MISFET is a film containing one of no hydrogen and little hydrogen.

5. The semiconductor integrated circuit device according to claim 1,
wherein said capacitor includes a lower electrode and an upper electrode which are made of metal, and a capacitor insulating film.

6. The semiconductor integrated circuit device according to claim 5,
wherein the metal composing one of said lower electrode and said upper electrode is Ru.

7. The semiconductor integrated circuit device according to claim 1,
wherein the arrangement of said memory cell is an open bit line arrangement.

8. A semiconductor integrated circuit device according to claim 1, wherein said plug electrode contacts said side wall films of said adjacent gate electrodes.

9. A semiconductor integrated circuit according to claim 1, wherein said side wall film of each gate electrode of said n channel MISFET and said p channel MISFET that are formed in said peripheral circuit forming area is a composite side wall film having at least two layers.

* * * * *